US012610770B2

(12) United States Patent
Ishii et al.

(10) Patent No.: US 12,610,770 B2
(45) Date of Patent: Apr. 21, 2026

(54) SUBSTRATE PROCESSING SYSTEM AND SUBSTRATE PROCESSING METHOD

(71) Applicant: SCREEN Holdings Co., Ltd., Kyoto (JP)

(72) Inventors: Hiroaki Ishii, Kyoto (JP); Ryo Muramoto, Kyoto (JP); Junichi Ishii, Kyoto (JP); Takayuki Nishida, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 934 days.

(21) Appl. No.: 17/509,124

(22) Filed: Oct. 25, 2021

(65) Prior Publication Data

US 2022/0139699 A1 May 5, 2022

(30) Foreign Application Priority Data

Oct. 30, 2020 (JP) ................................. 2020-183198

(51) Int. Cl.
*H01L 21/02* (2006.01)
*B08B 1/12* (2024.01)
(Continued)

(52) U.S. Cl.
CPC .......... *H01L 21/02079* (2013.01); *B08B 1/12* (2024.01); *B08B 3/08* (2013.01);
(Continued)

(58) Field of Classification Search
CPC ......... H01L 21/02079; H01L 21/02087; H01L 21/02096; H01L 21/0273; H01L 21/67046;
(Continued)

(56) References Cited

U.S. PATENT DOCUMENTS 5,976,256 A * 11/1999 Kawano ................ B05C 5/0254 118/684
2005/0183754 A1 8/2005 Kago et al. ................. 134/56 R
(Continued)

FOREIGN PATENT DOCUMENTS

JP H03-272140 A 12/1991
JP H09-199462 A 7/1997
(Continued)

*Primary Examiner* — James M Mellott
(74) *Attorney, Agent, or Firm* — OSTROLENK FABER LLP

(57) ABSTRACT

A substrate processing system includes a protective film forming liquid supplying unit which supplies a protective film forming liquid to one surface of a substrate, a protective film forming unit which solidifies or hardens the protective film forming liquid and forms a protective film on the one surface of the substrate, a suction unit which suctions the one surface of the substrate, a processing unit which executes predetermined processing with respect to the other surface of the substrate in a state that the one surface of the substrate is suctioned by the suction unit, and a removing liquid supplying unit which has a removing liquid discharge port that discharges a removing liquid being capable of removing the protective film and supplies the removing liquid toward the one surface of the substrate from the removing liquid discharge port.

7 Claims, 20 Drawing Sheets

(51) Int. Cl.

| | |
|---|---|
| ***B08B 3/08*** | (2006.01) |
| ***G03F 7/16*** | (2006.01) |
| ***H01L 21/027*** | (2006.01) |
| ***H01L 21/67*** | (2006.01) |
| ***H01L 21/687*** | (2006.01) |

(52) U.S. Cl.
CPC ........ *G03F 7/162* (2013.01); *H01L 21/02087* (2013.01); *H01L 21/02096* (2013.01); *H01L 21/0273* (2013.01); *H01L 21/67046* (2013.01); *H01L 21/67051* (2013.01); *H01L 21/68764* (2013.01)

(58) Field of Classification Search
CPC ......... H01L 21/67051; H01L 21/68764; B08B 1/12; B08B 3/08; G03F 7/162
See application file for complete search history.

(56) References Cited

U.S. PATENT DOCUMENTS

| | | | | |
|---|---|---|---|---|
| 2007/0093067 | A1* | 4/2007 | Chang ................. | H01L 21/6708 438/704 |
| 2007/0224818 | A1* | 9/2007 | Nishimura ............ | H01L 21/308 438/689 |
| 2008/0081110 | A1* | 4/2008 | Winter ................ | H01L 21/6708 118/52 |
| 2009/0000543 | A1 | 1/2009 | Fukutomi et al. .............. | 118/58 |
| 2011/0240597 | A1 | 10/2011 | Tsutsumi et al. ............... | 216/41 |
| 2015/0131088 | A1 | 5/2015 | Shinohara et al. | |
| 2016/0064243 | A1 | 3/2016 | Gawase et al. | |
| 2016/0096205 | A1 | 4/2016 | Kato | |
| 2018/0284616 | A1 | 10/2018 | Kawakami et al. | |
| 2019/0067077 | A1 | 2/2019 | Muramotio | |
| 2020/0194281 | A1 | 6/2020 | Yoshida et al. | |
| 2022/0089562 | A1* | 3/2022 | Nakao ................... | G03F 7/0382 |

FOREIGN PATENT DOCUMENTS

| | | | |
|---|---|---|---|
| JP | 2002-141311 | A | 5/2002 |
| JP | 2005-228961 | A | 8/2005 |
| JP | 2007-258380 | A | 10/2007 |
| JP | 2008-177471 | A | 7/2008 |
| JP | 2009-010291 | A | 1/2009 |
| JP | 2012-074545 | A | 4/2012 |
| JP | 2013-069886 | A | 4/2013 |
| JP | 2014-003080 | A | 1/2014 |
| JP | 2015-002261 | A | 1/2015 |
| JP | 2015-002328 | A | 1/2015 |
| JP | 2019-46846 | A | 3/2019 |
| JP | 2019-212889 | A | 12/2019 |
| JP | 2020-096141 | A | 6/2020 |
| KR | 10-2018-0111648 | A | 10/2018 |

* cited by examiner

SUBSTRATE PROCESSING SYSTEM AND SUBSTRATE PROCESSING METHOD

CROSS REFERENCE TO RELATED APPLICATIONS

The present application corresponds to Japanese Patent Application No. 2020-183198 filed with the Japan Patent Office on Oct. 30, 2020, the entire disclose of which is incorporated herein by reference.

BACKGROUND OF THE INVENTION

1. Field of the Invention

The present invention relates to a substrate processing system which processes a substrate and a substrate processing method which processes a substrate. Examples of substrates to be processed include semiconductor wafers, substrates for FPDs (Flat Panel Display) such as liquid crystal display devices and organic EL (Electroluminescence) display devices, etc., substrates for optical disks, substrates for magnetic disks, substrates for magneto-optical disks, substrates for photomasks, ceramic substrates, substrates for solar cells, etc.

2. Description of the Related Art

When one surface of a substrate is suctioned and held (vacuum-suctioned), contact marks may be generated on the one surface. Recently, in order to realize microfabrication of semiconductor devices, EUV (extreme ultraviolet) lithography for conducting a pattern transfer using extreme ultraviolet (EUV) exposure machine, etc., has been proposed. In microfabrication of semiconductor devices, in view of stage contamination of the EUV exposure machine and defocusing, such a problem is now found that a rear surface (surface in contact with a stage) of a substrate is contaminated. Therefore, removing contact marks resulting from the substrate that has been suctioned and held is demanded.

Thus, Japanese Patent Application Publication No. 2002-141311 and Japanese Patent Application Publication No. 2012-74545 have disclosed that a protective film is formed on a principal surface of a substrate, thereby executing predetermined processing with respect to the substrate, while one surface of the substrate on which the protective film has been formed is suctioned and held.

Japanese Patent Application Publication No. 2002-141311 has disclosed that one surface of a substrate on which a protective film has been formed is held on a holding board by vacuum suction, the other surface of the substrate is pressed to an abrasive cloth adhered on a rotating surface block, thereby processing the other surface of the substrate.

On the other hand, Japanese Patent Application Publication No. 2012-74545 has disclosed that a protective film is formed on one surface (print wiring surface) of a substrate and while the one surface is held by a suction chuck, an edge portion of the substrate is processed so as to give a predetermined inclined angle by pressing a polishing tape thereto.

SUMMARY OF THE INVENTION

The protective film disclosed in Japanese Patent Application Publication No. 2002-141311 is configured of a first protective film which is an adhesive agent such as a wax, etc., for absorbing irregularities of a substrate and an etching-resistant second protective film which covers the first protective film. The protective film of Japanese Patent Application Publication No. 2012-74545 is such that an adhesive agent is coated on the film. Therefore, a cleaning step for removing the protective film and the protective film from the substrate becomes large-scale.

Specifically, Japanese Patent Application Publication No. 2002-141311 has disclosed that a substrate is immersed into a cleaning tank of ammonia water and hydrogen peroxide solution, a cleaning tank of IPA and a cleaning tank of a rinse liquid in that order, thereby removing a protective film.

Thus, an object of the present invention is to provide a substrate processing system capable of satisfactorily protecting one surface of a substrate with a protective film and thereafter satisfactorily removing the protective film and also provide a substrate processing method.

One preferred embodiment of the present invention provides a substrate processing system including a protective film forming liquid supplying unit which supplies a protective film forming liquid to one surface of a substrate, a protective film forming unit which solidifies or hardens the protective film forming liquid to form a protective film on the one surface of the substrate, a suction unit which suctions the one surface of the substrate, a processing unit which executes predetermined processing with respect to the other surface of the substrate in a state that the one surface of the substrate is suctioned by the suction unit, and a removing liquid supplying unit which has a removing liquid discharge port for discharging a removing liquid being capable of the protective film and supplies the removing liquid toward the one surface of the substrate from the removing liquid discharge port.

In the substrate processing system, in a state that the one surface on which the protective film has been formed is suctioned by the suction unit, predetermined processing can be executed with respect to the other surface. Therefore, it is possible to prevent contamination of the one surface of the substrate by the suction unit.

The predetermined processing includes peripheral edge processing, scrub cleaning processing and coating processing. The peripheral edge processing is such processing that a cleaning liquid is supplied to a peripheral edge portion of the other surface of the substrate to clean the peripheral edge portion of the other surface of the substrate. The scrub cleaning processing is such processing that a cleaning member is pressed to the other surface of the substrate to clean the other surface of the substrate. The coating processing is such processing that a resist film is coated on the other surface of the substrate.

The substrate processing system may be configured such that plural types of processing can be executed among the peripheral edge processing, the scrub cleaning processing and the coating processing. After execution of the coating processing, a resist film may be exposed by an exposure unit.

After execution of the predetermined processing, the removing liquid is discharged toward the one surface of the substrate from the removing liquid discharge port, by which the protective film can be removed from the one surface of the substrate. Therefore, it is not necessary to use plural types of liquids for removing the protective film, and it is not necessary to immerse the substrate into a cleaning tank. That is, the protective film can be removed from the one surface of the substrate by a simple procedure of discharging the removing liquid from the removing liquid discharge port.

As a result, the one surface of the substrate is satisfactorily protected by the protective film and after execution of the predetermined processing in this state, the protective film can be satisfactorily removed from the substrate.

In one preferred embodiment of the present invention, the substrate processing system further includes a holding unit which holds a substrate horizontally and a turning unit which turns the substrate such that either of one surface or the other surface of the substrate faces upward.

The protective film forming liquid supplying unit is configured such that the protective film forming liquid can be supplied to the one surface of the substrate held by the holding unit from one side in an up/down direction. The suction unit is configured such that the one surface of the substrate can be suctioned from the other side in the up/down direction. Then, the processing unit is configured such that the predetermined processing can be executed from the one side in the up/down direction with respect to the other surface of the substrate in a state of being suctioned by the suction unit.

According to the substrate processing system, after supply of the protective film forming liquid to the one surface of the substrate from one side in the up/down direction, the one surface of the substrate can be turned to the other side in the up/down direction by turning around the substrate using the turning unit. Thereby, the suction unit can be suctioned to the one surface of the substrate from the other side in the up/down direction. Therefore, even where supply of the protective film forming liquid to one principal surface of the substrate and suction by the suction unit are conducted from mutually opposite sides to the substrate in the up/down direction, it is possible to appropriately adjust the posture of the substrate.

As a result, it is possible to satisfactorily protect the one surface of the substrate with the protective film and satisfactorily remove the protective film after execution of the predetermined processing in that state.

In one preferred embodiment of the present invention, the protective film forming liquid supplying unit has a protective film forming liquid discharge port which discharges the protective film forming liquid from above toward the substrate held by the holding unit. The suction unit has a suction surface which is suctioned to the substrate from below.

In a configuration that supplies the protective film forming liquid to the substrate from below, the protective film forming liquid may fall from the substrate before the protective film forming liquid spreads on the one surface. On the other hand, in a configuration that the protective film forming liquid is discharged from the protective film forming liquid discharge port and landed on the one surface of the substrate from above, the protective film forming liquid which has landed on the one surface spreads on the one surface without separating from the one surface due to its own weight. Thereby, the protective film forming liquid is easily supplied uniformly across the entirety of the one surface.

Further, in a configuration that the suction surface is brought into contact with the substrate from above to suction the substrate, it is necessary to suction the substrate from above by the suction unit, with the substrate supported from below. On the other hand, where the suction unit has a suction surface which is suctioned to the substrate from below, the substrate can be suctioned to the suction surface in a state that the substrate is placed on the suction surface. Therefore, suction operation is made easy as compared with the configuration that the suction unit suctions the substrate from above.

In one preferred embodiment of the present invention, the removing liquid supplying unit is configured so as to supply the removing liquid to the substrate held by the holding unit. That is, supply of the removing liquid by the removing liquid supplying unit and supply of the protective film forming liquid by the protective film forming liquid supplying unit are conducted in a state that the substrate is held by the common holding unit. Therefore, as compared with a configuration that cleaning tanks are respectively provided for housing plural types of liquids, the protective film can be removed from the substrate by using the substrate processing system simple in configuration.

In one preferred embodiment of the present invention, the holding unit has a gripping member which grips a peripheral edge portion of a substrate and holds the substrate at a predetermined holding position and a supporting base which holds the gripping member and is disposed at an interval from the holding position.

According to the substrate processing system, the substrate is held by the holding unit, with an interval kept from the supporting base. Therefore, it is possible to supply the protective film forming liquid to the one surface of the substrate, without bringing the other surface of the substrate into contact with the supporting base. Therefore, it is possible to prevent contamination of the other surface when the protective film forming liquid is supplied.

In one preferred embodiment of the present invention, the protective film forming unit includes a substrate rotating unit which rotates the supporting base and thereby rotates the substrate held by the holding unit.

Therefore, after supply of the protective film forming liquid to the one surface of the substrate, the substrate is not moved from the holding unit to another unit and the protective film can be formed, with the substrate held by the holding unit. Therefore, it is possible to prevent a variation in thickness of the protective film forming liquid at each position of the one surface of the substrate due to an impact, etc., that acts on the substrate when the substrate is moved. Thus, it is possible to satisfactorily protect the one surface of the substrate with the protective film.

In one preferred embodiment of the present invention, the protective film forming liquid which is supplied to one surface of the substrate by the protective film forming liquid supplying unit contains a solvent and a solute. The solute contains a high solubility component and a low solubility component lower in solubility to the removing liquid than the high solubility component. The protective film formed by the protective film forming unit contains high solubility solids which are formed by the high solubility component and low solubility solids which are formed by the low solubility component. Then, the high solubility solids are dissolved by the removing liquid supplied from the removing liquid supplying unit, and the protective film is peeled from the one surface of the substrate.

According to the substrate processing system, the solubility of the high solubility component to the removing liquid is higher than the solubility of the low solubility component to the removing liquid. Therefore, the high solubility solids formed by the high solubility component are more easily dissolved by the removing liquid than the low solubility solids formed by the low solubility component.

Therefore, the removing liquid is supplied to a front surface of the substrate to dissolve the high solubility solids in the removing liquid, thereby forming a gap in the protective film. On the other hand, the low solubility solids are not dissolved in the removing liquid but kept in a solid state.

Thus, while the high solubility solids are dissolved in the removing liquid, the low solubility solids can be kept in a solid state. Therefore, the removing liquid passes through the gap (route) formed by dissolution of the high solubility solids and reaches an interface between the substrate and the low solubility solids.

As described so far, while the removing liquid is quickly allowed to act on the interface between the protective film and the substrate, most of the protective film can be kept in a solid state. Here, there is a case that, before supply of the protective film forming liquid, removal objects such as particles, etc., adhere to the one surface of the substrate. Even in this case, while the low solubility component is kept in a solid state, the removal objects can be removed from the one surface of the substrate. Therefore, while the removal objects are held by the low solubility solids, the removing liquid is allowed to act on the interface between the low solubility solids and the substrate.

As a result, while the protective film is quickly peeled from the substrate, the removal objects can be efficiently removed from the substrate together with the protective film.

Another preferred embodiment of the present invention provides a substrate processing system including a protective film forming liquid supplying unit which supplies a protective film forming liquid to a non-device surface of a substrate, a protective film forming unit which solidifies or hardens the protective film forming liquid and forms a protective film on the non-device surface of the substrate and a suction unit which suctions the non-device surface of the substrate. In the substrate processing system, the protective film may be a film which can be removed by supply of a removing liquid.

According to the substrate processing system, the non-device surface on which the protective film removable by supply of the removing liquid has been formed is suctioned by the suction unit. Therefore, while the non-device surface is protected, the substrate is subjected to processing (peripheral edge processing, scrub cleaning processing, coating processing, etc.) and, thereafter, the protective film can be removed from the non-device surface. Therefore, it is not necessary to use plural types of liquids for removing the protective film and it is not necessary to immerse the substrate into a cleaning tank. That is, the protective film can be removed from the one surface of the substrate by a simple procedure of supplying the removing liquid.

As a result, the non-device surface of the substrate is satisfactorily protected by the protective film and after processing of the substrate in that state, the protective film can be satisfactorily removed from the substrate.

Still another preferred embodiment of the present invention provides a substrate processing method including a protective film forming liquid supplying step of supplying a protective film forming liquid to one surface of a substrate, a protective film forming step of solidifying or hardening the protective film forming liquid on the one surface of the substrate to forma protective film on the one surface of the substrate, a processing step of executing predetermined processing with respect to the other surface of the substrate while the one surface of the substrate in which the protective film has been formed is suctioned by a suction unit, and a removing step of supplying a removing liquid toward the one surface of the substrate from a removing liquid discharge port after the processing step to remove the protective film from the one surface of the substrate.

According to the substrate processing method, in a state that the one surface on which the protective film has been formed is suctioned by the suction unit, predetermined processing can be executed with respect to the other surface. Therefore, it is possible to prevent contamination of the one surface of the substrate by the suction unit.

As described previously, the predetermined processing includes peripheral edge processing, scrub cleaning processing, coating processing, etc. Among the peripheral edge processing, the scrub cleaning processing and the coating processing, plural types of the processing may be executed, or after execution of the coating processing, a resist film may be exposed.

After execution of the predetermined processing, the removing liquid is discharged from the removing liquid discharge port to the one surface of the substrate, by which the protective film can be removed from the one surface of the substrate. Therefore, it is not necessary to use plural types of liquids for removing the protective film and it is not necessary to immerse the substrate into a cleaning tank. That is, it is possible to remove the protective film from the one surface of the substrate by a simple procedure of discharging the removing liquid from the removing liquid discharge port.

As a result, after the one surface of the substrate has been satisfactorily protected by the protective film and the predetermined processing has been executed in this state, the protective film can be satisfactorily removed from the substrate.

In a further preferred embodiment of the present invention, the protective film forming liquid supplying step includes a step in which a protective film forming liquid is discharged to a first principal surface of a substrate from a protective film forming liquid discharge port which faces one surface of the substrate held horizontally by a holding unit from one side in an up/down direction. The substrate processing method further includes a first turning step which turns around the substrate such that the first principal surface of the substrate will turn to the other side in the up/down direction after the protective film forming liquid supplying step. Then, the processing step includes a step in which, after the first turning step, the suction unit is suctioned to the one surface of the substrate from the other side in the up/down direction and the predetermined processing is executed with respect to the other surface of the substrate in a state of being suctioned to the suction unit.

According to the substrate processing method, after the protective film forming liquid has been supplied to the one surface of the substrate from one side in the up/down direction, the substrate is turned around and the one surface of the substrate is turned to the other side in the up/down direction. Thereby, the suction unit can be suctioned to the one surface of the substrate from the other side in the up/down direction. Therefore, even where supply of the protective film forming liquid to the one surface of the substrate and suction by the suction unit are conducted from mutually opposite sides to the substrate in the up/down direction, the posture of the substrate can be appropriately adjusted.

As a result, the one surface of the substrate is satisfactorily protected with the protective film, the predetermined processing is executed in this state and, thereafter, the protective film can be satisfactorily removed.

In still another preferred embodiment of the present invention, the substrate processing method further includes a second turning step of turning around a substrate such that one surface of the substrate will turn to one side in an up/down direction after the processing step. Then, the removing step includes a step of supplying the removing liquid toward the one surface of the substrate from a removing liquid discharge port which faces the one surface of the substrate held horizontally by the holding unit from one side in the up/down direction.

Supply of the removing liquid and suction by the suction unit executed with respect to the one surface of the substrate are conducted from mutually opposite sides to the substrate in the up/down direction. After the processing step, the substrate is turned around and the one surface is turned to one side in the up/down direction, thus making it possible to supply the removing liquid to the one surface of the substrate in a state that the posture of the substrate is appropriately adjusted.

Further, according to this method, supply of the removing liquid and supply of the protective film forming liquid are conducted in a state that the substrate is held by the common holding unit. Thus, as compared with a configuration that provides respectively cleaning tanks for housing plural types of liquids, the protective film can be removed from the substrate by using a simple substrate processing method.

In another preferred embodiment of the present invention, the protective film forming liquid supplying step includes a protective film forming liquid discharging step which discharges a protective film forming liquid toward a substrate from the protective film forming liquid discharge port disposed higher than the substrate held by the holding unit. Then, the processing step includes a step in which the substrate is placed on a suction surface of a suction unit from above and while the substrate placed on the suction surface is suctioned to the suction surface, predetermined processing is executed with respect to the other surface of the substrate.

In a method for supplying the protective film forming liquid to the substrate from below, the protective film forming liquid may fall from the substrate before the protective film forming liquid spreads on the one surface. On the other hand, in a method that the protective film forming liquid is discharged from the protective film forming liquid discharge port and landed on the one surface of the substrate from above, the protective film forming liquid spreads on the one surface without separating from the one surface due to its own weight. Thereby, the protective film forming liquid is easily supplied uniformly across the entirety of the one surface.

Further, in a method that a suction surface is brought into contact with the substrate from above and the substrate is suctioned, it is necessary to suction the substrate from above by the suction unit, with the substrate supported from below. On the other hand, where the suction unit has a suction surface which is suctioned to the substrate from below, in a state that the substrate is placed on the suction surface, the substrate can be suctioned to the suction surface. Therefore, suction operation is made easy as compared with the configuration that the suction unit suctions the substrate from above.

A further preferred embodiment of the present invention has a gripping member in which the holding unit grips a peripheral edge portion of a substrate and holds the substrate in a predetermined holding position and a supporting base which supports the gripping member and is disposed at an interval from the holding position.

According to the substrate processing method, the substrate is held by the holding unit, with an interval kept from the supporting base. Therefore, the protective film forming liquid can be supplied to the one surface of the substrate, without bringing the other surface of the substrate into contact with the supporting base. Thus, it is possible to prevent contamination of the other surface when the protective film forming liquid is supplied.

In still another preferred embodiment of the present invention, the protective film forming step includes a substrate rotating step of rotating the supporting base to rotate the substrate held by the holding unit.

Therefore, after supply of the protective film forming liquid to the one surface of the substrate, the substrate is not transferred from the holding unit to another unit, and the protective film can be formed, with the substrate held by the holding unit. Therefore, it is possible to prevent a variation in thickness of the protective film forming liquid at each position of the one surface of the substrate due to an impact, etc., which acts on the substrate when the substrate is moved. Thus, it is possible to satisfactorily protect the one surface of the substrate with the protective film.

In another preferred embodiment of the present invention, the protective film forming liquid supplied to one surface of the substrate in the protective film forming liquid supplying step contains a solvent and a solute. The solute has a high solubility component and a low solubility component lower in solubility to the removing liquid than the high solubility component. The protective film formed in the protective film forming step has high solubility solids formed by the high solubility component and low solubility solids formed by the low solubility component. Then, in the removing step, the high solubility solids are dissolved by the removing liquid and the protective film is peeled from the one surface of the substrate.

According to the substrate processing method, the solubility of the high solubility component to the removing liquid is higher than the solubility of the low solubility component to the removing liquid. Therefore, the high solubility solids formed of the high solubility component are more easily dissolved in the removing liquid than the low solubility solids formed of the low solubility component.

Therefore, the removing liquid is supplied to a front surface of the substrate to dissolve the high solubility solids in the removing liquid, thereby forming a gap in the protective film. On the other hand, the low solubility solids are not dissolved in the removing liquid but kept in a solid state.

Thus, while the high solubility solids are dissolved in the removing liquid, the low solubility solids can be kept in a solid state. Therefore, the removing liquid passes through the gap (route) formed by dissolution of the high solubility solids and reaches an interface between the substrate and the low solubility solids.

As described so far, while the removing liquid is allowed to quickly act on the interface between the protective film and the substrate, most of the protective film can be kept in a solid state. Here, there is a case that removal objects such as particles, etc., may adhere to the one surface of the substrate before supply of the protective film forming liquid. Even in this case, while the low solubility component is kept in a solid state, the objects can be removed from the one surface of the substrate. Therefore, while the removal objects are held by the low solubility solids, the removing liquid is allowed to act on the interface between the low solubility solids and the substrate.

As a result, while the protective film is quickly peeled from the substrate, the removal objects can be efficiently removed from the substrate, together with the protective film.

The aforementioned as well as yet other objects, features, and effects of the present invention will be made clear by the following description of the preferred embodiments with reference to the accompanying drawings.

DETAILED DESCRIPTION OF THE PREFERRED EMBODIMENTS

First Preferred Embodiment

Figure 1A:
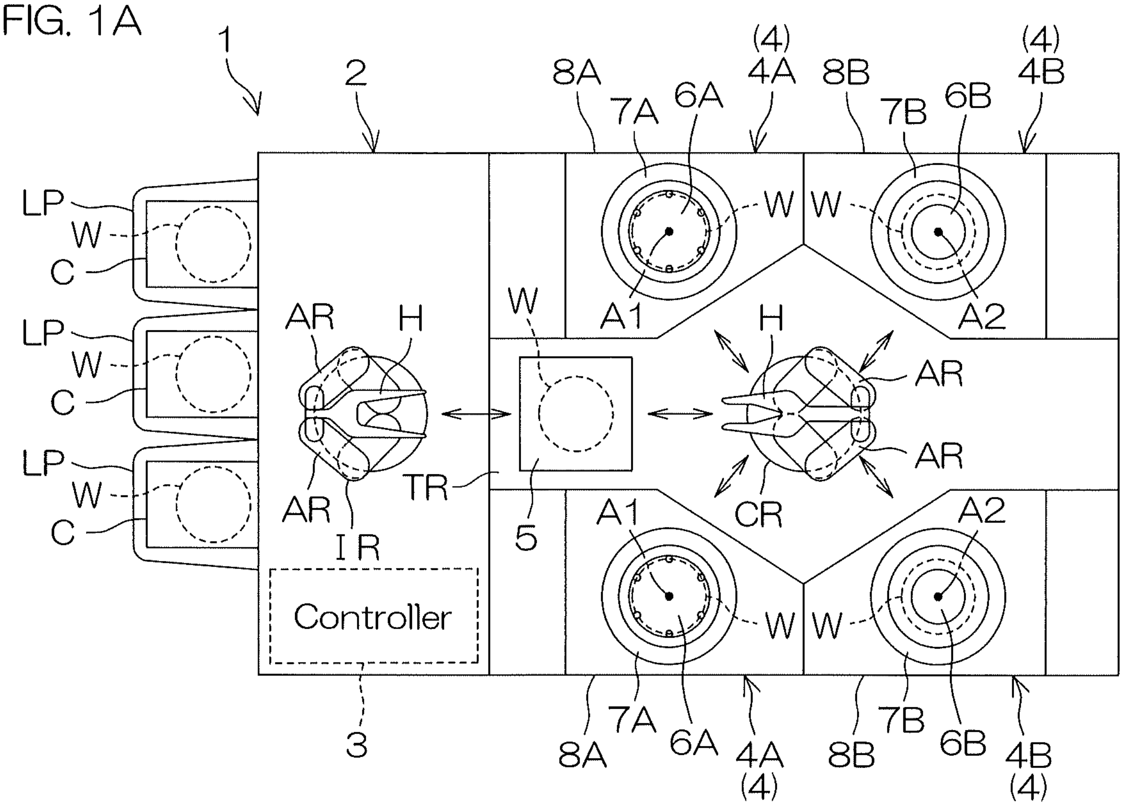
FIG. 1A is a plan view for describing a configuration of a substrate processing apparatus provided in a substrate processing system according to a first preferred embodiment of the present invention.
Figure 1B:
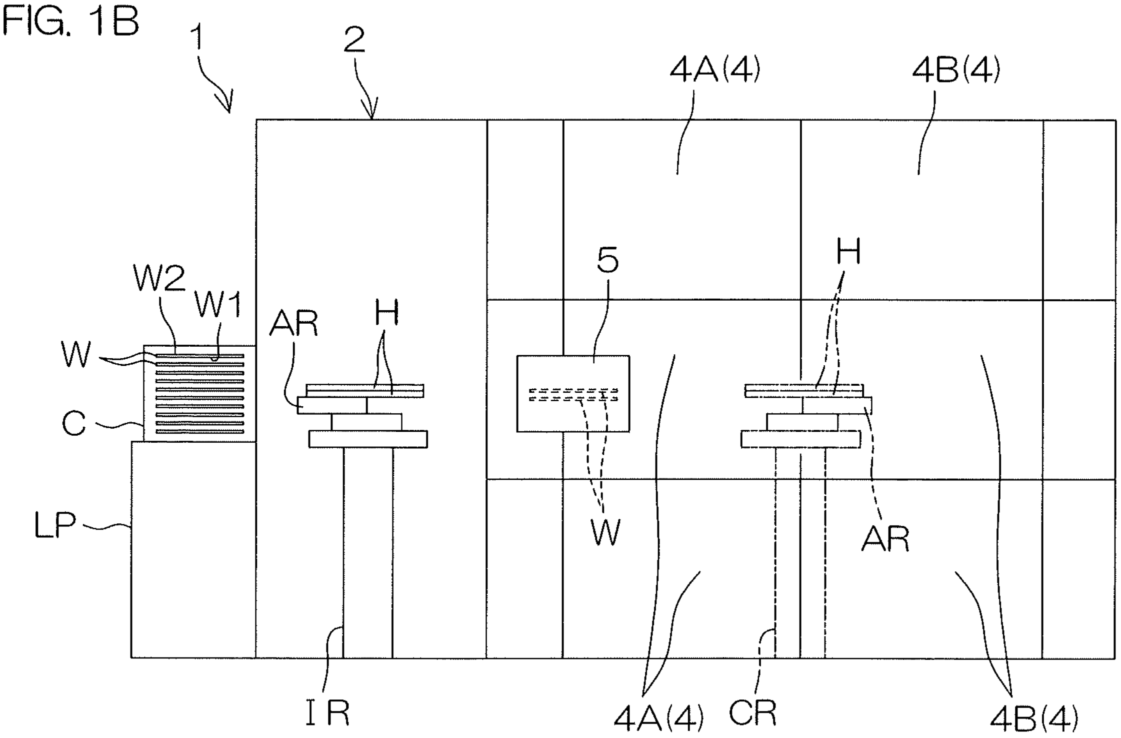
FIG. 1B is a schematic elevational view for describing the configuration of the substrate processing apparatus.

FIG. 1A is a plan view for describing a configuration of a substrate processing apparatus 2 provided in a substrate processing system 1 according to the first preferred embodiment of the present invention. FIG. 1B is a schematic elevational view for describing a configuration of the substrate processing apparatus 2.

The substrate processing system 1 is a system for processing a substrate W such as a silicon wafer, etc. The substrate processing system 1 includes a single substrate processing type apparatus (single processing apparatus) 2 which processes a substrate W one at a time and a controller 3 which controls the substrate processing apparatus 2. In this preferred embodiment, the substrate W is a disk-shaped substrate.

The substrate processing apparatus 2 includes a plurality of liquid processing apparatuses 4 for processing the substrate W with a liquid, a plurality of container holding units (load ports) LP on which a plurality of containers (carriers) C for housing the plurality of substrates W to be processed by the liquid processing apparatuses 4 are individually placed, and an indexer robot IR which carries the substrate W in and carries it out from the container C on the container holding unit LP.

The substrate W has, for example, one surface W1 (first surface) and the other surface W2 (second surface) at the opposite side to the one surface W1. The substrate W is housed in the container C in a posture such that the other surface W2 faces upward. The other surface W2 is a device surface on which, for example, a circuit pattern is formed, and the one surface W1 is, for example, a non-device surface on which no circuit pattern is formed. The one surface W1 is not necessarily a non-device surface but may be a device surface in which a circuit pattern is formed on both surfaces of the substrate W.

The substrate processing apparatus 2 further includes a main transfer robot CR which delivers the substrate W with the indexer robot IR and also carries the substrate W into and carries it out from the plurality of liquid processing apparatuses 4, and a turning unit 5 which receives the substrate W from the indexer robot IR and the main transfer robot CR and turns around the substrate W such that one of the one surface W1 and the other surface W2 of the substrate W faces upward.

The indexer robot IR and the main transfer robot CR are disposed on a transfer route TR which extends from the container holding unit LP to the plurality of liquid processing apparatuses 4. The indexer robot IR and the main transfer robot CR are each an articulated arm robot including a pair of articulated arms AR and a pair of hands H each installed at the tip of the pair of articulated arms AR so as to be separated from each other up and down.

The plurality of liquid processing apparatuses 4 constitute four processing towers which are disposed each at four positions which are separated horizontally. Each of the processing towers includes the plurality (three in the example of FIG. 1B) of liquid processing apparatuses 4 which are stacked in an up/down direction. The four processing towers are disposed such that two of them are each on both sides of the transfer route TR.

The plurality of liquid processing apparatuses 4 include a plurality of coating/peeling processing apparatuses 4A which coat a protective film on the one surface W1 of the substrate W and peel the protective film from the one surface W1 and a peripheral edge processing apparatus 4B which cleans a peripheral edge portion of the other surface W2 of the substrate W.

In this preferred embodiment, two processing towers on the indexer robot IR side are configured of the plurality of coating/peeling processing apparatuses 4A, and two processing towers at the opposite side to the indexer robot IR are configured of the plurality of peripheral edge processing apparatuses 4B.

Each of the coating/peeling processing apparatuses 4A includes a first spin chuck 6A which rotates the substrate W around a vertical rotational axis A1 (vertical axis) that passes through a central portion of the substrate W while the substrate W is held horizontally, a first processing cup 7A which surrounds the first spin chuck 6A and receives a liquid scattered from the substrate W, and a first chamber 8A which houses the first spin chuck 6A and the first processing cup 7A.

Each of the peripheral edge processing apparatuses 4B includes a second spin chuck 6B which rotates the substrate W around a vertical rotational axis A2 (vertical axis) passing through the central portion of the substrate W while the substrate W is held horizontally, a second processing cup 7B which surrounds the second spin chuck 6B and receives a liquid scattered from the substrate W, and a second chamber 8B which houses the second spin chuck 6B and the second processing cup 7B.

In the first chamber 8A, a carry-in/carry-out port (not shown) for carrying in the substrate W and carrying out the substrate W by the main transfer robot CR is formed. The first chamber 8A is provided with a shutter unit (not shown) that opens and closes the carry-in/carry-out port. The second chamber 8B is also provided with a carry-in/carry-out port (not shown) and a shutter unit (not shown), as with the first chamber 8A. The main transfer robot CR is an example of a transfer unit which transfers the substrate W between the turning unit 5, the first spin chuck 6A and the second spin chuck 6B.

Figure 2:
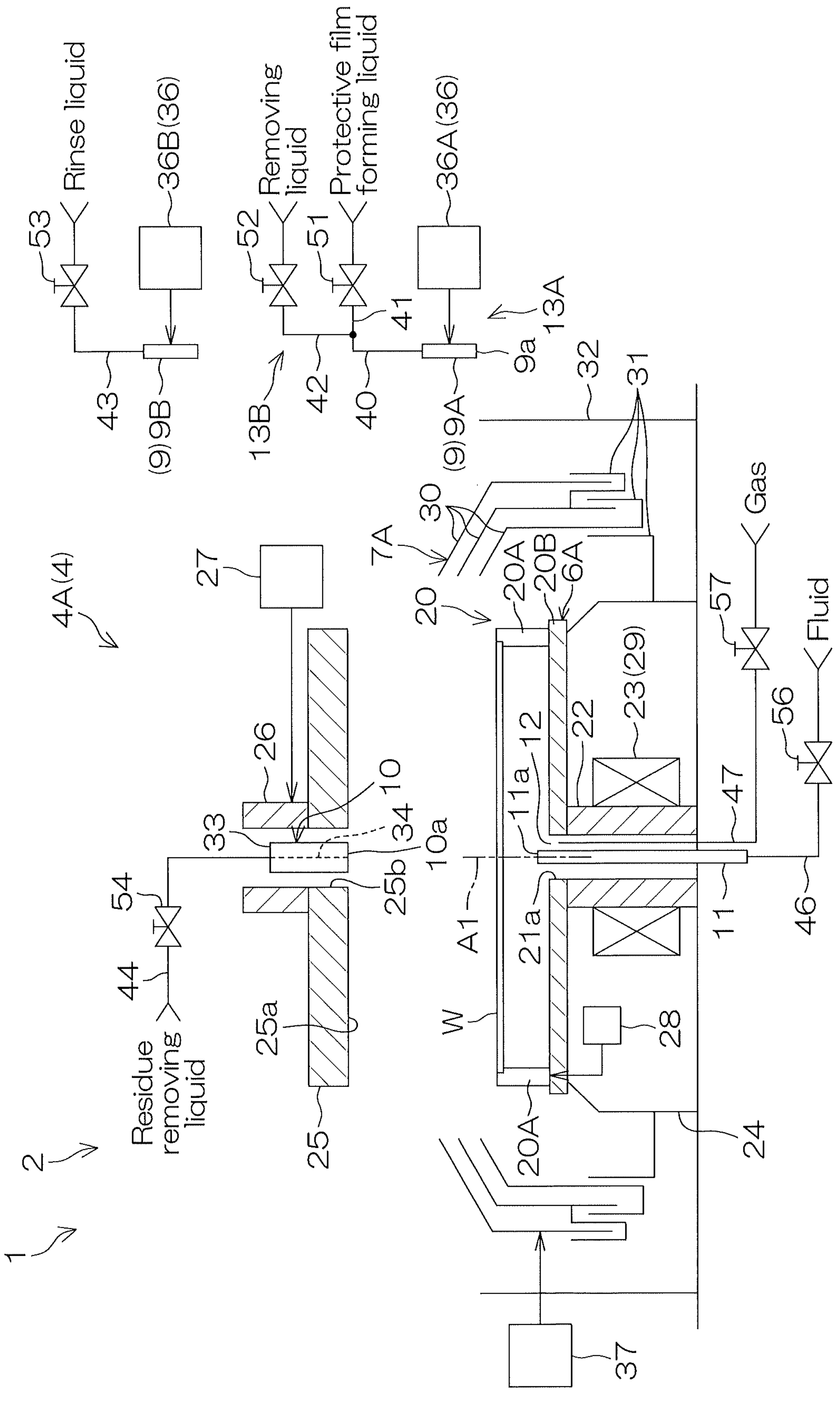
FIG. 2 is a schematic sectional view for describing a configuration example of a liquid processing unit provided in the substrate processing apparatus.

FIG. 2 is a schematic sectional view for describing a configuration example of the coating/peeling processing apparatus 4A. In FIG. 2, the first chamber 8A is not shown.

The first spin chuck 6A is an example of a holding/rotating unit which holds the substrate W in a horizontal posture and rotates the substrate W around the rotational axis A1.

The first spin chuck 6A includes a holding unit 20 which holds the substrate W, a first rotational shaft 22 which extends in a vertical direction along the rotational axis A1 and is configured so as to rotate integrally with the holding unit 20, a first spin motor 23 which rotates the first rotational shaft 22 around the rotational axis A1, and a first motor housing 24 which houses the first rotational shaft 22 and the first spin motor 23.

The holding unit 20 includes a plurality of chuck pins 20A which grip a peripheral edge portion of the substrate W and a first spin base 20B which supports the plurality of chuck pins 20A. The first spin base 20B has a disk shape along a horizontal direction. The plurality of chuck pins 20A are disposed on an upper surface of the first spin base 20B at an interval in a peripheral direction of the first spin base 20B. The holding unit 20 is also referred to as a substrate holder.

In order to drive the opening and the closing of the plurality of chuck pins 20A, an opening/closing unit 28 is provided. The plurality of chuck pins 20A are made in a closed state by the opening/closing unit 28, thereby gripping the substrate W. The plurality of chuck pins 20A are made in an open state by the opening/closing unit 28, thereby releasing gripping of the substrate W. The plurality of chuck pins 20A in an open state release the gripping of the substrate W and also support a peripheral edge portion of a lower surface of the substrate W from below. The opening/closing unit 28 includes, for example, a link mechanism (not shown) and a driving source (not shown). The driving source includes, for example, an electric motor.

The chuck pin 20A is an example of a gripping member which grips the peripheral edge portion of the substrate W and holds the substrate W at a predetermined holding position (position of the substrate W shown in FIG. 2, first holding position). The first spin base 20B is an example of a supporting base which supports the plurality of chuck pins 20A and is disposed at an interval from the holding position.

An upper end portion of the first rotational shaft 22 protrudes from the first motor housing 24 and is joined to the first spin base 20B.

The first rotational shaft 22 is rotated by the first spin motor 23 and the first spin base 20B is then rotated. Thereby, the substrate W is rotated around the rotational axis A1 together with the first spin base 20B. The first spin motor 23 is an example of a first substrate rotating unit (substrate rotating unit) which rotates the substrate W around the rotational axis A1.

At a position higher than the first spin base 20B, a blocking plate 25 which blocks an atmosphere inside a space between the space and an upper surface of the substrate W held by the first spin chuck 6A from an atmosphere outside the space is disposed.

The blocking plate 25 has a facing surface 25*a* which faces from above the upper surface of the substrate W held by the first spin chuck 6A. The blocking plate 25 is formed in a disk shape having a diameter substantially equal to or larger than that of the substrate W. A supporting shaft 26 is fixed at the opposite side of the blocking plate 25 to the facing surface 25*a*.

The blocking plate 25 is connected to a blocking plate elevating/lowering unit 27 which elevates and lowers the blocking plate 25. The blocking plate elevating/lowering unit 27 includes, for example, an actuator (not shown) such as an electric motor and an air cylinder that drive the elevating and the lowering of the supporting shaft 26. The blocking plate 25 may be rotatable around the rotational axis A1.

The first processing cup 7A includes a plurality of guards 30 which receive a liquid scattered from the substrate W held by the first spin base 20B, a plurality of cups 31 which receive a liquid guided below by the plurality of guards 30 and an exhaust tank 32 which surrounds all the guards 30 and cups 31 in a plan view.

FIG. 2 shows an example in which the three guards 30 and the three cups 31 are disposed. The cup 31 corresponds to each of the guards 30 on a one-to-one basis, and each cup 31 receives a liquid guided below by the corresponding guard 30.

A first guard elevating/lowering unit 37 for individually elevating and lowering the plurality of guards 30 is connected to the plurality of guards 30. The first guard elevating/lowering unit 37 individually elevates and lowers the plurality of guards 30 between a lower position and an upper position. The first guard elevating/lowering unit 37 includes a plurality of actuators (not shown) which individually drive the elevation and lowering of the plurality of guards 30. The actuator may be an electric motor or an air cylinder.

The first guard elevating/lowering unit 37 disposes the guard 30 at any given position in a range of the lower position to the upper position. The upper position of each guard 30 is a position at which an upper end of the guard 30 is disposed higher than a position (first holding position) of the substrate W held by the plurality of chuck pins 20A. The lower position of each guard 30 is a position at which the upper end of the guard 30 is disposed lower than the first holding position of the substrate W.

At least one of the plurality of guards 30 is disposed at the upper position, by which the guard 30 is able to receive a liquid scattered from the substrate W. All the guards 30 are disposed at the lower position, by which the main transfer robot CR (refer to FIG. 1A) is able to gain access to the first spin chuck 6A.

The coating/peeling processing apparatus 4A further includes a plurality of nozzles which supply fluids to the substrate W held by the first spin chuck 6A.

The plurality of nozzles include a plurality of moving nozzles 9 (a first moving nozzle 9A and a second moving nozzle 9B) which move in a horizontal direction and a vertical direction and supply a fluid to the substrate W from above, a central nozzle 10 which supplies a fluid to a central portion of the substrate W from above, and a lower surface nozzle 11 which supplies a fluid to the substrate W from below.

The plurality of moving nozzles 9 are respectively connected to a plurality of nozzle moving units 36 which move them in the horizontal direction and the vertical direction. Each of the moving nozzles 9 is able to move between a center position and a home position (retreat position) in the horizontal direction. Each of the moving nozzles 9 faces a central region of the upper surface of the substrate W when being positioned at the center position.

When being positioned at the home position, each of the moving nozzles 9 does not face the upper surface of the substrate W but is positioned outside the first processing cup 7A in a plan view. Each of the moving nozzles 9 is able to move close to the upper surface of the substrate W or retreat above from the upper surface of the substrate W by movement in the vertical direction.

Each of the nozzle moving units 36 includes an arm (not shown) which is joined to the corresponding moving nozzle 9 and extends horizontally, a pivotal shaft (not shown) which is joined to the arm and extends in the vertical direction, an elevating/lowering actuator (not shown) such as an electric motor or an air cylinder which elevates and lowers the pivotal shaft, and a horizontal actuator (not shown) such as an electric motor or an air cylinder which rotates the pivotal shaft to move the arm horizontally. Each of the moving nozzles 9 is a pivotal nozzle but may be a linear-movable type nozzle which is different from the nozzle of this preferred embodiment.

The first moving nozzle 9A has a discharge port 9*a* at the tip thereof. The discharge port 9*a* is disposed higher than the first holding position. When the first moving nozzle 9A is positioned above the substrate W, the discharge port 9*a* faces the upper surface of the substrate W from above. The first moving nozzle 9A is configured such that a protective film forming liquid and a removing liquid can be supplied (discharged) toward the upper surface of the substrate W held by the first spin chuck 6A.

The first moving nozzle 9A is an example of a protective film forming liquid nozzle which supplies the protective film forming liquid to the upper surface of the substrate W and also an example of a removing liquid nozzle which supplies the removing liquid such as ammonia water, etc., to the upper surface of the substrate W. The discharge port 9*a* is an example of a protective film forming liquid discharge port which discharges the protective film forming liquid and also an example of a removing liquid discharge port which discharges the removing liquid.

The protective film forming liquid is a liquid which forms a protective film that is solidified or hardened to protect a principal surface of the substrate W. The protective film is a film which has a certain shape for holding removal objects such as particles, etc., present on the substrate W. A solute and a solvent are contained in the protective film forming liquid. The protective film forming liquid is solidified or hardened by volatilization (evaporation) of at least a part of the solvent contained in the protective film forming liquid.

Here, "solidification" refers to, for example, that a solute becomes solid by a force, etc., that acts between molecules and atoms in association with volatilization of a solvent. "Hardening" refers to, for example, that a solute becomes solid, by chemical changes such as polymerization and cross linkage. Thus, "solidification or hardening" indicates that a solute becomes solid by various factors.

The protective film forming liquid contains as a solute a low solubility component and a high solubility component, the solubility of which is higher than the low solubility component in relation to the removing liquid. Substances which are mutually different in solubility to the removing liquid to be described later may be used as the low solubility component and the high solubility component. The low solubility component is, for example, novolak. The high solubility component is, for example, 2,2-bis (4-hydroxyphenyl) propane.

The solvent contained in the protective film forming liquid may be any liquid as long as it dissolves the low solubility component and the high solubility component. The solvent contained in the protective film forming liquid is preferably a liquid having a compatibility (miscibility) with the removing liquid. The compatibility is a property that two types of liquids are dissolved and mixed together with each other.

The protective film forming liquid may contain a corrosion inhibiting component. Although the details will be described later, the corrosion inhibiting component is, for example, BTA (benzotriazole).

The protective film is mainly configured of a low solubility component in a solid state (low solubility solids) and a high solubility component in a solid state (high solubility solids). The solvent may remain in the protective film. The details of individual components contained in the protective film forming liquid (solvent, low solubility component, high solubility component and corrosion inhibiting component) will be described later.

The removing liquid is a liquid which peels the protective film and removes it from the principal surface of the substrate W. The removing liquid may be an alkaline aqueous solution (alkaline liquid) other than ammonia water. Examples of the alkaline aqueous solution other than ammonia water include TMAH (tetramethyl ammonium hydroxide) aqueous solution, a Cholin aqueous solution and any combination of them. The removing liquid may be pure water (preferably, DIW) or may be a neutral or acidic aqueous solution (non-alkaline aqueous solution).

A common piping 40 which guides the protective film forming liquid and the removing liquid into the first moving nozzle 9A is connected to the first moving nozzle 9A. A protective film forming liquid piping 41 which guides the protective film forming liquid into the common piping 40 and a removing liquid piping 42 which guides the removing liquid into the common piping 40 are connected to the common piping 40.

When a protective film forming liquid valve 51 interposed in the protective film forming liquid piping 41 is opened, the protective film forming liquid is discharged downward in a continuous flow from the discharge port 9*a* of the first moving nozzle 9A. When a removing liquid valve 52 interposed in the removing liquid piping 42 is opened, the removing liquid is discharged downward in a continuous flow from the discharge port 9*a* of the first moving nozzle 9A.

A protective film forming liquid supplying unit 13A which supplies the protective film forming liquid toward the upper surface of the substrate W from the discharge port 9*a* is configured of the first moving nozzle 9A, the common piping 40 and the protective film forming liquid piping 41. A removing liquid supplying unit 13B which supplies the removing liquid toward the upper surface of the substrate W from the discharge port 9*a* is configured of the first moving nozzle 9A, the common piping 40 and the removing liquid piping 42.

A rinse liquid piping 43 which guides a rinse liquid to the second moving nozzle 9B is connected to the second moving nozzle 9B. When a rinse liquid valve 53 interposed in the rinse liquid piping 43 is opened, the rinse liquid is discharged in a continuous flow downward from the second moving nozzle 9B.

The second moving nozzle 9B and the rinse liquid piping 43 constitute a rinse liquid supplying unit which supplies (discharges) the rinse liquid such as carbonated water toward the upper surface of the substrate W held by the first spin chuck 6A. The second moving nozzle 9B is an example of the rinse liquid nozzle.

The rinse liquid is not limited to carbonated water. The rinse liquid may be a liquid which includes at least one of DIW (Deionized Water), carbonated water, electrolyzed ion water, aqueous hydrochloric acid solution of dilute concentration (of, for example, not less than 1 ppm and not more than 100 ppm), ammonia water of dilute concentration (of, for example, not less than 1 ppm and not more than 100 ppm) and reduced water (hydrogen water).

A central nozzle 10 is housed in the supporting shaft 26 of the blocking plate 25. The discharge port 10*a* disposed at the tip of the central nozzle 10 is exposed from a through hole 25*b* formed in the blocking plate 25 and faces from above a central region of the upper surface of the substrate W.

The central nozzle 10 includes a plurality of tubes which discharge a fluid downward and a tubular casing 33 which surrounds the plurality of tubes. The plurality of tubes and the casing 33 extend along the rotational axis A1 in an up/down direction. The plurality of tubes have a residue removing liquid tube 34 which supplies a residue removing liquid such as IPA to the upper surface of the substrate W. The residue removing liquid is a liquid which dissolves and removes residues of the protective film which remains on the upper surface of the substrate W after being peeled from the upper surface of the substrate W and removed by the removing liquid. The plurality of tubes may have a rinse liquid tube and a gas tube other than the residue removing liquid tube 34.

The residue removing liquid tube 34 is connected to a residue removing liquid piping 44 which guides the residue removing liquid into the residue removing liquid tube 34. When a residue removing liquid valve 54 interposed in the residue removing liquid piping 44 is opened, the residue removing liquid is discharged in a continuous flow toward the central region of the upper surface of the substrate W from the residue removing liquid tube 34 (central nozzle 10). The residue removing liquid tube 34 (central nozzle 10) and the residue removing liquid piping 44 constitute the residue removing liquid supplying unit. The central nozzle 10 is an example of the residue removing liquid nozzle.

The residue removing liquid preferably has compatibility with the rinse liquid and the protective film forming liquid. The residue removing liquid dissolves residues of the protective film. Therefore, the residue removing liquid is also referred to as a residue dissolving liquid. The residue removing liquid is, for example, an organic solvent and may be a liquid which contains at least one of IPA, HFE (hydrofluoroether), methanol, ethanol, acetone, PGEE (propyleneglycol monoethylether) and Trans-1,2-dichloroethylene.

The lower surface nozzle 11 is inserted into an insertion hole 21*a* which is opened at a central portion of an upper surface of the first spin base 20B. A discharge port 11*a* of the lower surface nozzle 11 is exposed from the upper surface of the first spin base 20B. The discharge port 11*a* of the lower surface nozzle 11 faces from below the central region of the lower surface (principal surface on the lower side) of the substrate W. The central region of the lower surface of the substrate W is a region of the lower surface of the substrate W which includes a rotation center of the substrate W.

The lower surface nozzle 11 is configured so as to discharge a fluid, for example, a rinse liquid such as carbonated water, a chemical liquid such as hydrofluoric acid (HF: hydrofluoric acid) and a heating medium such as hot water. A fluid piping 46 which guides a fluid into the lower surface nozzle 11 is connected to the lower surface nozzle 11. The fluid piping 46 may be configured such that the rinse liquid such as carbonated water, the chemical liquid such as hydrofluoric acid and the heating medium such as hot water can be selectively guided. A fluid valve 56 which opens and closes a flow route thereof is interposed in the fluid piping 46.

A gas flow route 12 is formed by a space between the lower surface nozzle 11 and the insertion hole 21*a* of the first spin base 20B. The gas flow route 12 is connected to a lower side gas piping 47 inserted into a space between an inner peripheral surface of the first rotational shaft 22 and the lower surface nozzle 11. When a lower side gas valve 57 interposed in the lower side gas piping 47 is opened, a gas such as nitrogen gas ($N_2$) is discharged from the gas flow route 12 toward a portion of the lower surface of the substrate W around the rotation center. The gas is discharged from the gas flow route 12, thus making it possible to prevent movement of a liquid adhered on the upper surface of the substrate W to the lower surface of the substrate W. It is also possible to prevent entrance of mist into a space between the lower surface of the substrate W and the first spin base 20B.

The gas discharged from the gas flow route 12 is not limited to nitrogen gas. The gas discharged from the gas flow route 12 may be air. Further, the gas discharged from the gas flow route 12 may be an inert gas other than nitrogen gas. The inert gas is not limited to nitrogen gas and is a gas which is inactive to the upper surface of the substrate W. Examples of the inert gas include rare gases such as argon in addition to nitrogen gas.

Figure 3:
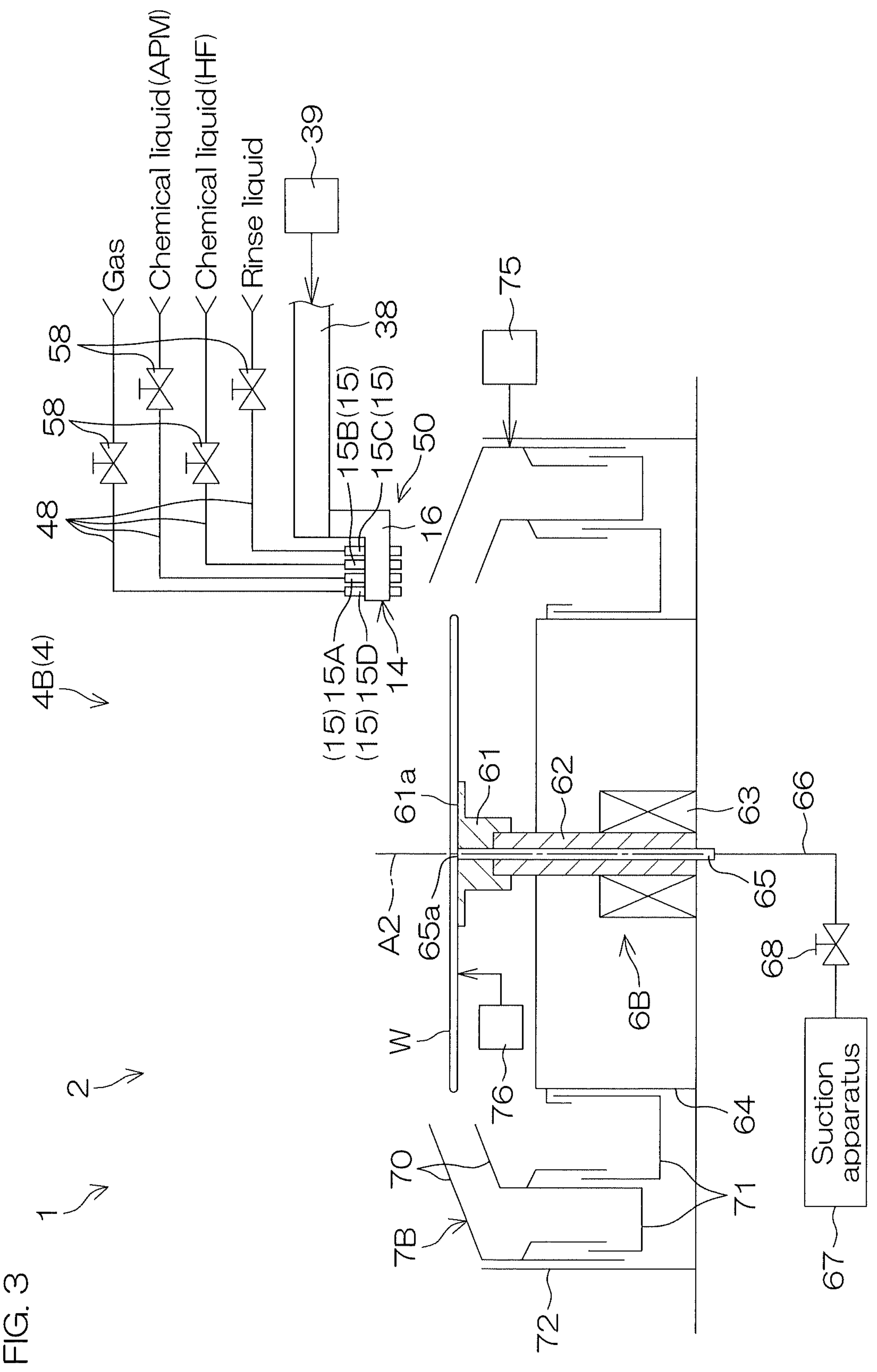
FIG. 3 is a schematic sectional view for describing a configuration example of a peripheral edge processing unit provided in the substrate processing apparatus.

FIG. 3 is a schematic sectional view for describing a configuration example of the peripheral edge processing apparatus 4B. In FIG. 3, the second chamber 8B is not shown.

The second spin chuck 6B includes a second spin base 61 which is suctioned to the lower surface of the substrate W and holds the substrate W in a horizontal posture, a second rotational shaft 62 which extends along the rotational axis A2 in a vertical direction and is joined to the second spin base 61, a second spin motor 63 which rotates the second rotational shaft 62 around the rotational axis A2, and a second motor housing 64 which houses the second rotational shaft 62 and the second spin motor 63.

The second spin base 61 has a suction surface 61*a* which is suctioned to the lower surface of the substrate W. The suction surface 61*a* is, for example, the upper surface of the second spin base 61 and is a circular surface in which the rotational axis A2 passes through the central portion thereof. A diameter of the suction surface 61*a* is smaller than that of the substrate W. The upper end portion of the second rotational shaft 62 protrudes from the second motor housing 64 and is joined to the second spin base 61.

A suction route 65 is inserted into the second spin base 61 and the second rotational shaft 62. The suction route 65 has a suction port 65*a* which is exposed from the center of the suction surface 61*a* of the second spin base 61. The suction route 65 is coupled to a suction piping 66. The suction piping 66 is coupled to a suction apparatus 67 such as a vacuum pump.

A suction valve 68 which opens and closes a route of the suction route 65 is interposed in the suction route 65. The suction valve 68 is opened, by which a substrate W disposed on the suction surface 61*a* of the second spin base 61 is suctioned to the suction port 65*a* of the suction route 65. Thereby, the substrate W is suctioned to the suction surface 61*a* from below and held at a predetermined holding position (position of the substrate W shown in FIG. 3, second holding position). The second spin base 61 (second spin chuck 6B) is an example of the suction unit. The second spin chuck 6B is also referred to as a suction rotating unit which rotates the substrate W while the substrate W is suctioned to the suction surface 61*a*.

The second rotational shaft 62 is rotated by the second spin motor 63 and the second spin base 61 is thereby rotated. The substrate W is thereby rotated around the rotational axis A2 together with the second spin base 61. The second spin motor 63 is an example of the second substrate rotating unit which rotates the substrate W around the rotational axis A2.

The second processing cup 7B includes a plurality of guards 70 which receive a liquid scattered from the substrate W suctioned to the suction surface 61*a* of the second spin base 61, a plurality of cups 71 which receive the liquid guided downward by the plurality of guards 70 and an exhaust tank 72 which surrounds all the guards 70 and the cups 71 in a plan view.

FIG. 3 shows an example in which two guards 70 and two cups 71 are disposed. The two guards 70 surround the second spin chuck 6B concentrically. The two cups 71 also surround the second spin chuck 6B concentrically.

Each cup 71 corresponds to each of the guards 70 on a one-to-one basis, and each of the cups 71 receives a liquid which is guided downward by the corresponding guard 70.

A second guard elevating/lowering unit 75 which individually elevates and lowers the plurality of guards 70 is connected to the plurality of guards 70. The second guard elevating/lowering unit 75 individually elevates and lowers the plurality of guards 70 between the lower position and the upper position. The second guard elevating/lowering unit 75 includes a plurality of actuators (not shown) which individually drive the elevation and lowering of the plurality of guards 70. The actuator may be an electric motor or an air cylinder.

The second guard elevating/lowering unit 75 disposes the guard 70 at any given position in a range of the lower position to the upper position. The upper position of each of the guards 70 is a position at which an upper end of the guard 70 is disposed higher than a position of the substrate W (second holding position) held by the second spin chuck 6B. The lower position of each of the guards 70 is a position at which the upper end of the guard 70 is disposed lower than the second holding position of the substrate W.

At least one of the plurality of guards 70 is disposed at the upper position, by which the guard 70 is able to receive a liquid scattered from the substrate W. All the guards 70 are disposed at the lower position, by which the main transfer robot CR (refer to FIG. 1A) is able to gain access to the second spin chuck 6B.

The peripheral edge processing apparatus 4B further includes a centering unit 76 which moves the substrate W horizontally such that the central portion of the upper surface of the substrate W can come close to the rotational axis A2, and a peripheral edge nozzle head 14 which supplies plural types of processing fluids to a peripheral edge portion of the upper surface of the substrate W held by the second spin chuck 6B. The peripheral edge portion of the upper surface of the substrate W is a region which includes an outer peripheral end (tip) of the substrate W and a portion of the upper surface of the substrate W in the vicinity of the outer peripheral end.

A peripheral edge nozzle head 14 includes a plurality of peripheral edge nozzles 15 which supply respectively plural types of processing fluids to the peripheral edge portion of the upper surface of the substrate W and a nozzle supporting member 16 which commonly supports the plurality of peripheral edge nozzles 15.

A processing fluid piping 48 which guides a processing fluid into the corresponding peripheral edge nozzle 15 is connected to each peripheral edge nozzle 15. A processing fluid valve 58 which opens and closes a flow route inside the corresponding processing fluid piping 48 is interposed in each processing fluid piping 48.

The plurality of peripheral edge nozzles 15 include a first peripheral edge chemical liquid nozzle 15A which discharges a chemical liquid, for example, APM (ammonia/hydrogen peroxide mixed solution), a second peripheral edge chemical liquid nozzle 15B which discharges a chemical liquid such as hydrofluoric acid, a peripheral edge rinse liquid nozzle 15C which discharges a rinse liquid such as carbonated water, and a peripheral edge gas nozzle 15D which discharges a gas such as nitrogen gas.

The chemical liquid which is discharged from the first peripheral edge chemical liquid nozzle 15A and the second peripheral edge chemical liquid nozzle 15B is not limited to APM or hydrofluoric acid. The chemical liquid discharged from the peripheral edge nozzle 15 may be a liquid which contains at least one of, for example, sulfuric acid, acetic acid, nitric acid, hydrochloric acid, hydrofluoric acid, ammonia water, hydrogen peroxide solution, organic acid (for example, citric acid, oxalic acid, etc.), organic alkali (for example, TMAH: tetramethyl ammonium hydroxide, etc.), a surfactant and a corrosion inhibiting agent. Examples of the chemical liquid in which these are mixed include APM and SPM (sulfuric acid/hydrogen peroxide mixture). APM is also referred to as SC1 (Standard Clean 1).

The rinse liquid discharged from the peripheral edge rinse liquid nozzle 15C can be selected from rinse liquids included as those used in the coating/peeling processing apparatus 4A. The gas discharged from the peripheral edge gas nozzle 15D can be selected from gases included as those used in the coating/peeling processing apparatus 4A.

A head supporting arm 38 which supports the peripheral edge nozzle head 14 is joined to the nozzle supporting member 16. The peripheral edge nozzle head 14 is moved in the horizontal direction and the vertical direction by movement of the head supporting arm 38 by a peripheral edge nozzle moving unit 39. The peripheral edge nozzle head 14 is configured so as to move in the horizontal direction between the center position and the home position (retreat position). When the peripheral edge nozzle head 14 is positioned at a peripheral edge position between the central position and the home position, and any of the plurality of processing fluid valves 58 is opened, the corresponding processing fluid is then supplied to the peripheral edge portion of the upper surface of the substrate W from the corresponding peripheral edge nozzle 15.

The peripheral edge nozzle moving unit 39 includes an elevating/lowering actuator (not shown) such as an electric motor or an air cylinder which elevates and lowers the head supporting arm 38 and a horizontally moving actuator (not shown) such as an electric motor or an air cylinder which moves the head supporting arm 38 in the horizontal direction. The head supporting arm 38 is, for example, a pivotal arm. The head supporting arm 38 is not necessarily a pivotal arm but may be a linear-movable arm.

Figure 4A:
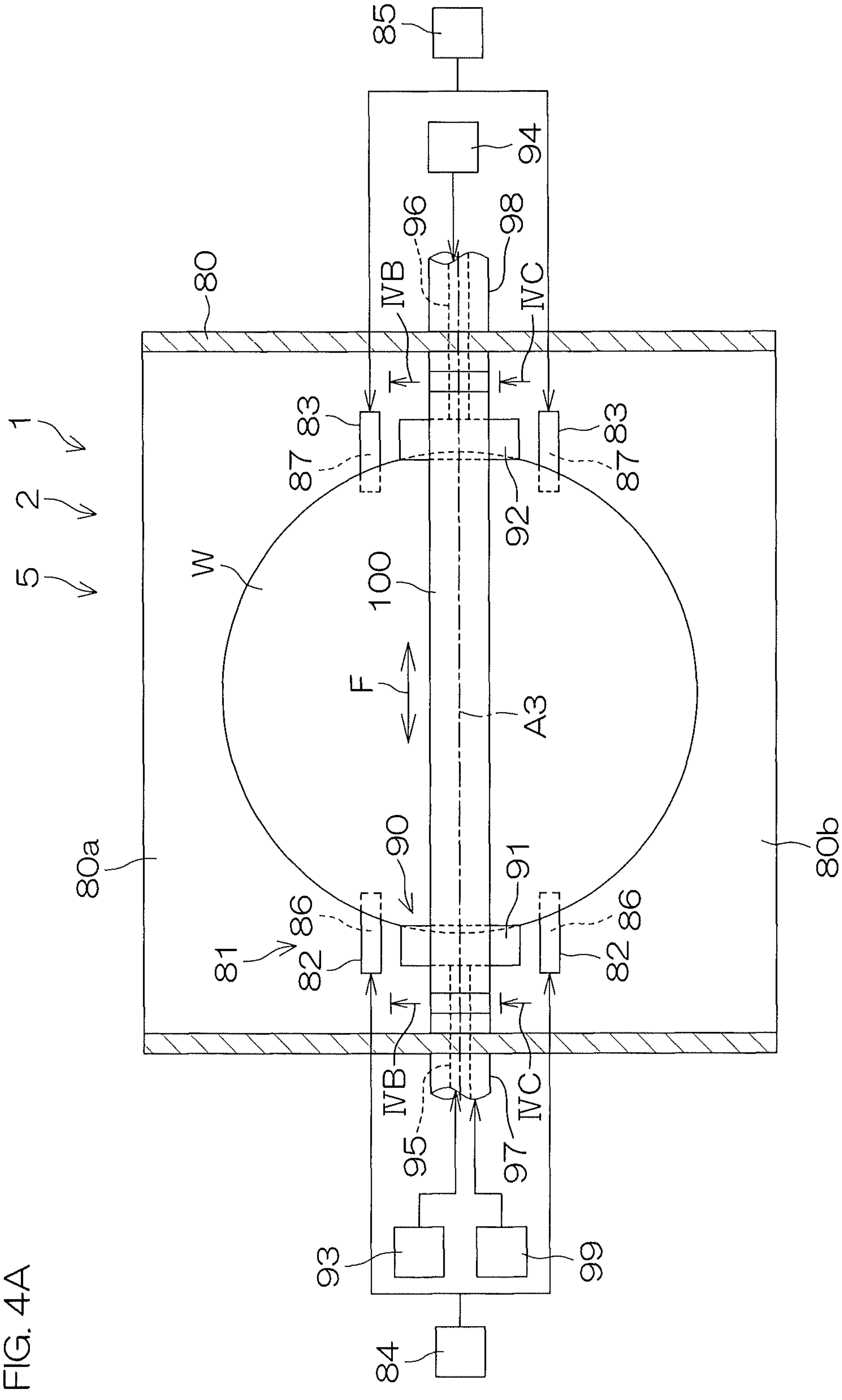
FIG. 4A is a schematic sectional view for describing a configuration example of a turning unit provided in the substrate processing apparatus.
Figure 4B:
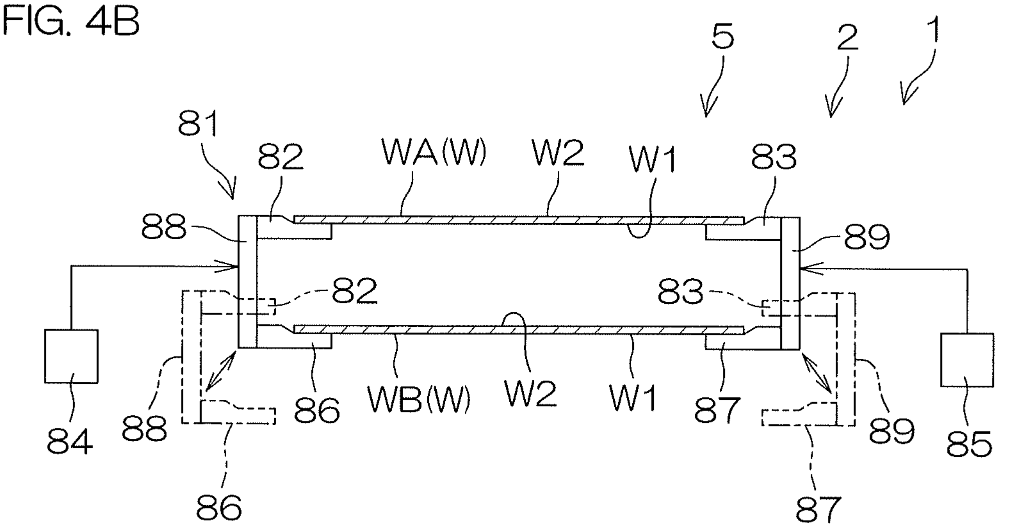
FIG. 4B is a sectional view along line IVB-IVB shown in FIG. 4A.
Figure 4C:
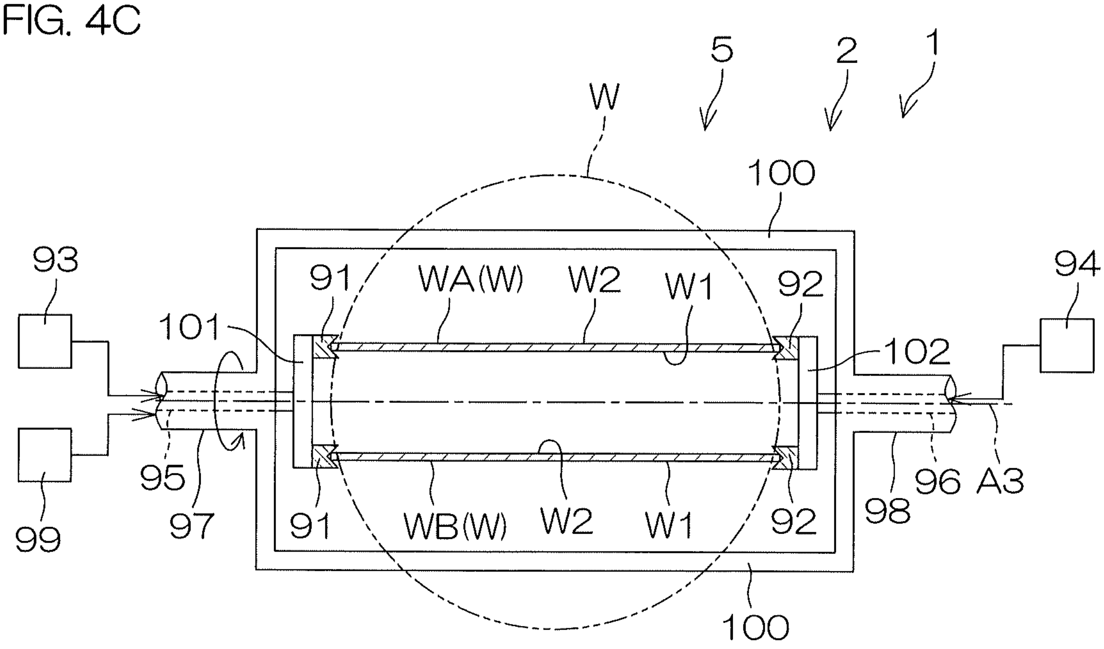
FIG. 4C is a sectional view along line IVC-IVC shown in FIG. 4A.
Figure 4D:
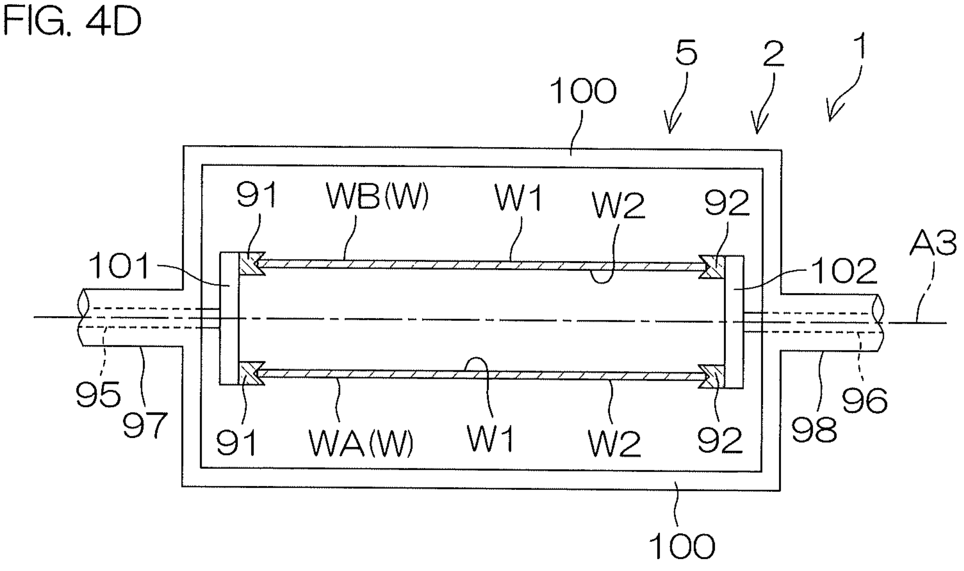
FIG. 4D is a sectional view for describing a state in which a substrate is turned around from a state shown in FIG. 4C.

FIG. 4A is a schematic sectional view for describing a configuration example of the turning unit 5. FIG. 4B is a sectional view along line IVB-IVB shown in FIG. 4A. FIG. 4C is a sectional view along line IVC-IVC shown in FIG. 4A. FIG. 4D is a sectional view for describing a state in which the substrate W is turned around from a state shown in FIG. 4C.

With reference to FIG. 4A, the turning unit 5 includes a housing cabinet 80 which houses a substrate W, a supporting mechanism 81 which supports the substrate W inside the housing cabinet 80 when the substrate W is delivered to the indexer robot IR or the main transfer robot CR and a clamping/turning mechanism 90 which clamps the substrate W inside the housing cabinet 80 and turning it around vertically.

Both of the indexer robot IR and the main transfer robot CR are able to gain access to an interior of the housing cabinet 80. In the housing cabinet 80, a first opening 80*a* which allows a pair of hands H of the indexer robot IR (refer to FIG. 1A) to gain access to the interior of the housing cabinet 80 and a second opening 80*b* which allows a pair of hands H of the main transfer robot CR (refer to FIG. 1A) to gain access to the interior of the housing cabinet 80 are formed. In this preferred embodiment, two substrates W are able to be housed at the same time in the interior of the housing cabinet 80.

With reference to FIG. 4A and FIG. 4B, the supporting mechanism 81 includes a plurality of first supporting members 82 which support a substrate W from below such that the substrate W is disposed at a predetermined reference position (upper reference position), a plurality of second supporting members 83 which support the substrate W from below at a position that faces the plurality of first supporting members 82 in the horizontal direction such that the substrate W is disposed at the reference position (upper reference position), a first actuator 84 which moves the plurality of first supporting members 82 between a supporting position for supporting the substrate W and a retreat position that retreats below from the supporting position, and a second actuator 85 which moves the plurality of second supporting members 83 between the supporting position for supporting the substrate W and the retreat position that retreats below from the supporting position.

The first actuator 84 moves the plurality of first supporting members 82 obliquely such that these can come close to the plurality of second supporting members 83 as they move upward. The first actuator 84 may be an electric motor or an air cylinder. The second actuator 85 moves the plurality of second supporting members 83 obliquely such that these can come close to the plurality of first supporting members 82 as they move upward. The second actuator 85 may also be an electric motor or an air cylinder, as with the first actuator 84.

In this preferred embodiment, since two substrates W are housed at the same time in the interior of the housing cabinet 80, the supporting mechanism 81 includes a plurality of first lower supporting members 86 which support the substrates W from below at a position lower than the first supporting member 82 (first upper supporting member) such that the substrates W are disposed at a predetermined reference position (lower-side reference position), and a plurality of second lower supporting members 87 which support the substrates W from below at a position that faces the plurality of first lower supporting members 86 in the horizontal direction and is lower than the plurality of second supporting members 83 (second upper supporting member) such that the substrates W are disposed at the reference position (lower-side reference position).

The supporting mechanism 81 further includes a plurality of first coupling portions 88 which couple first supporting members 82 and first lower supporting members 86 that corresponds to the first supporting members 82 as well as a plurality of second coupling portions 89 which couple second supporting members 83 and second lower supporting members 87 that corresponds to the second supporting members 83. Therefore, the plurality of first lower supporting members 86 are moved obliquely by the first actuator 84 together with the plurality of first supporting members 82. Further, the plurality of second lower supporting members 87 are moved obliquely by the second actuator 85 together with the plurality of second supporting members 83. In detail, the plurality of first lower supporting members 86 move obliquely between a supporting position which supports the substrate W positioned at the lower-side reference position and a retreat position that retreats below from the supporting position. The plurality of second lower supporting members 87 move obliquely between a supporting position which supports the substrate W positioned at the lower-side reference position and the retreat position that retreats below from the supporting position.

In FIG. 4C, the supporting mechanism 81 is not shown. With reference to FIG. 4A and FIG. 4C, the clamping/turning mechanism 90 includes a pair of first facing members 91, a pair of second facing members 92 which face respectively the pair of first facing members 91 in the horizontal direction and respectively clamp the substrate W positioned at a reference position together with the corresponding first facing members 91, a first horizontally moving mechanism 93 which moves the pair of first facing members 91 in a facing direction F at which the first facing member 91 faces the second facing member 92, and a second horizontally moving mechanism 94 which moves the pair of second facing members 92 in the facing direction F. The first horizontally moving mechanism 93 is, for example, an electric motor or an air cylinder. The second horizontally moving mechanism 94 is, for example, an electric motor or an air cylinder.

The clamping/turning mechanism 90 includes a first supporting shaft 95 which supports the pair of first facing members 91 and extends in the horizontal direction, a second supporting shaft 96 which supports the pair of second facing members 92 and extends coaxially with the first supporting shaft 95, a first rotational shaft 97 in which the first supporting shaft 95 is inserted so as to rotate integrally with the first supporting shaft 95 around a central axis A3 of the first supporting shaft 95, and a second rotational shaft 98 in which the second supporting shaft 96 is inserted so as to rotate integrally with the second supporting shaft 96 around the central axis A3. The first rotational shaft 97 and the first supporting shaft 95 are able to rotate integrally, for example, by a recess-protrusion engagement. The second rotational shaft 98 and the second supporting shaft 96 are able to rotate integrally, for example by a recess-protrusion engagement.

The clamping/turning mechanism 90 further includes a rotating mechanism 99 which rotates the first rotational shaft 97 around the central axis A3 and a pair of shaft coupling members 100 which couple the first rotational shaft 97 and the second rotational shaft 98. The rotating mechanism 99 includes, for example, an electric motor or an air cylinder.

The pair of first facing members 91 are symmetrically disposed, with the central axis A3 given as a center, and the pair of second facing members 92 are symmetrically disposed, with the central axis A3 given as a center. The clamping/turning mechanism 90 further includes a first coupling member 101 which couples the pair of first facing members 91 and the first supporting shaft 95, and a second coupling member 102 which couples the pair of second facing members 92 and the second supporting shaft 96.

Hereinafter, a description will be given of a turning operation of the substrate W by the turning unit 5.

First, as shown in FIG. 4B, one substrate W (hereinafter, referred to as "substrate WA") is placed on the plurality of first supporting members 82 and the plurality of second supporting members 83 of the supporting mechanism 81 by the indexer robot IR or the main transfer robot CR (refer to FIG. 1A) and one substrate W (hereinafter, referred to as "substrate WB") is placed on the plurality of first lower supporting members 86 and the plurality of second lower supporting members 87 of the supporting mechanism 81 by the indexer robot IR or the main transfer robot CR (refer to FIG. 1A).

Hereinafter, for simplification, a description will be given of only the turning operation of the substrate WA. The operation of the substrate WB is the same as the operation that "the plurality of first supporting members 82" and "the plurality of second supporting members 83" are replaced by "the plurality of first lower supporting members 86" and "the plurality of second lower supporting members 87 "in a description of the operation."

In a state that the substrate WA is placed on the plurality of first supporting members 82 and the plurality of second supporting members 83, the first facing member 91 and the second facing member 92 are brought close to each other, by which the substrate WA is clamped by the first facing member 91 and the second facing member 92 between them.

In a state that the substrate WA is clamped by the first facing member 91 and the second facing member 92, the plurality of first supporting members 82 and the plurality of second supporting members 83 are moved obliquely downward toward the retreat position, and the plurality of first supporting members 82 and the plurality of second supporting members 83 are retreated. Thereby, the substrate WA is delivered to the first facing member 91 and the second facing member 92.

In a state that the plurality of first supporting members 82 and the plurality of second supporting members 83 are retreated, the first facing member 91 and the second facing member 92 are rotated, thereby the substrate WA is turned around. In FIG. 4C which shows a state before it is turned around, the other surface W2 of the substrate WA faces upward. On the other hand, in FIG. 4D which shows a state after it has been turned around, the other surface W2 of the substrate WA faces downward.

After the substrate WA has been turned around, the plurality of first lower supporting members 86 and the plurality of second lower supporting members 87 are moved obliquely upward toward the supporting position. Thereby, the substrate WA is supported from below by the plurality of first lower supporting members 86 and the plurality of second lower supporting members 87. In a state that the substrate WA is supported from below by the plurality of first lower supporting members 86 and the plurality of second lower supporting members 87, the first facing member 91 and the second facing member 92 are moved so as to be separated from each other. Thereby, the substrate WA is delivered to the plurality of first lower supporting members 86 and the plurality of second lower supporting members 87. In this state, the indexer robot IR and the main transfer robot CR (refer to FIG. 1A) are able to gain access to the substrate WA.

Figure 5:
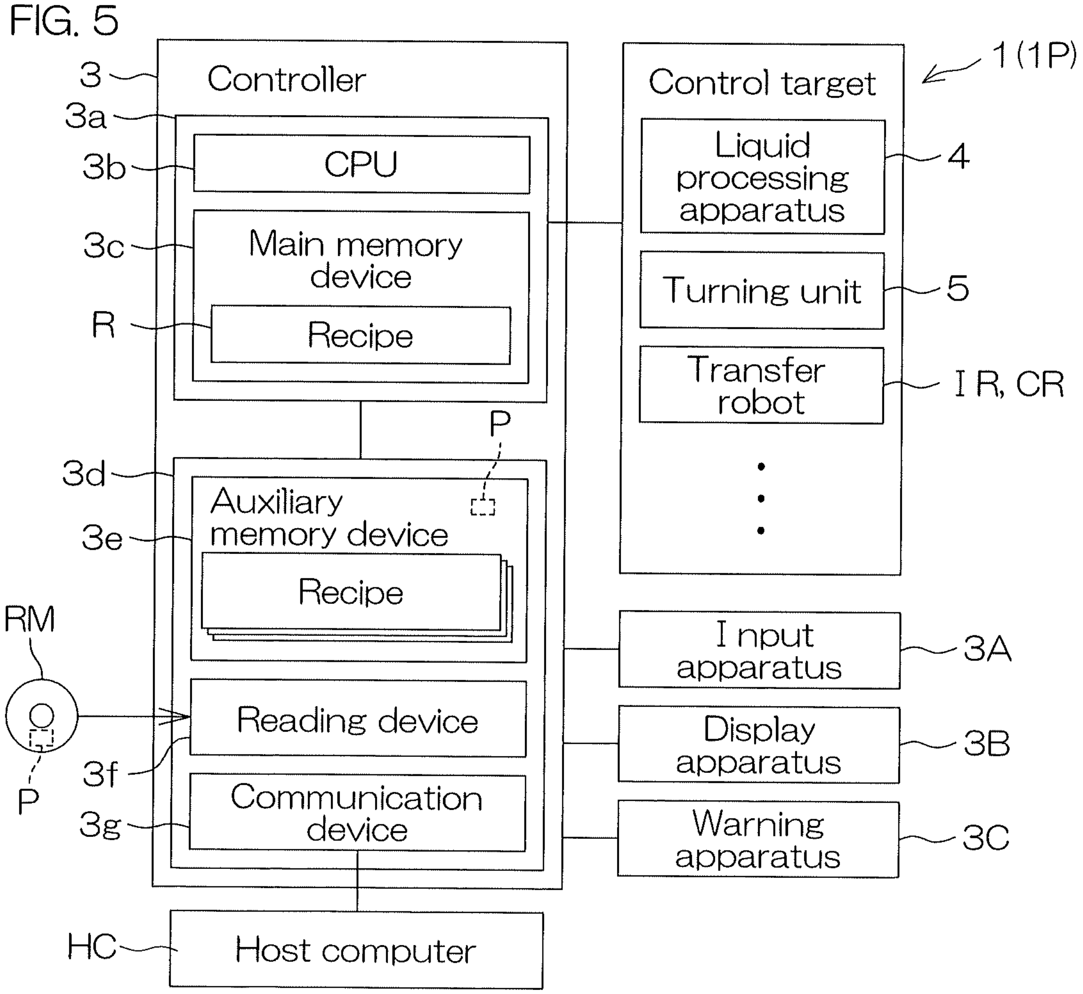
FIG. 5 is a block diagram for describing a configuration example with regard to control of the substrate processing system.

FIG. 5 is a block diagram for describing a configuration example with regard to control of the substrate processing system 1. The controller 3 is a computer which includes a computer main body 3*a* and a peripheral apparatus 3*d* connected to the computer main body 3*a*. The computer main body 3*a* includes a CPU 3*b* (central processing unit) which executes various commands and a main memory device 3*c* which stores information. The peripheral apparatus 3*d* includes an auxiliary memory device 3*e* which stores information such as programs P, a reading device 3*f* which reads information from removable media RM and a communication device 3*g* which communicates with other apparatuses such as a host computer.

The controller 3 is connected to an input apparatus 3A, a display apparatus 3B and a warning apparatus 3C. The input apparatus 3A is operated when operators such as users and personnel in charge of maintenance input information to the substrate processing apparatus 2. The information is displayed on a screen of the display apparatus 3B. The input apparatus 3A may be any one of a keyboard, a pointing device and a touch panel or may be any apparatus other than these devices. A touch panel display which acts as the input apparatus 3A and the display apparatus 3B may be provided in the substrate processing apparatus 2. The warning apparatus 3C sends a warning by using one or more of light, sounds, letters and figures. Where the input apparatus 3A is a touch panel display, the input apparatus 3A may also act as the warning apparatus 3C.

The CPU 3*b* executes the programs P stored in the auxiliary memory device 3*e*. The programs P inside the auxiliary memory device 3*e* may be those installed in advance in the controller 3, those sent to the auxiliary memory device 3*e* through a reading device 3*f* from the removable medium RM, or those sent to the auxiliary memory device 3*e* from an external device such as the host computer HC through the communication device 3*g*.

The auxiliary memory device 3*e* and the removable medium RM are a non-volatile memory which keeps memory without electricity. The auxiliary memory device 3*e* is, for example, a magnetic storage device such as a hard disk drive. The removable medium RM is, for example, an optical disk such as a compact disk or a semiconductor memory such as a memory card. The removable medium RM is an example of a computer-readable recording medium in which the programs P are recorded. The removable medium RM is a non-temporary tangible recording medium.

The auxiliary memory device 3*e* stores a plurality of recipes R. The recipe R is information which prescribes processing contents, processing conditions and processing procedures of a substrate W. The plurality of recipes R are different from each other in at least one of the processing contents, processing conditions and processing procedures of the substrate W.

The controller 3 controls the liquid processing apparatus 4, the turning unit 5, the indexer robot IR, the main transfer robot CR, etc., such that the substrate W can be processed according to the recipe R set in the main memory device 3*c*. Each of the following steps is executed by the controller 3 which controls these configurations. In other words, the controller 3 is programmed so as to execute each of the following steps.

Figure 6:
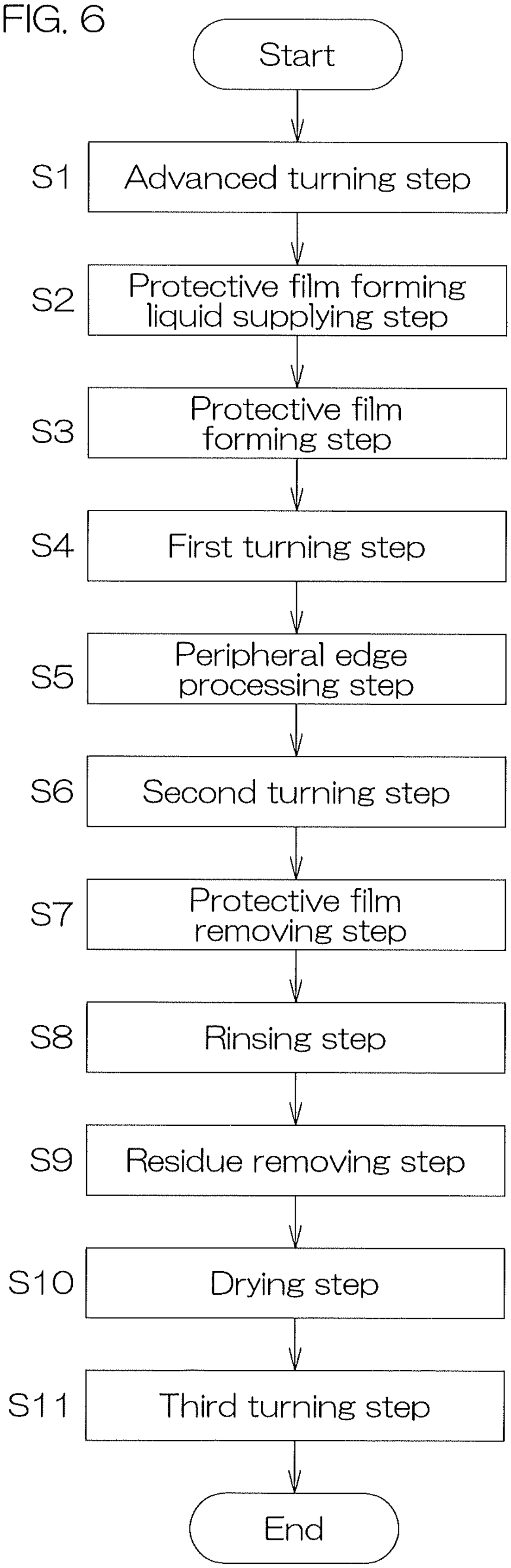
FIG. 6 is a flowchart for describing a specific flow of substrate processing by the substrate processing system.

FIG. 6 is a flowchart which describes an example of the substrate processing by the substrate processing system 1. FIG. 6 shows the processing which is realized mainly by the controller 3 that executes programs. FIG. 7A to FIG. 7I are each a schematic view for describing conditions of each step of the substrate processing by the substrate processing system 1.

In the substrate processing by the substrate processing system 1, for example, as shown in FIG. 6, an advanced turning step (Step S1), a protective film forming liquid supplying step (Step S2), a protective film forming step (Step S3), a first turning step (Step S4), a peripheral edge processing step (Step S5), a second turning step (Step S6), a protective film removing step (Step S7), a rinsing step (Step S8), a residue removing step (Step S9), a drying step (Step S10) and a third turning step (Step S11) are executed in that order.

Hereinafter, a description will be given of the substrate processing by the substrate processing system 1 mainly with reference to FIG. 1A to FIG. 3 and FIG. 6. FIG. 7A to FIG. 7I will be referred to whenever necessary.

First, an unprocessed substrate W is carried into the turning unit 5 from the container C by the indexer robot IR. One surface W1 (non-device surface) of the substrate W carried into the turning unit 5 faces downward. The substrate W carried into the turning unit 5 is turned around by the turning unit 5 such that the one surface W1 faces upward (one side in an up/down direction) (Step S1: advanced turning step).

Figure 7A:
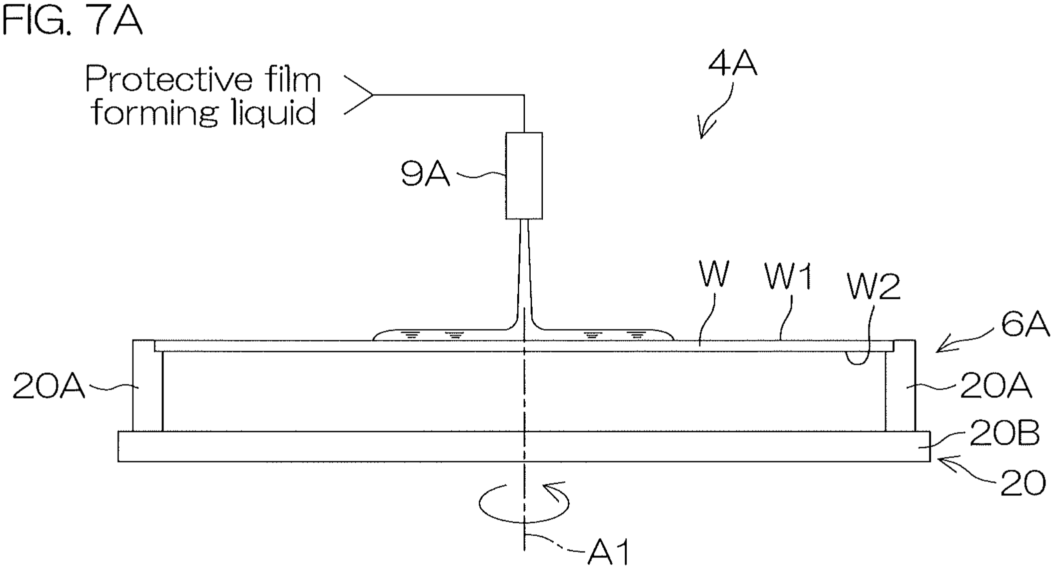
FIG. 7A to FIG. 7I are each a schematic view for describing conditions of the substrate when one example of the substrate processing is executed.

The substrate W which has been turned around by the turning unit 5 is transferred into the interior of the coating/peeling processing apparatus 4A by the main transfer robot CR and delivered to the first spin chuck 6A. In detail, the substrate W is placed on the plurality of chuck pins 20A in an open state. In this state, the opening/closing unit 28 makes the plurality of chuck pins 20A in a closed state, by which the substrate W is, as shown in FIG. 7A, held horizontally by the first spin chuck 6A such that the one surface W1 becomes an upper surface (first substrate holding step).

Next, the main transfer robot CR has retreated outside the coating/peeling processing apparatus 4A and, thereafter, the protective film forming liquid supplying step (Step S2) is started. In the protective film forming liquid supplying step, first, the first spin motor 23 (refer to FIG. 2) rotates the first spin base 20B. Thereby, rotated is the substrate W which is held horizontally by the holding unit 20 (first substrate rotating step).

Thereafter, the first nozzle moving unit 36A moves the first moving nozzle 9A to a processing position. The processing position of the first moving nozzle 9A is, for example, a central position. In a state that the first moving nozzle 9A is positioned at the processing position, the protective film forming liquid valve 51 is opened. Thereby, as shown in FIG. 7A, a protective film forming liquid is supplied (discharged) to the central region of the upper surface (one surface W1) of the substrate W in a rotating state from the discharge port 9*a* of the first moving nozzle 9A, that is, from above (one side in an up/down direction) (protective film forming liquid supplying step, protective film forming liquid discharging step). The protective film forming liquid supplied to the one surface W1 of the substrate W spreads across the entirety of the one surface W1 of the substrate W by a centrifugal force. Thereby, a liquid film 201 of the protective film forming liquid (protective film forming liquid film) is formed on the one surface W1 of the substrate W (liquid film forming step).

Supply of the protective film forming liquid from the first moving nozzle 9A continues for a predetermined period of time, for example, 2 seconds to 4 seconds. In the protective film forming liquid supplying step, the substrate W is rotated at a predetermined protective film forming liquid rotational speed, for example, 10 rpm to 1500 rpm.

Next, the protective film forming step (Step S3) is executed. In the protective film forming step, the protective film forming liquid on the one surface W1 of the substrate W is solidified or hardened, and a protective film 200 (refer to FIG. 7C) which holds removal objects such as particles 203 (refer to FIG. 8A to be described later), etc., present on the one surface W1 of the substrate W is formed on the one surface W1 of the substrate W. That is, the protective film 200 is coated on the one surface W1 of the substrate W.

Figure 7B:
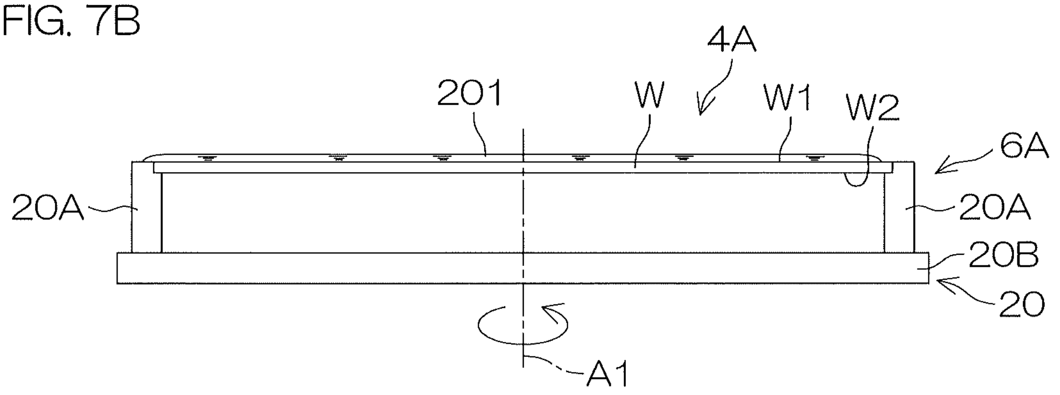

In the protective film forming step, the liquid film 201 of the protective film forming liquid on the substrate W is made thin in thickness (film thinning step, spin off step). Specifically, the protective film forming liquid valve 51 is closed. Thereby, as shown in FIG. 7B, supply of the protective film forming liquid to the substrate W is stopped. Then, the first moving nozzle 9A is moved to the home position by the first nozzle moving unit 36A.

As shown in FIG. 7B, in the film thinning step, the substrate W is rotated in a state that supply of the protective film forming liquid to the one surface W1 of the substrate W is stopped and, therefore, the protective film forming liquid is partially removed from the one surface W1 of the substrate W. Thereby, the liquid film 201 on the substrate W is made appropriate in thickness.

Figure 7C:
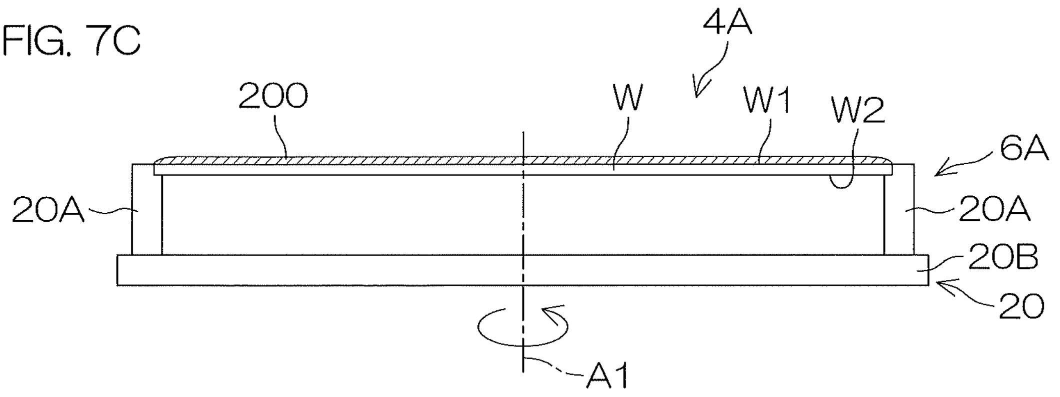

A centrifugal force resulting from the rotation of the substrate W not only contributes to removal of the protective film forming liquid from the one surface W1 of the substrate W but also acts on a gas in contact with the liquid film 201. Due to actions of the centrifugal force, an air stream in which the gas moves from the center side of the upper surface (one surface W1) of the substrate W to the peripheral edge side is formed. A solvent in a gaseous state which is in contact with the liquid film 201 is removed by this air stream from an atmosphere in contact with the substrate W. Therefore, evaporation (volatilization) of the solvent from the protective film forming liquid on the substrate W is accelerated and as shown in FIG. 7C, the protective film 200 is formed (solvent evaporation step, protective film forming step). In the protective film forming step, the first spin motor 23 functions as an evaporation unit (evaporation accelerating unit) which evaporates the solvent in the protective film forming liquid. The first spin motor 23 constitutes a protective film forming unit 29 (refer to FIG. 2) which solidifies and hardens the protective film forming liquid to form the protective film 200 on the upper surface (one surface W1) of the substrate W.

In the film thinning step, the first spin motor changes a rotational speed of the substrate W to a predetermined film thinning speed. The film thinning speed is, for example, 300 rpm to 1500 rpm. The rotational speed of the substrate W may be kept constant in a range of 300 rpm to 1500 rpm or may be changed whenever necessary in a range of 300 rpm to 1500 rpm during the film thinning step. The film thinning step is executed for a predetermined period of time, for example, 30 seconds.

Prior to start of the film thinning step, as shown FIG. 7A, the protective film forming liquid valve 51 may be closed in a state that the protective film forming liquid is present only in a central region of the one surface W1 of the substrate W. In this case, due to a centrifugal force resulting from the rotation of the substrate W, the protective film forming liquid spreads across the entirety of the one surface W1 of the substrate W and the liquid film 201 is made thin. Therefore, it is possible to reduce the amount of the protective film forming liquid removed from the one surface W1 of the substrate W.

In a state that the protective film 200 is formed on the one surface W1, the substrate W is carried out from the coating/peeling processing apparatus 4A by the main transfer robot CR. Specifically, the rotation of the substrate W is stopped and the plurality of chuck pins 20A are kept open and, thereafter, the main transfer robot CR receives the substrate W from the first spin chuck 6A. The substrate W carried out from the coating/peeling processing apparatus 4A is carried into the turning unit 5 by the main transfer robot CR. The substrate W carried into the turning unit 5 is turned around by the turning unit 5 such that the other surface W2 faces upward (one side in the up/down direction) (Step S4: first turning step).

The substrate W turned around by the turning unit 5 is carried out from the turning unit 5 by the main transfer robot CR and carried into the interior of the peripheral edge processing apparatus 4B by the main transfer robot CR. Thereby, the substrate W is placed from above on the suction surface 61*a* of the second spin base 61 in a state that the one surface W1 faces downward (the other side in the up/down direction). The main transfer robot CR places the substrate W on the suction surface 61*a* of the second spin base 61 and, thereafter, retreats outside the peripheral edge processing apparatus 4B.

Figure 7D:
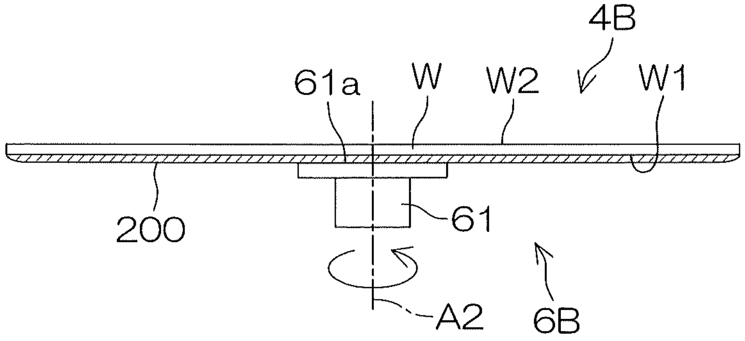

In a state that the substrate W is placed on the suction surface 61*a*, the suction valve 68 is opened. Thereby, the one surface W1 of the substrate W is suctioned from below (the other side in the up/down direction) to the suction surface 61*a* of the second spin base 61. Strictly speaking, the protective film 200 formed on the one surface W1 is suctioned to the suction surface 61*a*. Thereby, as shown in FIG. 7D, the substrate W is held horizontally by the second spin chuck 6B such that the other surface W2 becomes the upper surface (second substrate holding step).

It is noted that, prior to start of the peripheral edge processing step, the substrate W placed on the second spin base 61 may be subjected to centering by the centering unit 76 such that the rotational axis A2 is substantially aligned with the central portion of the substrate W.

In a state that the substrate W is suctioned to the second spin base 61, the second spin motor 63 rotates the second spin base 61. Thereby, the substrate W held horizontally is rotated (second substrate rotating step).

Figure 7E:
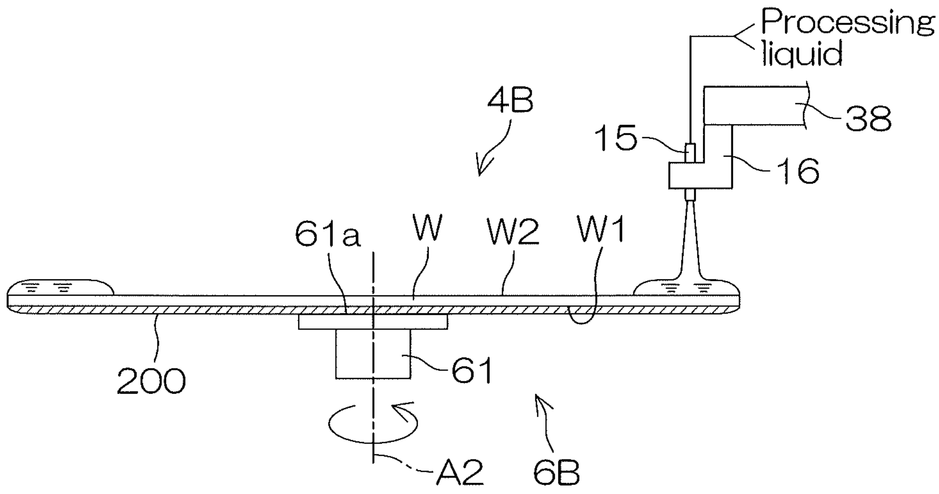

Next, the peripheral edge processing step which processes a peripheral edge portion of the other surface W2 of the substrate W is started (Step S5). In the peripheral edge processing step, first, the peripheral edge nozzle moving unit 39 moves the head supporting arm 38, thereby disposing the peripheral edge nozzle head 14 at the peripheral edge position. In a state that the peripheral edge nozzle head 14 is positioned at the peripheral edge, the processing fluid valve 58 is opened. Thereby, as shown in FIG. 7E, the processing liquid is supplied toward the peripheral edge portion of the other surface W2 of the substrate W from the peripheral edge nozzle 15. That is, the peripheral edge processing (predetermined processing) is executed with respect to the upper surface (the other surface W2) of the substrate W in a state of being suctioned to the second spin base 61 (processing step).

The peripheral edge nozzle head 14, the plurality of processing fluid pipings 48, the plurality of processing fluid valves 58, the head supporting arm 38 and the peripheral edge nozzle moving unit 39 constitute the peripheral edge processing unit 50 (processing unit) which executes the peripheral edge processing by supplying the processing liquid to the peripheral edge portion of the upper surface (the other surface W2) of the substrate W in a state that the lower surface (one surface W1) of the substrate W is suctioned to the second spin base 61 (second spin chuck 6B).

In the peripheral edge processing, APM, carbonated water, HF and carbonated water are supplied in that order, for example, to the peripheral edge portion of the other surface W2 of the substrate W. After complete supply of the processing liquid, the substrate W is rotated at a high speed to dry the peripheral edge portion of the other surface W2 of the substrate W.

More specifically, in a state that the peripheral edge nozzle head 14 is positioned at a peripheral edge position, the corresponding processing fluid valve 58 is opened. Thereby, the chemical liquid such as APM is supplied to the peripheral edge portion of the other surface W2 of the substrate W from the first peripheral edge chemical liquid nozzle 15A (first peripheral edge chemical liquid processing step).

Thereafter, the processing fluid valve 58 corresponding to the first peripheral edge chemical liquid nozzle 15A is closed. Instead, the processing fluid valve 58 corresponding to the peripheral edge rinse liquid nozzle 15C is opened. Thereby, the rinse liquid such as carbonated water is supplied to the peripheral edge portion of the other surface W2 of the substrate W from the peripheral edge rinse liquid nozzle 15C (first peripheral edge rinse processing step).

Further thereafter, the processing fluid valve 58 corresponding to the peripheral edge rinse liquid nozzle 15C is closed, and the processing fluid valve 58 corresponding to the second peripheral edge chemical liquid nozzle 15B is opened. Thereby, the chemical liquid such as hydrofluoric acid is supplied to the peripheral edge portion of the other surface W2 of the substrate W from the second peripheral edge chemical liquid nozzle 15B (second peripheral edge chemical liquid processing step). Thereafter, the processing fluid valve 58 corresponding to the second peripheral edge chemical liquid nozzle 15B is closed, and the processing fluid valve 58 corresponding to the peripheral edge rinse liquid nozzle 15C is opened. Thereby, the rinse liquid such as carbonated water is supplied to the peripheral edge portion of the other surface W2 of the substrate W from the peripheral edge rinse liquid nozzle 15C (second peripheral edge rinse processing step).

After the second peripheral edge rinse processing step, the processing fluid valve 58 is closed, and the second spin motor 63 accelerates the rotation of the substrate W, rotating the substrate W at a high rotational speed (for example, several thousand rotations per minute) (peripheral edge drying step). Thereby, a liquid is removed from the substrate W and the substrate W is dried. After a predetermined period of time has elapsed from the start of high speed rotation of the substrate W, the second spin motor 63 stops the rotation. Thereby, the rotation of the substrate W is stopped. In the peripheral edge processing, a gas may be discharged from the peripheral edge gas nozzle 15D whenever necessary.

The substrate W, the other surface W2 of which has been subjected to the peripheral edge processing, is carried out from the peripheral edge processing apparatus 4B by the main transfer robot CR. Specifically, the rotation of the substrate W is stopped and the suction valve 68 is also closed and, thereafter, the main transfer robot CR receives the substrate W from the second spin chuck 6B. The substrate W carried out from the peripheral edge processing apparatus 4B is carried into the turning unit 5 by the main transfer robot CR. The substrate W carried into the turning unit 5 is turned around by the turning unit 5 such that the one surface W1 faces upward (one side in the up/down direction) (Step S6: second turning step).

Figure 7F:
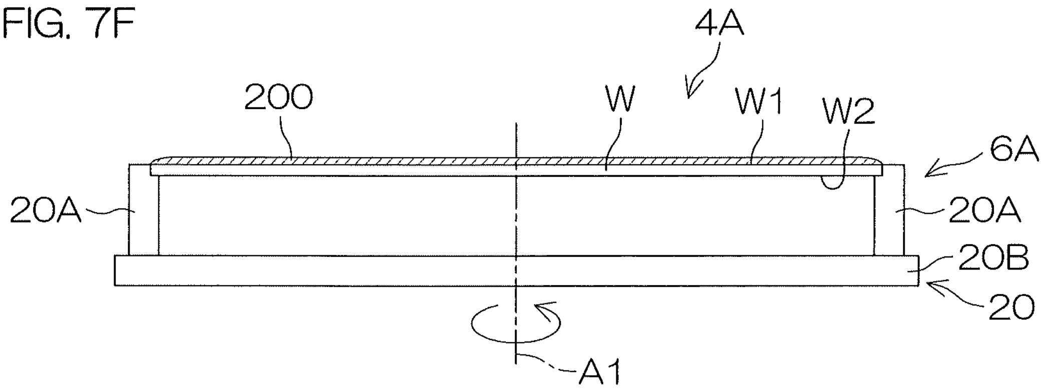

The substrate W turned around by the turning unit 5 is transferred in the interior of the coating/peeling processing apparatus 4A by the main transfer robot CR and delivered to the first spin chuck 6A. In detail, the substrate W is placed on the plurality of chuck pins 20A in an open state. In this state, the plurality of chuck pins 20A are made in a closed state, by which the substrate W is, as shown in FIG. 7F, held horizontally by the first spin chuck 6A such that the one surface W1 becomes the upper surface (third substrate holding step).

Next, the main transfer robot CR retreats outside the coating/peeling processing apparatus 4A and, thereafter, the protective film removing step (Step S7) is started. In the protective film removing step, first, the first spin motor 23 rotates the first spin base 20B. Thereby, the substrate W held horizontally is rotated (third substrate rotating step).

Figure 7G:
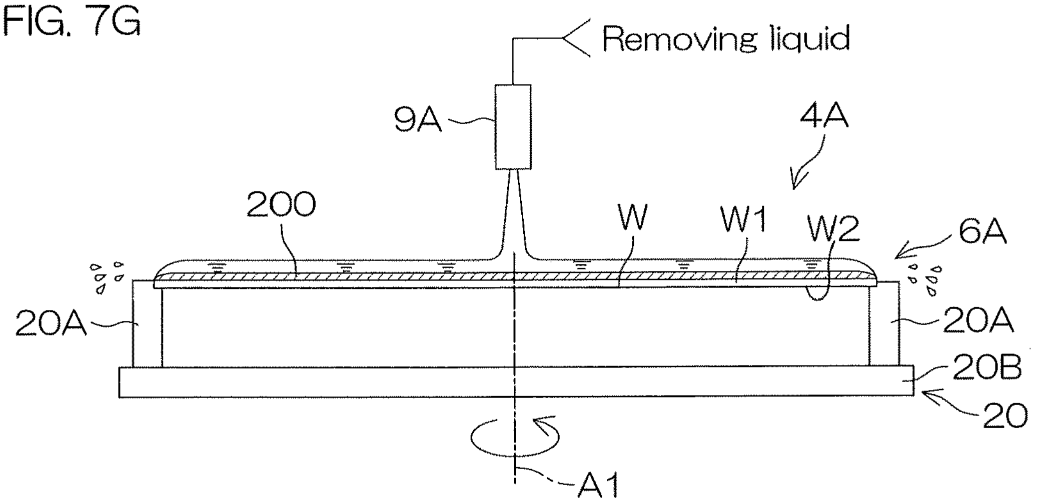

Thereafter, the first nozzle moving unit 36A moves the first moving nozzle 9A to a processing position (central position). In a state that the first moving nozzle 9A is positioned at the processing position, the removing liquid valve 52 is opened. Thereby, as shown in FIG. 7G, the removing liquid is supplied (discharged) toward the central region of the one surface W1 of the substrate W in a rotating state from the discharge port 9*a* of the first moving nozzle 9A, that is, from above (one side in the up/down direction) (removing liquid supplying step, removing liquid discharging step). The removing liquid supplied to the one surface W1 of the substrate W spreads across the entirety of the one surface W1 of the substrate W by a centrifugal force. Thereby, the protective film 200 of the one surface W1 of the substrate W is peeled and expelled outside the substrate W together with the removing liquid.

Supply of the removing liquid to the one surface W1 of the substrate W continues for a predetermined period of time, for example, 60 seconds. In the protective film removing step, the substrate W is rotated at a predetermined removing rotational speed, for example, 800 rpm.

After the protective film removing step (Step S7), the rinsing step in which the removing liquid is washed away from the one surface W1 of the substrate W by the rinse liquid (Step S8) is executed. Specifically, the removing liquid valve 52 is closed. Thereby, supply of the removing liquid to the one surface W1 of the substrate W is stopped. After supply of the removing liquid has been stopped, the first nozzle moving unit 36A moves the first moving nozzle 9A to the home position.

Figure 7H:
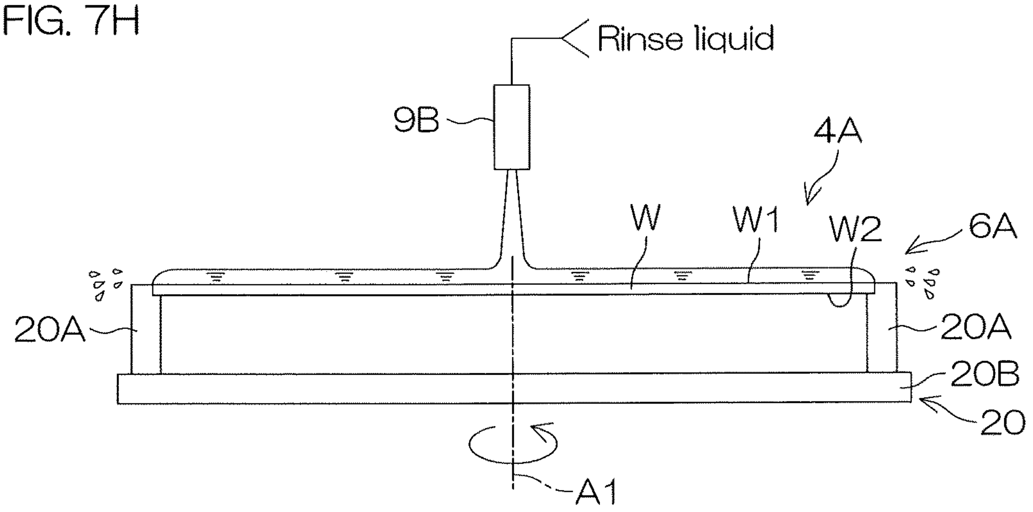
Figure 7:
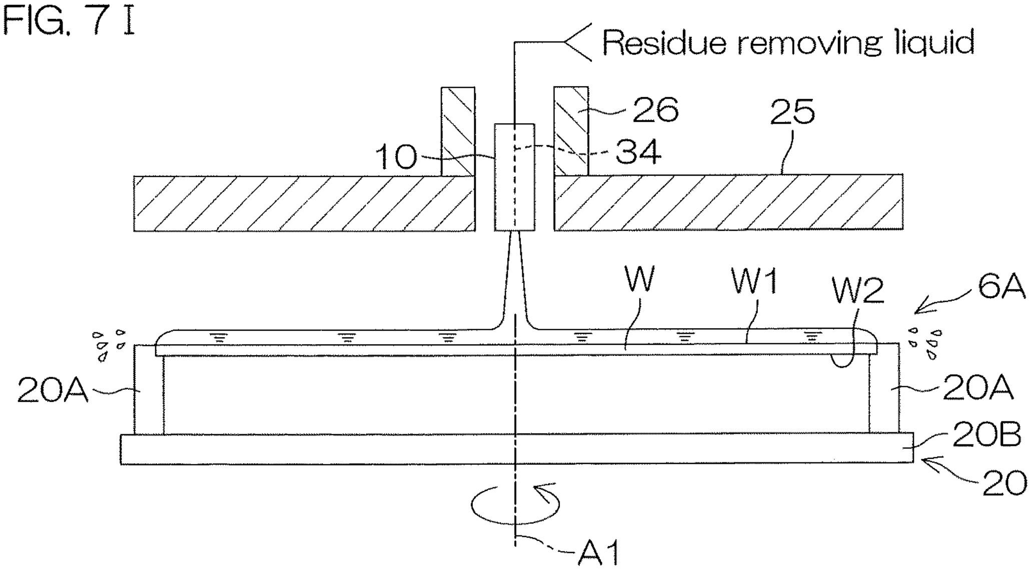

After the first moving nozzle 9A has retreated, the second nozzle moving unit 36B moves the second moving nozzle 9B to a processing position. The processing position of the second moving nozzle 9B is, for example, the central position. In a state that the second moving nozzle 9B is positioned at the processing position, the rinse liquid valve 53 is opened. Thereby, as shown in FIG. 7H, the rinse liquid is supplied (discharged) from the second moving nozzle 9B toward the central region of the one surface W1 of the substrate W in a rotating state (rinse liquid supplying step, rinse liquid discharging step). The rinse liquid supplied to the one surface W1 of the substrate W spreads across the entirety of the one surface W1 of the substrate W by a centrifugal force. Thereby, the removing liquid on the one surface W1 of the substrate W is washed away by the rinse liquid.

In the rinsing step, discharge of the rinse liquid from the second moving nozzle 9B continues for a predetermined period of time, for example, 30 seconds. In the rinsing step, the substrate W is rotated at a predetermined rising rotational speed, for example, 800 rpm.

After the rinsing step (Step S8), the residue removing step in which residues of the protective film 200 are removed from the one surface W1 of the substrate W by the residue removing liquid (Step S9) is executed. There is a case that, even after the protective film has been peeled from the substrate W by the removing liquid and removed from the substrate W, residues of the protective film 200 may remain on the one surface W1 of the substrate W. The residue removing liquid supplied to the one surface W1 of the substrate W dissolves the residues of the protective film.

Specifically, the second nozzle moving unit 36B moves the second moving nozzle 9B to a retreat position. Then, the blocking plate elevating/lowering unit 27 moves the blocking plate 25 to a processing position.

Then, in a state that the blocking plate 25 is positioned at the processing position, the residue removing liquid valve 54 is opened. Thereby, as shown in FIG. 7I, the residue removing liquid is supplied (discharged) from the central nozzle 10 toward the central region of the one surface W1 of the substrate W in a rotating state (residue removing liquid supplying step, residue removing liquid discharging step).

The residue removing liquid supplied to the one surface W1 of the substrate W from the central nozzle 10 spreads radially by receiving a centrifugal force and diffuses across the entirety of the one surface W1 of the substrate W. The residue removing liquid which dissolves residues of the protective film by the centrifugal force is expelled from the peripheral edge of the one surface W1 of the substrate W. Thereby, the residues of the protective film on the substrate W are removed.

In the residue removing liquid supplying step, discharge of the residue removing liquid from the central nozzle 10 continues for a predetermined period of time, for example, 30 seconds. In the residue removing step (Step S9), the substrate W is rotated at a predetermined residue removing rotational speed, for example, 300 rpm.

After the residue removing step, the residue removing liquid valve 54 is closed, the first spin motor 23 accelerates rotation of the substrate W and rotates the substrate W at a high rotational speed (for example, several thousand rotations per minute) (drying step: Step S10). Thereby, the liquid is removed from the substrate W and the substrate W is dried. After a predetermined period of time has elapsed from the start of high speed rotation of the substrate W, the rotation of the first spin motor 23 is stopped. Thereby, the rotation of the substrate W is stopped.

The main transfer robot CR enters into the coating/peeling processing apparatus 4A, receives the substrate W which has been processed from the chuck pin 20A of the first spin chuck 6A and carries it out outside the coating/peeling processing apparatus 4A. The substrate W carried out from the coating/peeling processing apparatus 4A is delivered from the main transfer robot CR to the turning unit 5. The substrate W transferred to the turning unit 5 is turned around by the turning unit 5 such that the other surface W2 faces upward (Step S11: third turning step). Thereafter, the indexer robot IR receives the substrate W from the turning unit 5 and houses the substrate W in the container C (refer to FIG. 1B as well).

Figure 8A:
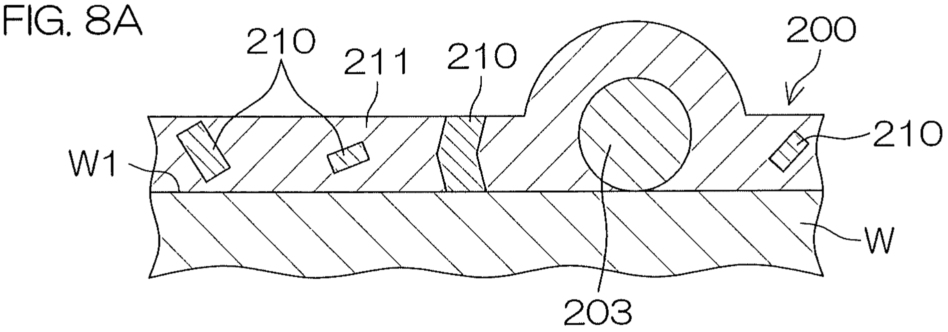
FIG. 8A to FIG. 8C are each a schematic view for describing conditions when a protective film is removed from a front surface of the substrate.
Figure 8B:
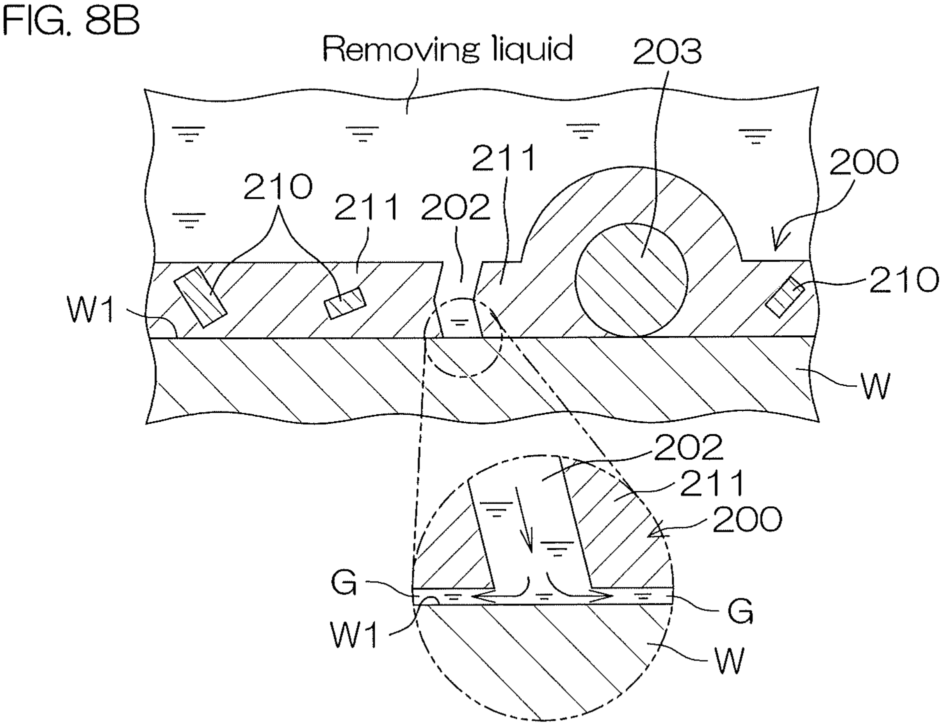
Figure 8C:
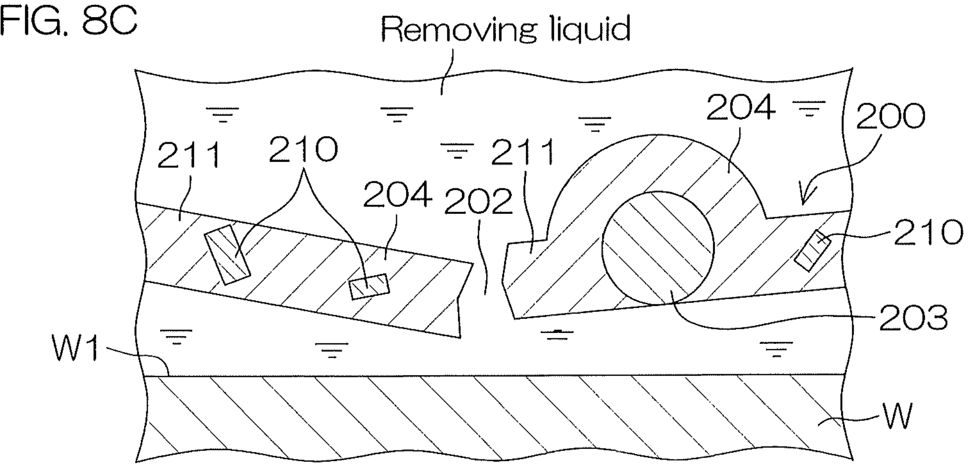

Next, conditions under which the protective film 200 is peeled from the substrate W will be described in detail with reference to FIG. 8A to FIG. 8C. FIG. 8A to FIG. 8C are each a schematic view for describing conditions under which the protective film 200 is peeled from the substrate W.

As shown in FIG. 8A, the protective film 200 formed in the protective film forming step (Step S3) holds particles 203 which adhere to the front surface of the substrate W. Before execution of the etching component forming process, the protective film 200 contains a high solubility component in a solid state (high solubility solids 210) and a low solubility component in a solid state (low solubility solids 211). The high solubility solids 210 and the low solubility solids 211 are solidified or hardened by evaporation of at least a portion of a solvent contained in the protective film forming liquid.

With reference to FIG. 8B, the high solubility solids 210 are selectively dissolved by the removing liquid. That is, the protective film 200 is partially dissolved (dissolving step, partially dissolving step).

"The high solubility solids 210 are selectively dissolved" does not mean that only the high solubility solids 210 in a solid state are dissolved. "The high solubility solids 210 are selectively dissolved" means that, although the low solubility solids 211 in a solid state are also slightly dissolved, most of the high solubility solids 210 are dissolved.

With a selective dissolution of the high solubility solids 210 as a starting point, a through hole 202 as a removing liquid route is formed at a portion of the protective film 200 where the high solubility solids 210 are unevenly distributed (through hole forming step).

This does not mean that only the high solubility solids 210 are present at the portion where the high solubility solids 210 are unevenly distributed but it means that the low solubility solids 211 are also present. The removing liquid dissolves not only the high solubility solids 210 but also the low solubility solids 211 in the periphery of the high solubility solids 210, by which the through hole 202 is formed in an accelerated manner.

The through hole 202 is formed, for example, in the size having a diameter of several nm in a plan view. The through hole 202 is not required to be formed clearly so as to be observable. That is, the removing liquid route which moves the removing liquid up to the one surface W1 of the substrate W from an upper surface of the protective film 200 may be only formed in the protective film 200. The removing liquid route may penetrate through the protective film 200 as a whole.

Here, where a solvent remains appropriately in the protective film 200, the removing liquid partially dissolves the protective film 200, while dissolving into the solvent remaining in the protective film 200. In detail, the removing liquid dissolves the high solubility solids 210 in the protective film 200 while dissolving into the solvent remaining in the protective film 200, thereby forming the through hole 202 (gap, route). Therefore, the removing liquid easily enters into the protective film 200 (dissolving/entry step). The removing liquid passes through the through hole 202 and reaches an interface between the substrate W and the low solubility solids 211.

The removing liquid which has reached the one surface W1 of the substrate W acts on an interface between the protective film 200 and the substrate W, peels the protective film 200 and removes the peeled protective film 200 from the one surface W1 of the substrate W (peeling/removing step).

In detail, the low solubility solids 211 are low in solubility to the removing liquid and most of the low solubility solids 211 are kept in a solid state. Therefore, the removing liquid which has reached the vicinity of the one surface W1 of the substrate W via the through hole 202 slightly dissolves a portion of the low solubility solids 211 in the vicinity of the one surface W1 of the substrate W. Thereby as shown in the enlarged view of FIG. 8B, while gradually dissolving the low solubility solids 211 in the vicinity of the one surface W1 of the substrate W, the removing liquid enters into a gap G between the protective film 200 and the one surface W1 of the substrate W (removing liquid entry step).

Then, for example, with the peripheral edge of the through hole 202 as a starting point, cracks are formed in the protective film 200. Therefore, the high solubility solids 210 are also referred to as a crack generating component. The protective film 200 is divided by formation of the cracks and made into film pieces 204. As shown in FIG. 8C, the film pieces 204 of the protective film 200 are peeled from the substrate W in a state that the particles 203 are held (protective film dividing step, protective film removing step).

Then, the removing liquid is supplied continuously, by which the protective film 200 made into the film pieces 204 is washed away by the removing liquid in a state that the particles 203 are held. In other words, the film pieces 204 which hold the particles 203 are pushed outside the substrate W and removed from the one surface W1 of the substrate W (protective film removing step, removal objects removing step). Thereby, it is possible to satisfactorily clean the one surface W1 of the substrate W.

As described so far, the removing liquid is supplied to the one surface W1 of the substrate W, thereby dissolving the high solubility solids 210 and peeling the protective film 200 from the one surface W1 of the substrate W.

As described above, where the protective film forming liquid which contains the high solubility component and the low solubility component is used, the removing liquid is allowed to quickly act on the interface between the protective film 200 and the substrate W and at the same time most of the protective film 200 can be kept in a solid state. Since the low solubility component can be removed from the one surface W1 of the substrate W while being kept in a solid state, the removing liquid is allowed to act on the interface between the low solubility solids 211 and the substrate W, while the particles 203 are held by the low solubility solids 211.

As a result, while the protective film 200 is quickly peeled from the substrate W, the particles 203 can be efficiently removed from the substrate W together with the protective film 200.

According to the first preferred embodiment, in a state that the one surface W1 where the protective film 200 has been formed is suctioned by the second spin base 61, the peripheral edge processing can be executed with respect to the other surface W2. Therefore, it is possible to prevent contamination of the one surface W1 of the substrate W by the second spin base 61.

After execution of the peripheral edge processing, the removing liquid is discharged toward the one surface W1 of the substrate W from the discharge port 9*a* of the first moving nozzle 9A, thus making it possible to remove the protective film 200 from the one surface W1 of the substrate W. Therefore, it is not necessary to use plural types of liquids in removing the protective film 200 and it is not necessary to immerse the substrate in a cleaning tank. That is, the protective film 200 can be removed from the one surface W1 of the substrate W by a simple procedure of discharging the removing liquid from the discharge port 9*a*.

As a result, the one surface W1 of the substrate W is satisfactorily protected by the protective film 200 and in that state, the peripheral edge processing is executed with respect to the other surface W2. Thereafter, the protective film 200 can be satisfactorily removed.

According to the first preferred embodiment, the protective film forming liquid is supplied from above (one side in the up/down direction) to the one surface W1 of the substrate W and, thereafter, the substrate W can be transferred to the turning unit 5 by the main transfer robot CR. The substrate W is turned around by the turning unit 5, and the one surface W1 of the substrate W can be turned downward (the other side in the up/down direction). After the substrate W has been turned around, the substrate W is transferred to the second spin base 61 by the main transfer robot CR, and the second spin base 61 is suctioned to the substrate W from below. Thereby, the second spin base 61 can be suctioned to the one surface W1 of the substrate W. Therefore, even where supply of the protective film forming liquid to the one surface W1 of the substrate W and suction by the second spin base 61 are conducted from mutually opposite sides to the substrate W in the up/down direction, it is possible to appropriately adjust the posture of the substrate W.

According to the first preferred embodiment, the protective film forming liquid supplying unit 13A has the discharge port 9*a* (protective film forming liquid discharge port) which discharges the protective film forming liquid from above toward the substrate W held by the holding unit 20. Therefore, the protective film forming liquid is discharged from the discharge port 9*a* and landed on the one surface W1 of the substrate W from above. Unlike the first preferred embodiment, in a configuration that the protective film forming liquid is supplied to the substrate W from below, the protective film forming liquid may fall from the substrate W before the protective film forming liquid spreads on the one surface W1. On the other hand, in the first preferred embodiment, the protective film forming liquid which has landed on the one surface W1 spreads on the one surface W1 due to its own weight, without separating from the one surface W1. Thus, according to the first preferred embodiment, the protective film forming liquid is easily supplied uniformly across the entirety of the one surface W1.

According to the first preferred embodiment, the suction surface 61*a* of the second spin base 61 is such that it is suctioned to the substrate W from below. Therefore, in a state that the substrate W is placed on the suction surface 61*a*, the substrate W can be suctioned to the suction surface 61*a*. On the other hand, unlike the first preferred embodiment, in a configuration that the suction surface 61*a* is brought into contact with the substrate W from above to suction the substrate W, the substrate W is required to be suctioned from above by the second spin base 61, while the substrate W is supported from below. Thus, according to the first preferred embodiment, suction operation is made easy as compared with the configuration that the second spin base 61 suctions the substrate W from above.

As a result, the one surface W1 of the substrate W is satisfactorily protected by the protective film 200 and in that state, the peripheral edge processing is executed. Thereafter, the protective film 200 can be satisfactorily removed from the substrate W.

According to the first preferred embodiment, supply of the removing liquid to the one surface W1 of the substrate W and suction by the second spin base 61 are conducted from mutually opposite sides to the substrate W in the up/down direction. After the peripheral edge processing, the substrate W is turned around and the one surface W1 is turned upward (one side in the up/down direction), by which the removing liquid can be supplied to the one surface W1 of the substrate W in a state that the posture of the substrate W is appropriately adjusted.

According to the first preferred embodiment, the removing liquid supplying unit 13B is configured such that the removing liquid can be supplied to the substrate W held by the holding unit 20. That is, supply of the removing liquid by the removing liquid supplying unit 13B and supply of the protective film forming liquid by the protective film forming liquid supplying unit 13A are conducted in a state that the substrate W is held by the common holding unit 20. Thus, unlike the first preferred embodiment, the protective film 200 can be removed from the substrate W by the substrate processing system 1 simple in configuration, as compared with the configuration that a plurality of cleaning tanks are respectively provided for housing plural types of liquids for immersing the substrate.

According to the first preferred embodiment, the holding unit 20 has the gripping members (the plurality of chuck pins 20A) which grip a peripheral edge portion of the substrate W and holds the substrate W at a holding position and the first spin base 20B which supports the plurality of chuck pins 20A and is disposed at an interval from the holding position. Therefore, the protective film forming liquid can be supplied to the one surface W1 of the substrate W without bringing the other surface W2 of the substrate W into contact with the first spin base 20B. Thus, it is possible to prevent contamination of the other surface W2 when the protective film forming liquid is suppled.

In the first preferred embodiment, the protective film forming unit 29 includes the first spin motor 23 which rotates the first spin base 20B and thereby rotates the substrate W held by the holding unit 20. Therefore, after supply of the protective film forming liquid to the one surface W1 of the substrate W, the substrate W is not moved to another unit from the holding unit 20, and the protective film 200 can be formed while the substrate W is held by the holding unit 20. Therefore, it is possible to prevent a variation in thickness of the protective film forming liquid when the one surface W1 of the substrate W is placed at various positions due to an impact etc., acting on the substrate W at the time of moving the substrate. Thus, the one surface of the substrate W can be satisfactorily protected by the protective film 200.

The following modified example is applicable to the substrate processing system 1 according to the first preferred embodiment.

For example, formation of a protective film 200 can be accelerated by heating a substrate W where a protective film forming liquid is held on one surface W1, while the substrate W is rotated or after rotation of the substrate W has been stopped (protective film formation accelerating step). The substrate W may be heated by using, for example, a hot plate (not shown) provided inside a coating/peeling processing apparatus 4A. The substrate W may also be heated inside another apparatus (dry processing apparatus) in which the hot plate is provided.

Further, the substrate W may be heated by supplying a heating medium such as hot water from a lower surface nozzle 11 to a lower surface of the substrate W.

Figure 9:
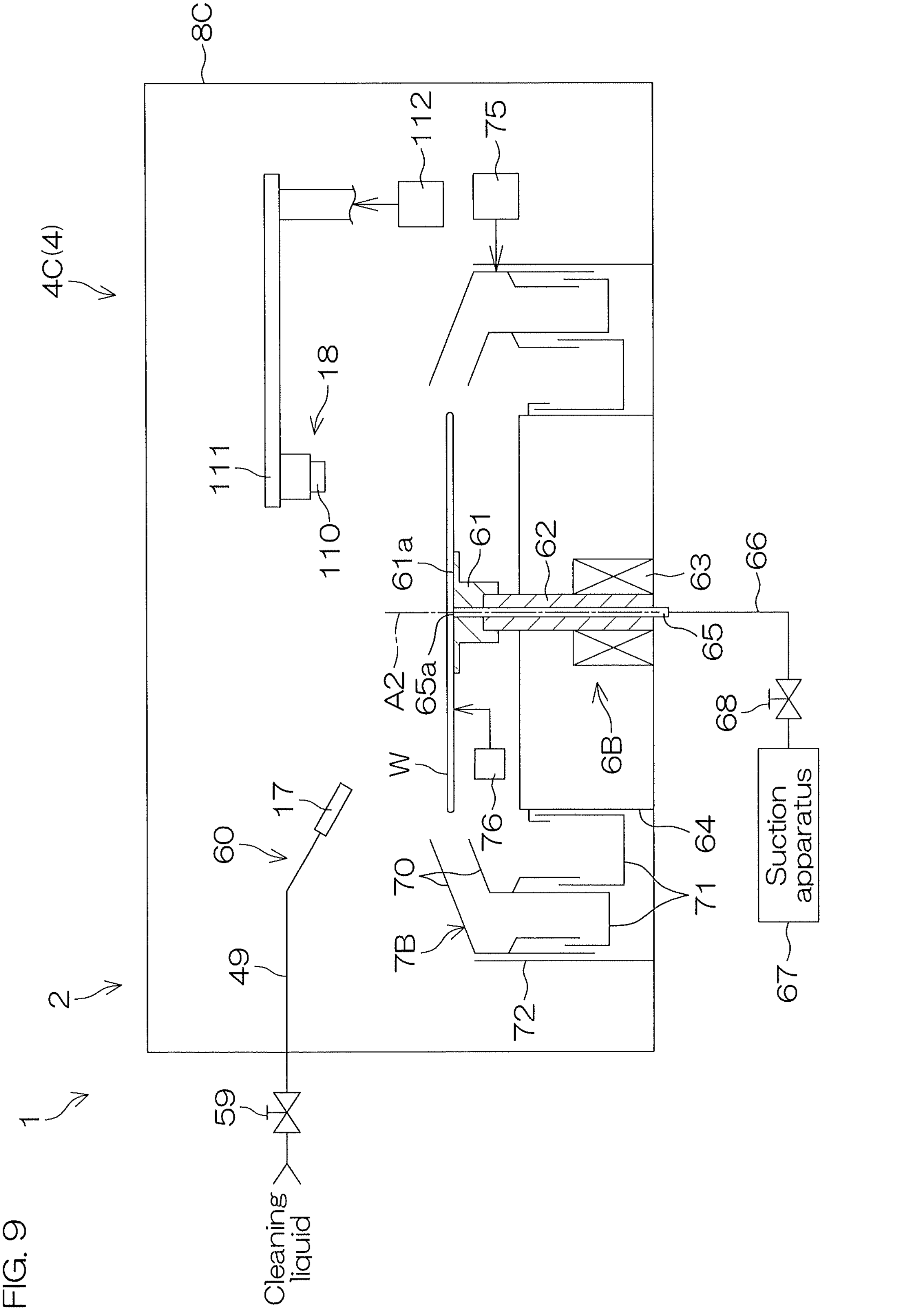
FIG. 9 is a schematic sectional view for describing a configuration example of a scrub cleaning processing apparatus provided in the substrate processing apparatus according to a modified example of the first preferred embodiment.

Hereinafter, a description will be given of a configuration of a substrate processing apparatus 2 according to a modified example of the first preferred embodiment. The substrate processing apparatus 2 according to the modified example of the first preferred embodiment includes a scrub cleaning processing apparatus 4C in place of the peripheral edge processing apparatus 4B (refer to FIG. 3). Scrub cleaning is washing by scrubbing that a cleaning member such as a brush or a sponge is brought into contact with a principal surface of a substrate. FIG. 9 is a schematic sectional view for describing a configuration example of the scrub cleaning processing apparatus 4C.

As with the peripheral edge processing apparatus 4B, the scrub cleaning processing apparatus 4C includes a second spin chuck 6B, a second processing cup 7B, a second chamber 8B and a centering unit 76.

The scrub cleaning processing apparatus 4C includes a cleaning liquid supplying unit 60 which supplies a cleaning liquid such as DIW to an upper surface of a substrate W in place of the peripheral edge nozzle head 14 and a scrub cleaning processing unit 18 which presses a cleaning brush 110 to the upper surface of the substrate W to clean the upper surface of the substrate W.

The cleaning liquid supplying unit 60 includes a cleaning liquid nozzle 17 which discharges the cleaning liquid downward and a cleaning liquid piping 49 which guides the cleaning liquid to the cleaning liquid nozzle 17. A cleaning liquid valve 59 which opens and closes a flow route inside the cleaning liquid piping 49 is interposed in the cleaning liquid piping 49. The cleaning liquid valve 59 is opened or closed, by which discharge or stop of the cleaning liquid from the cleaning liquid nozzle 17 is switched.

The cleaning liquid which is discharged from the cleaning liquid nozzle 17 is not limited to DIW. The cleaning liquid discharged from the cleaning liquid nozzle 17 can be selected from the liquids included as the rinse liquid used in the coating/peeling processing apparatus 4A.

The scrub cleaning processing unit 18 includes the cleaning brush 110 (cleaning member) which is brought into contact with the upper surface of the substrate W to scrub-clean the upper surface of the substrate W, a swinging arm 111 which holds the cleaning brush 110 at the leading end portion thereof, and an arm driving mechanism 112 which swings the swinging arm 111. The arm driving mechanism 112 is configured so as to swing the swinging arm 111 along a horizontal plane or move the swinging arm 111 up and down. Because of the configuration, when the substrate W is held by the second spin chuck 6B and rotated, the cleaning brush 110 is pressed to the upper surface of the substrate W and also a position at which it is pressed is moved in a radius direction of the substrate W, thus making it possible to scrub-clean an entire area of the upper surface of the substrate W.

The arm driving mechanism 112 includes, for example, an elevating/lowering actuator (not shown) which moves the swinging arm 111 up and down and a swinging actuator (not shown) which swings the swinging arm 111. The elevating/lowering actuator may be an electric motor or an air cylinder. The swinging actuator may be an electric motor or air cylinder.

Next, a description will be given of the substrate processing by the substrate processing system 1 according to the modified example.

Figure 10:
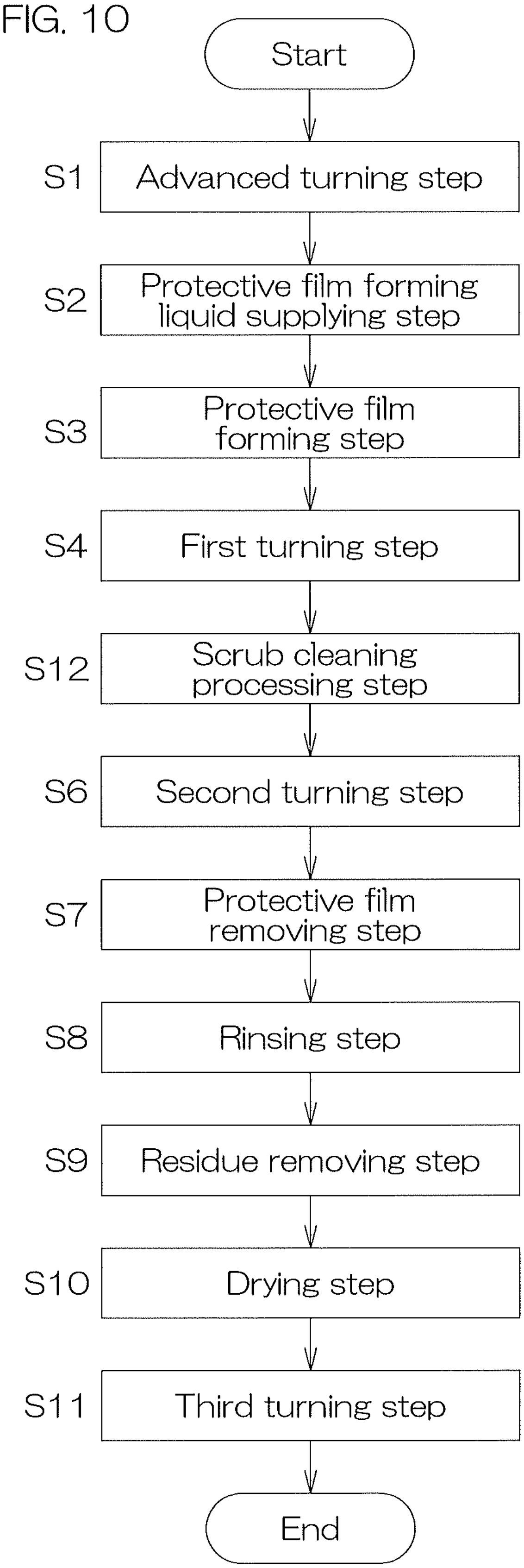
FIG. 10 is a flowchart for describing a specific flow of substrate processing by the substrate processing system according to the modified example of the first preferred embodiment.

FIG. 10 is a flowchart for describing an example of the substrate processing by the substrate processing system 1 according to the modified example. In the substrate processing according to the modified example, the scrub cleaning processing step (Step S12) is executed in place of the peripheral edge processing step (Step S5).

Figure 11:
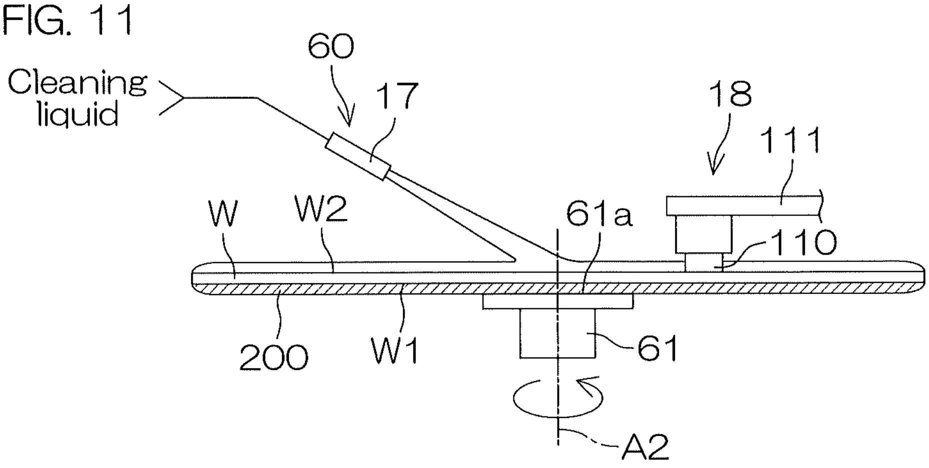
FIG. 11 is a schematic view for describing conditions of the substrate upon execution of an example of the scrub cleaning processing step in the substrate processing conducted by the substrate processing system of the modified example of the first preferred embodiment.

FIG. 11 is a schematic view for describing conditions of the scrub cleaning processing step (Step S12) in the substrate processing according to the modified example.

Prior to start of the scrub cleaning processing step, the substrate W which is turned around such that the other surface W2 becomes the upper surface is held horizontally by the second spin chuck 6B (second substrate holding step).

In a state that the substrate W is placed on a suction surface 61*a*, a suction valve 68 is opened. Thereby, the one surface W1 of the substrate W is suctioned from below (the other side in an up/down direction) to the suction surface 61*a* of a second spin base 61. Strictly speaking, the protective film 200 formed on the one surface W1 of the substrate W is suctioned by the suction surface 61*a*. In a state that the substrate W is suctioned by the second spin base 61, a second spin motor 63 rotates the second spin base 61. Thereby, the substrate W held horizontally is rotated (second substrate rotating step).

It is noted that, prior to start of the scrub cleaning processing step, the substrate W placed on the second spin base 61 may be subjected to centering by the centering unit 76 such that a central portion of the substrate W is substantially aligned with a rotational axis A2.

In the scrub cleaning processing step, scrub cleaning processing (predetermined processing) is executed in which, while the cleaning liquid is supplied to the other surface W2 of the substrate W, the cleaning brush 110 is pressed to the other surface W2 of the substrate W to clean the other surface W2 of the substrate W.

Specifically, in a state that the substrate W is rotated, a cleaning liquid valve 59 is opened. Thereby, the cleaning liquid is supplied toward the other surface W2 of the substrate W from the cleaning liquid nozzle 17 to the central region of the other surface W2 of the substrate W. The cleaning liquid supplied to the other surface W2 spreads across the entirety of the other surface W2 of the substrate W by a centrifugal force. While the cleaning liquid is supplied to the other surface W2 of the substrate W, a controller 3 controls the arm driving mechanism 112, thereby executing the scrub cleaning processing of the other surface W2 of the substrate W by the scrub cleaning processing unit 18. The scrub cleaning processing unit 18 is an example of the processing unit.

Second Preferred Embodiment

Figure 12:
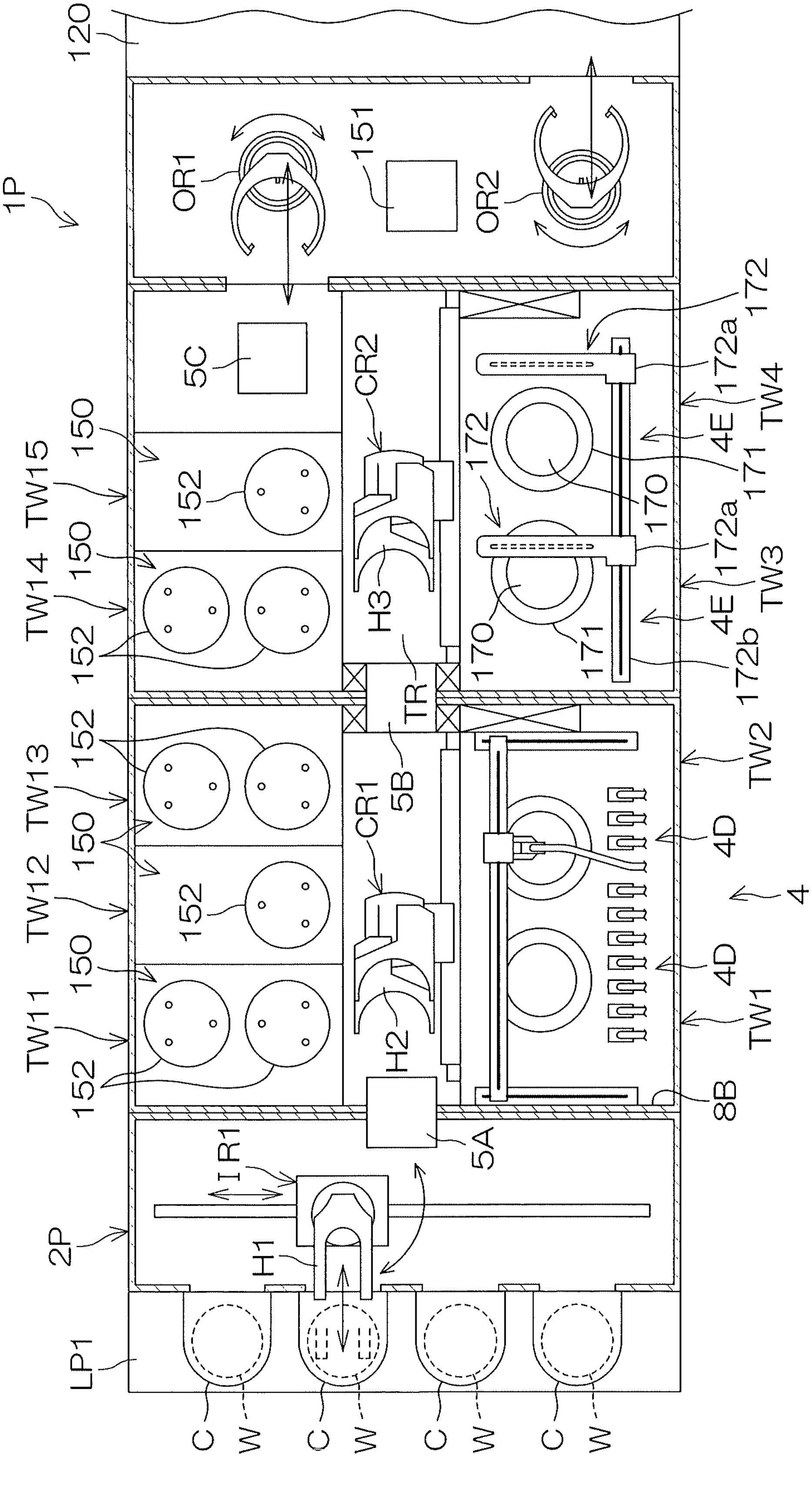
FIG. 12 is a plan view for describing a configuration of a substrate processing system according to a second preferred embodiment of the present invention.
Figure 13:
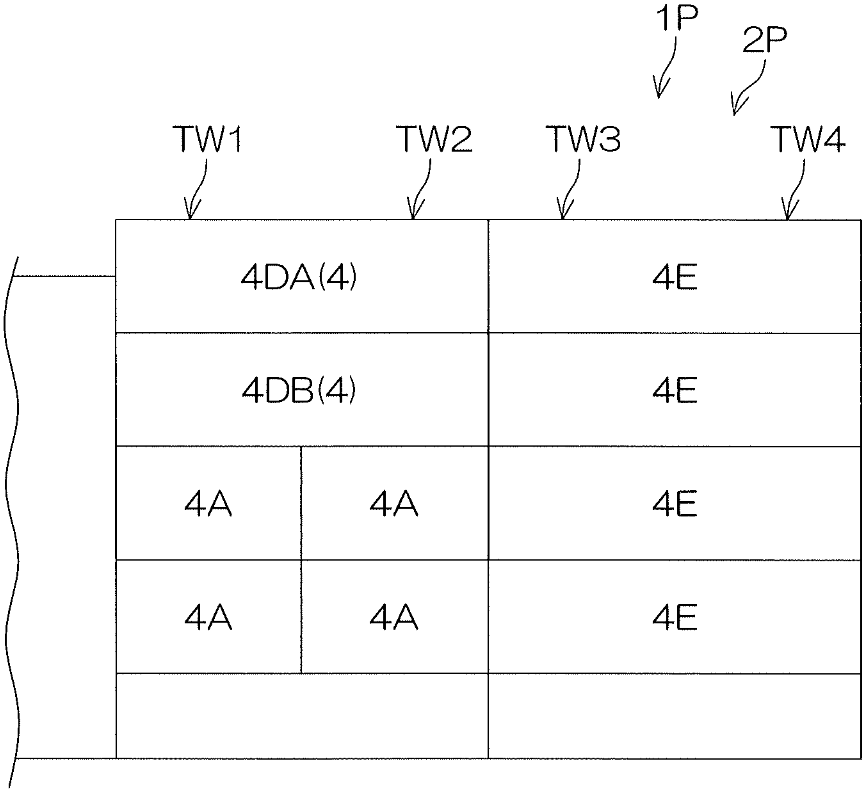
FIG. 13 is a brief side view of a plurality of liquid processing units of a substrate processing apparatus provided in the substrate processing system according to the second preferred embodiment.

FIG. 12 is a plan view for describing a configuration of a substrate processing system 1P according to the second preferred embodiment of the present invention. FIG. 13 is a brief side view of a plurality of liquid processing apparatuses 4 of a substrate processing apparatus 2P provided in the substrate processing system 1P.

In FIG. 12 and FIG. 13 as well as FIG. 14 to FIG. 17C which will be described later, a configuration in common to the configurations shown in FIG. 1 to FIG. 11 which have been described above shall be provided with the same reference symbols as those of FIG. 1, etc., and a description thereof shall be omitted.

With reference to FIG. 12, the substrate processing system 1P includes the substrate processing apparatus 2P, an exposure apparatus 120 adjacent to the substrate processing apparatus 2P and a controller 3 (refer to FIG. 5).

The substrate processing apparatus 2P includes the plurality of liquid processing apparatuses 4, a plurality of temperature adjusting apparatuses 150 which adjust a temperature of a substrate W by heating and cooling, a single container holding unit LP1 which holds a plurality of containers C, and an indexer robot IR1.

The substrate processing apparatus 2P further includes a first main transfer robot CR1 which delivers the substrate W with the indexer robot IR1 and also carries the substrate W into and carries it out from the plurality of liquid processing apparatuses 4 and the plurality of the temperature adjusting apparatuses 150, and a second main transfer robot CR2 which delivers the substrate W with the first main transfer robot CR1 and also carries the substrate W into and carries it out from the plurality of liquid processing apparatuses 4 and the plurality of the temperature adjusting apparatuses 150.

The substrate processing apparatus 2P further includes a first turning unit 5A which receives the substrate W from the indexer robot IR1 and the first main transfer robot CR1 and turns around the substrate W such that one of one surface W1 and the other surface W2 of the substrate W faces upward and a second turning unit 5B which receives the substrate W from the first main transfer robot CR1 and the second main transfer robot CR2 and turns around the substrate W such that one of the one surface W1 and the other surface W2 of the substrate W faces upward.

The indexer robot IR, the first main transfer robot CR1 and the second main transfer robot CR2 are disposed on a transfer route TR which extends from the plurality of container holding units LP1 to the plurality of liquid processing apparatuses 4.

The plurality of liquid processing apparatuses 4 are disposed at one side of the transfer route TR. The plurality of temperature adjusting apparatuses 150 are disposed at the opposite side of the plurality of liquid processing apparatuses 4 across the transfer route TR.

The plurality of liquid processing apparatuses 4 constitute four processing towers TW1 to TW4 which are respectively disposed at four positions separated horizontally. Each of the processing towers TW1 to TW4 includes the plurality of liquid processing apparatuses 4 stacked in an up/down direction (refer to FIG. 13 as well).

The plurality of temperature adjusting apparatuses 150 constitute five temperature adjusting towers TW11 to TW15 which are disposed respectively at five positions separated horizontally. Each of the temperature adjusting towers TW11 to TW15 includes the plurality of temperature adjusting apparatuses 150 stacked in the up/down direction. Each of the temperature adjusting apparatuses 150 includes a plate 152 which places the substrate W and cools or heats the substrate W.

The first turning unit 5A is disposed between the indexer robot IR1 and the first main transfer robot CR1. The second turning unit 5B is disposed between the first main transfer robot CR1 and the second main transfer robot CR2.

The first main transfer robot CR1 is configured so as to gain access to the processing towers TW1, TW2 and the temperature adjusting towers TW11 to TW13. The second main transfer robot CR2 is configured so as to gain access to the processing towers TW3, TW4 and the temperature adjusting towers TW14, TW15.

The substrate processing apparatus 2P further includes a first external transfer robot OR1 which delivers the substrate W with the second main transfer robot CR2 and a third turning unit 5C which receives the substrate W from the second main transfer robot CR2 and the first external transfer robot OR1 and turns around the substrate W such that one of the one surface W1 and the other surface W2 of the substrate W faces upward. The substrate processing apparatus 2P further includes a second external transfer robot OR2 which delivers the substrate W with the first external transfer robot OR1 and carries out the substrate W toward the exposure apparatus 120 and a placing unit 151 in which the substrate W is placed for delivering the substrate W between the first external transfer robot OR1 and the second external transfer robot OR2.

The indexer robot IR1 according to the second preferred embodiment is different in configuration from the indexer robot IR according to the first preferred embodiment. The indexer robot IR1 according to the second preferred embodiment has a linear-movable hand H1. The indexer robot IR1 moves horizontally to a position which faces one of each container C and the first turning unit 5A in a plan view and circles, elevates or lowers the hand H1 whenever necessary, thereby gaining access to the container C or the first turning unit 5A corresponding to a horizontal position of the indexer robot IR1.

The first main transfer robot CR1 has a linear-movable hand H2. The first main transfer robot CR1 moves horizontally to a position which faces any one of the first turning unit 5A, the second turning unit 5B, the plurality of liquid processing apparatuses 4 and the plurality of temperature adjusting apparatuses 150 in a plan view and circles, elevates or lowers the hand H2 whenever necessary, thereby gaining access to the first turning unit 5A, the second turning unit 5B, the plurality of liquid processing apparatuses 4 and the plurality of temperature adjusting apparatuses 150 corresponding to a horizontal position of the first main transfer robot CR1.

The second main transfer robot CR2 has a linear-movable hand H3. The second main transfer robot CR2 moves horizontally to a position which faces any one of the second turning unit 5B, the third turning unit 5C, the plurality of liquid processing apparatuses 4 and the plurality of temperature adjusting apparatuses 150 in a plan view and circles, elevates or lowers the hand H3 whenever necessary, thereby gaining access to the second turning unit 5B, the third turning unit 5C, the plurality of liquid processing apparatuses 4 and the plurality of temperature adjusting apparatuses 150 corresponding to the horizontal position of the first main transfer robot CR1.

The configuration and the operation of the first turning unit 5A, the second turning unit 5B and the third turning unit 5C are the same as those of the turning unit 5 shown in FIG. 4A to FIG. 4D.

With reference to FIG. 13, the plurality of liquid processing apparatuses 4 include a plurality of coating/peeling processing apparatuses 4A, a plurality of coating processing apparatuses 4D which coat a reflection preventing film or a resist film on the upper surface of the substrate W and a development processing apparatus 4E which develops the upper surface of the substrate W. In this preferred embodiment, the processing towers TW1, TW2 are configured of the plurality of coating/peeling processing apparatuses 4A and the plurality of coating processing apparatuses 4D, and the processing towers TW3, TW4 are configured of the plurality of development processing apparatuses 4E.

The coating processing apparatus 4D includes a reflection preventing film coating processing apparatus 4DA which coats a reflection preventing film on the upper surface of the substrate W and a resist film coating processing apparatus 4DB which coats a resist film on the upper surface of the substrate W.

The reflection preventing film coating processing apparatus 4DA is disposed astride the processing tower TW1 and the processing tower TW2. Similarly, the resist film coating processing apparatus 4DB is also disposed astride the processing tower TW1 and the processing tower TW2. The development processing apparatus 4E is disposed astride the processing tower TW3 and the processing tower TW4.

With reference to FIG. 12, each of the development processing apparatuses 4E includes two rotating/holding portions 170 which hold the substrate W so as to be rotated and two cups 171 which respectively surround the two rotating/holding portions 170. The two cups 171 are not divided by a partition, etc., but disposed in parallel. The development processing apparatus 4E further includes a supplying portion 172 which supplies a developer. The supplying portion 172 includes two slit nozzles 172*a* which discharge the developer and a movement mechanism 172*b* which moves the slit nozzles 172*a*. Thereby, each of the slit nozzles 172*a* is able to move above the corresponding rotating/holding portion 170.

Figure 14:
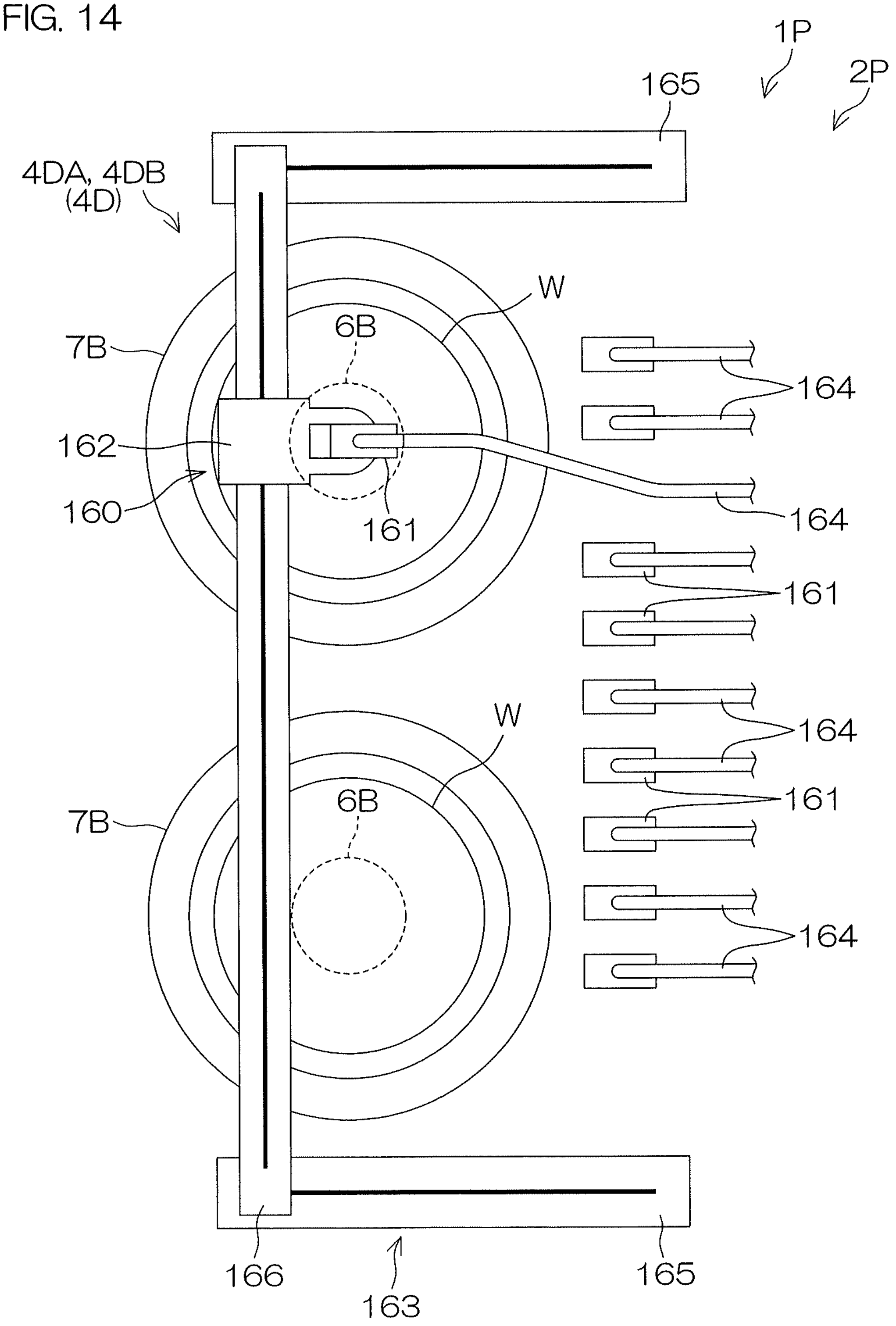
FIG. 14 is a schematic plan view for describing a configuration example of a coating processing apparatus provided in the substrate processing apparatus according to the second preferred embodiment.
Figure 15:
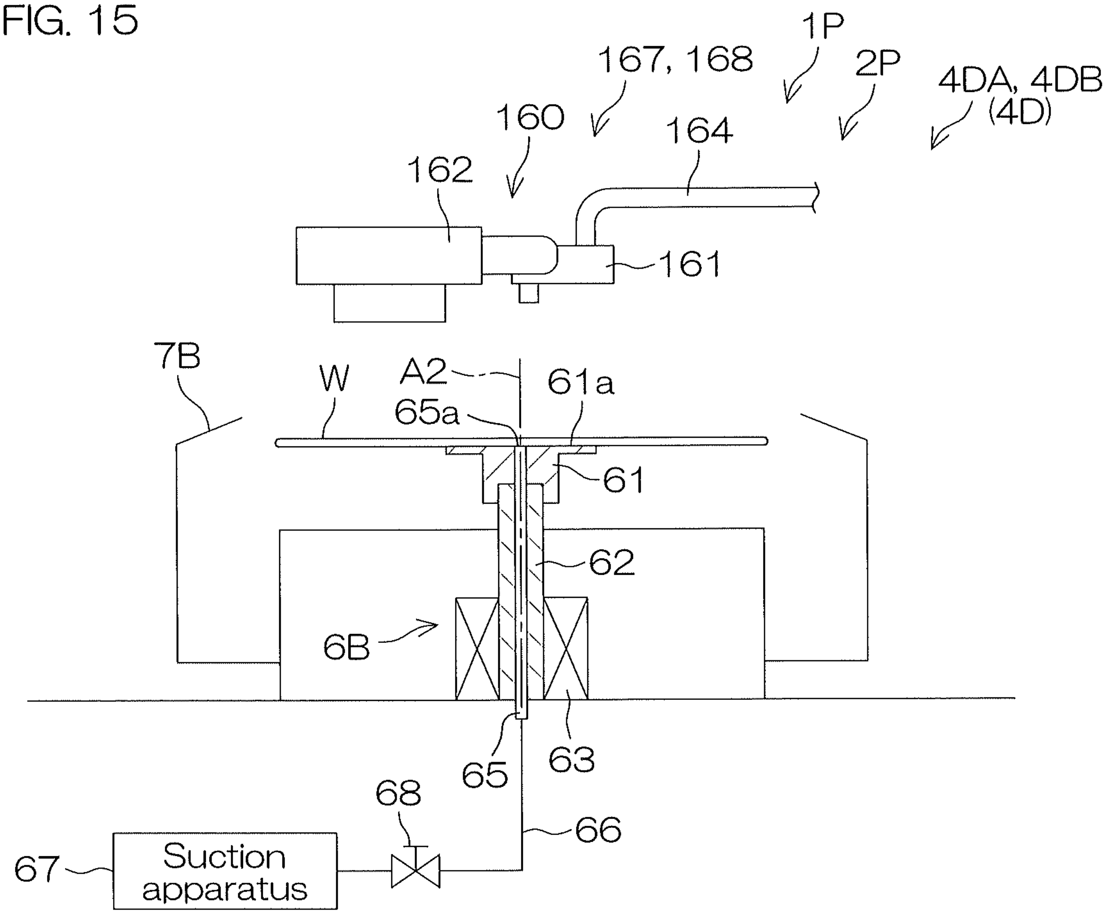
FIG. 15 is a schematic sectional view for describing the configuration example of the coating processing apparatus.

FIG. 14 is a schematic plan view for describing a configuration example of the coating processing apparatus 4D provided in the substrate processing apparatus 2P. FIG. is a schematic sectional view for describing the configuration example of the coating processing apparatus 4D.

The coating processing apparatus 4D includes two second spin chucks 6B, two second processing cups 7B and a liquid supplying unit 160 which supplies a resist film forming liquid or a reflection preventing film forming liquid to the substrate W held by each of the two second spin chucks 6B and supplies the resist film forming liquid or the reflection preventing film forming liquid to the upper surface of the substrate W. In the coating processing apparatus 4D, the two second processing cups 7B are not divided by a partition, etc., but disposed in parallel.

Each of the second processing cups 7B provided in the coating processing apparatus 4D has a mode in which the guard and the cup are made integral.

The liquid supplying unit 160 includes a plurality of nozzles 161, a gripping portion 162 which grips any one of the plurality of nozzles 161 and a nozzle moving unit 163 which moves the gripping portion 162 in a state of gripping the nozzle 161 and moves the nozzle 161 gripped by the gripping portion 162 between a processing position above the substrate W and a home position which does not face the substrate W.

A supply piping 164 which guides the resist film forming liquid or the reflection preventing film forming liquid to the nozzle 161 is connected to each of the nozzles 161. The supply piping 164 is provided so as to allow the movement of the nozzle 161 between a stand-by position and the processing position. The other end of each supply piping 164 is connected to a supply source (not shown). A valve (not shown) which opens and closes a flow route thereof is interposed in each supply piping 164.

A reflection preventing film forming liquid different in type is supplied to each of the nozzles 161 of the reflection preventing film coating processing apparatus 4DA. The reflection preventing film forming liquid discharged from the nozzle 161 is supplied to the upper surface of the substrate W in a rotating state, thereby forming a reflection preventing film on the upper surface of the substrate W. That is, the reflection preventing film is coated on the upper surface of the substrate W. The liquid supplying unit 160 and the second spin motor 63 provided in the reflection preventing film coating processing apparatus 4DA constitute a reflection preventing film coating processing unit 167.

A resist film forming liquid different in type is supplied to each of the nozzles 161 of the resist film coating processing apparatus 4DB as the supply source. The resist film forming liquid discharged from the nozzle 161 is supplied to the upper surface of the substrate W in a rotating state, thereby forming a resist film on the upper surface of the substrate W. That is, the resist film is coated on the upper surface of the substrate W. The liquid supplying unit 160 and the second spin motor 63 provided in the resist film coating processing apparatus 4DB constitute a resist film coating processing unit 168.

The nozzle moving unit 163 has two first guide rails 165 and a second guide rail 166. The two first guide rails 165 are disposed in parallel to each other across two second processing cups 7B set side by side. The second guide rail 166 is supported by the two first guide rails 165 so as to slide and is constructed on the two second processing cups 7B. The gripping portion 162 is supported by the second guide rail 166 so as to slide. The nozzle moving unit 163 further includes an actuator such as an electric motor, etc., (not shown) which slides and moves the second guide rail 166 and slides and moves the gripping portion 162. Then, the actuator is driven, by which the nozzle 161 gripped by the gripping portion 162 is moved to a position above the two second spin bases 61 which corresponds to the processing position.

The reflection preventing film forming liquid contains a solvent and a solute. The solute contained in the reflection preventing film forming liquid includes an anthracene skeleton-containing reflection-preventing film type polymer having, for example, a hydrophilic group. The anthracene skeleton-containing polymer is a copolymer of at least one type of monomer selected from a group which includes acrylic acid, methacrylic acid, vinyl alcohol, vinyl pyrrolidone, acrylic acid ester and methacrylic acid ester and an anthracene skeleton-containing monomer. The solvent contained in the reflection preventing film forming liquid is, for example, an organic solvent or water. The solute contained in the reflection preventing film forming liquid may be a fluorine-based resin.

With regard to the organic solvent used as the present solvent, any one of the following may be selected depending on its purpose, that is, (a) hydrocarbons, for example, n-hexane, n-octane, cyclohexane, (b) alcohols, for example, methyl alcohol, ethyl alcohol, isopropyl alcohol, (c) ketones, for example, acetone, methyl ethyl ketone, (d) esters, for example, methyl acetate, ethyl acetate, ethyl lactate, (e) ethers, for example, diethyl ether, dibutyl ether, (f) other polar solvents, for example, dimethyl formamide, dimethyl sulfoxide, methyl cellosolve, cellosolve, butyl cellosolve, cellosolve acetate, alkyl cellosolve acetate, butyl carbitol and carbitol acetate.

As the resist composition which constitutes the resist film, a positive type resist composition, a negative type composition, etc., can be used. The positive type resist composition includes, for example, a composition composed of a quinonediazide-based photosensitizing agent and an alkali-soluble resin, a chemically-amplified resist composition, etc.

The negative type resist composition includes, for example, a composition that contains a highly polymerized compound having a photosensitive group such as polycinnamic acid vinyl, a composition that contains an aromatic azide compound or that containing an azide compound composed of cyclized rubber and a bisazide compound, a composition that contains a diazo resin, a photo-polymerization composition that contains an addition polymerization unsaturated compound, a chemically-amplified negative type resist composition, etc.

Here, examples of the quinone diazide-based photosensitizing agent used in the positive type resist composition composed of the quinone diazide-based photosensitizing agent and the alkali soluble resin include 1,2-benzoquinone diazide-4-sulfonic acid, 1,2-naphthoquinone diazide-4-sulfonic acid, 1,2-naphthoquinone diazide-5-sulfonic acid, and esters or amides of these sulfonic acids. Further, examples of the alkali soluble resin include a novolak resin, polyvinyl phenol, polyvinyl alcohol, a copolymer of acrylic acid and methacrylic acid, etc. The preferable novolak resins include those produced from one or two types of phenols such as phenol, o-cresol, m-cresol, p-cresol, xylenol and from one or more types of aldehydes such as formaldehyde, paraformaldehyde, etc.

Further, the chemically-amplified resist composition may include either a positive type or a negative type. The chemically-amplified resist includes a resist that produces an acid by irradiation to change the solubility of an irradiated portion in relation to a developer by a chemical change due to catalysis of the acid, thereby forming a pattern, for example, a resist that is composed of an acid producing compound which produces an acid by irradiation and an acid-sensitive group-containing resin which is decomposed in the presence of an acid and produces an alkali soluble group such as a phenol hydroxyl group or a carboxyl group, and a resist that is composed of an alkali soluble resin, a cross linking agent and an acid producing agent.

Next, an example of the substrate processing by the substrate processing system 1P according to the second preferred embodiment will be described.

Figure 16:
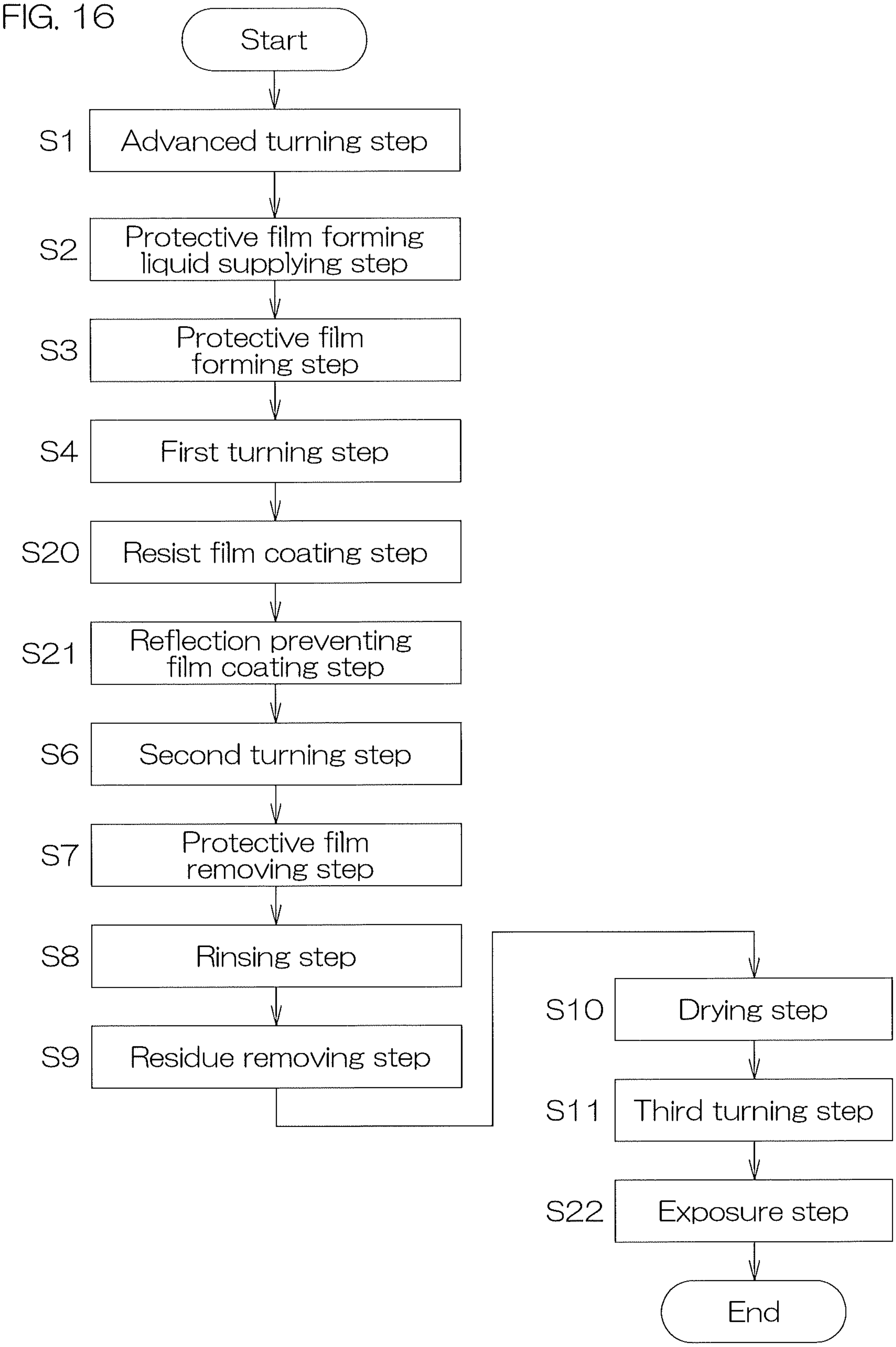
FIG. 16 is a flowchart for describing a specific flow of substrate processing by the substrate processing system according to the second preferred embodiment.
Figure 17A:
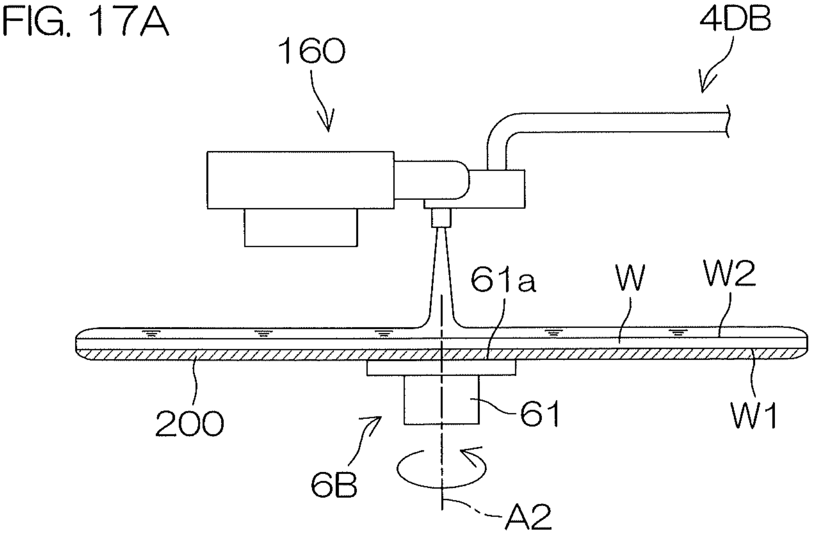
FIG. 17A to FIG. 17C are each a schematic view for describing conditions of the substrate when substrate processing by the substrate processing system according to the second preferred embodiment is executed.
Figure 17B:
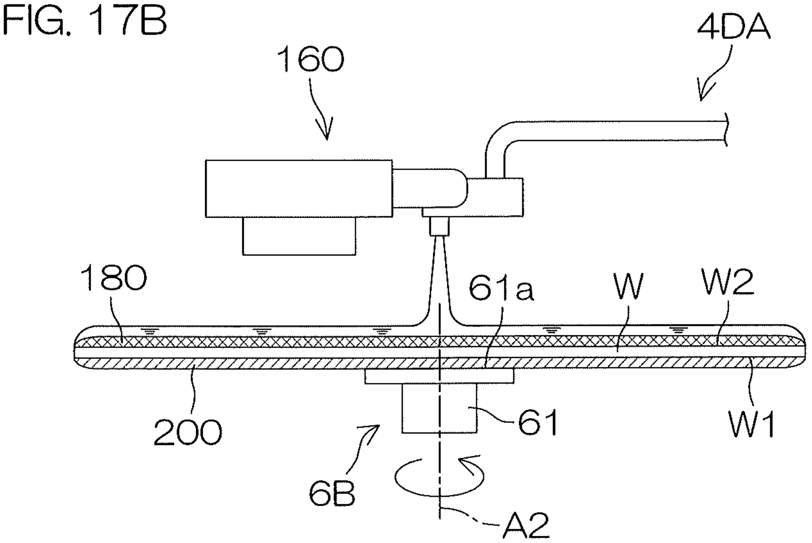
Figure 17C:
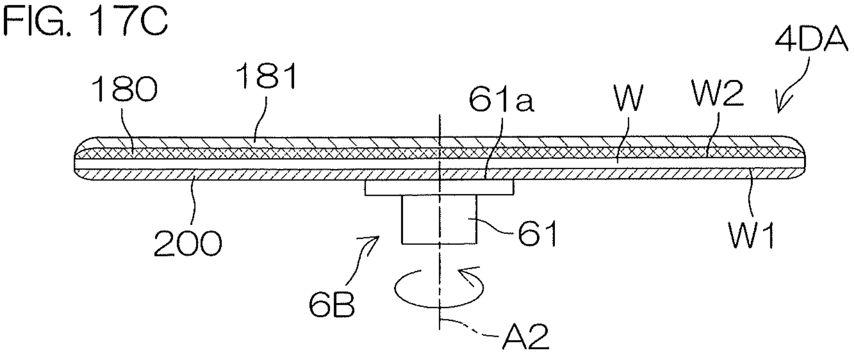

FIG. 16 is a flowchart for describing a specific flow of the substrate processing by the substrate processing system 1P. FIG. 17A to FIG. 17C are each a schematic view for describing conditions of the substrate upon execution of one example of the substrate processing by the substrate processing system according to the second preferred embodiment.

The substrate processing by the substrate processing system 1P is different from the substrate processing by the substrate processing system 1 mainly in that, in place of the peripheral edge processing step (Step S5), a resist film coating step (Step S20) and a reflection preventing film coating step (Step S21) are executed and after a third turning step (Step S11), an exposure step (Step S22) is executed.

Hereinafter, the substrate processing according to the substrate processing system 1P will be described with reference mainly to FIG. 12, FIG. 13 and FIG. 16. FIG. 17A to FIG. 17C will be referred to whenever necessary.

First, a substrate W which is not processed is carried out from the container C by the indexer robot IR and carried into the turning unit 5. The substrate W carried into the first turning unit 5A is turned around by the first turning unit 5A such that the one surface W1 faces upward (Step S1: advanced turning step).

The substrate W turned around by the first turning unit 5A is transferred in an interior of the coating/peeling processing apparatus 4A by the first main transfer robot CR1 and delivered to the first spin chuck 6A. In detail, the substrate W is placed on the plurality of chuck pins 20A in an open state. In this state, the opening/closing unit 28 makes the plurality of chuck pins 20A in a closed state, by which the substrate W is held horizontally by the first spin chuck 6A such that the one surface W1 becomes the upper surface (first substrate holding step).

In the coating/peeling processing apparatus 4A, the protective film forming liquid supplying step (Step S1) and the protective film forming step (Step S3) are executed with respect to the substrate W held by the first spin chuck 6A. Thereafter, the substrate W is carried out from the coating/peeling processing apparatus 4A by the first main transfer robot CR1 and carried into the first turning unit 5A. The substrate W carried into the first turning unit 5A is turned around by the first turning unit 5A such that the other surface W2 faces upward (one side in the up/down direction) (Step S4: first turning step).

The substrate W turned around by the first turning unit 5A is carried out from the first turning unit 5A by the first main transfer robot CR1 and carried into the resist film coating processing apparatus 4DB. Thereby, the substrate W is placed on the suction surface 61*a* of the second spin base 61 in a state that the one surface W1 faces downward. The main transfer robot CR places the substrate W on the suction surface 61*a* of the second spin base 61 and, thereafter, retreats outside the resist film coating processing apparatus 4DB.

In a state that the substrate W is placed on the suction surface 61*a*, the suction valve 68 is opened. Thereby, the one surface W1 of the substrate W is suctioned to the suction surface 61*a* of the second spin base 61. Thereby, the substrate W is horizontally held by the second spin chuck 6B such that the other surface W2 becomes the upper surface (second substrate holding step). In a state that the substrate W is placed on the suction surface 61*a*, the suction valve 68 is opened. Thereby, the one surface W1 of the substrate W is suctioned to the suction surface 61*a* of the second spin base 61 from below (the other side in the up/down direction). Strictly speaking, the protective film 200 formed on the one surface W1 is suctioned to the suction surface 61*a*. In a state that the substrate W is suctioned to the second spin base 61, the second spin motor 63 rotates the second spin base 61. Thereby, the substrate W held horizontally is rotated (second substrate rotating step).

Next, the resist film coating processing step which coats a resist film on the other surface W2 of the substrate W is started (Step S20). In the resist film coating processing step, as shown in FIG. 17A, a resist film forming liquid is supplied from the nozzle 161 positioned at the processing position toward the other surface W2 of the substrate W in a rotating state. Thereby, a resist film 180 (refer to FIG. 18B) is formed on the other surface W2 of the substrate W. That is, the resist film coating processing (predetermined processing) is executed with respect to the other surface W2 the substrate W (processing step).

The substrate W where the resist film 180 has been coated on the other surface W2 is carried out from resist film coating processing apparatus 4DB by the first main transfer robot CR1 and carried into the reflection preventing film coating processing apparatus 4DA by the first main transfer robot CR1. Thereby, the substrate W is placed on the suction surface 61*a* of the second spin base 61 in a state that the one surface W1 faces downward. The first main transfer robot CR1 places the substrate W on the suction surface 61*a* of the second spin base 61 and thereafter retreats outside the reflection preventing film coating processing apparatus 4DA.

In a state that the substrate W is placed on the suction surface 61*a*, the suction valve 68 is opened. Thereby, the one surface W1 of the substrate W is suctioned to the suction surface 61*a* of the second spin base 61. Thereby, the substrate W is held horizontally by the second spin chuck 6B such that the other surface W2 becomes the upper surface (second substrate holding step). In a state that the central portion of the substrate W is substantially aligned with the rotational axis A2, the suction valve 68 is opened. Thereby, the one surface W1 of the substrate W is suctioned to the suction surface 61*a* of the second spin base 61 by the second spin base 61 from below (the other side in the up/down direction). Strictly speaking, the protective film 200 formed on the one surface W1 is suctioned to the suction surface 61*a*. In a state that the substrate W is suctioned to the second spin base 61, the second spin motor 63 rotates the second spin base 61. Thereby, the substrate W held horizontally is rotated (second substrate rotating step).

Next, a reflection preventing film coating processing step in which the reflection preventing film is coated on the other surface W2 of the substrate W is started (Step S21). In the reflection preventing film coating processing step, as shown in FIG. 17B, while the substrate W is rotated by the second spin motor 63, the reflection preventing film forming liquid is supplied from the nozzle 161 positioned at the processing position. Thereby, as shown in FIG. 17C, a reflection preventing film 181 is coated on the other surface W2 of the substrate W. That is, the reflection preventing film coating processing (predetermined processing) is executed with respect to the other surface W2 of the substrate W (processing step). In the substrate processing, the reflection preventing film 181 is formed on the resist film 180.

The substrate W where the other surface W2 has been subjected to the reflection preventing film coating processing is carried out from the reflection preventing film coating processing apparatus 4DA by the first main transfer robot CR1. The substrate W carried out from the reflection preventing film coating processing apparatus 4DA is carried into the first turning unit 5A by the first main transfer robot CR1. The substrate W carried into the first turning unit 5A is turned around by the first turning unit 5A such that the one surface W1 faces upward (one side in the up/down direction) (Step S6: second turning step).

The substrate W turned around by the first turning unit 5A is transferred in an interior of the coating/peeling processing apparatus 4A by the first main transfer robot CR1 and delivered to the first spin chuck 6A.

The removing step (Step S7) to the drying step (Step S10) are executed by the coating/peeling processing apparatus 4A.

Thereafter, the substrate W is carried out from the coating/peeling processing apparatus 4A by the first main transfer robot CR1. The substrate W carried out from the coating/peeling processing apparatus 4A is delivered via the second turning unit 5B to the second main transfer robot CR2 from the first main transfer robot CR1. Then, the substrate W is carried into the third turning unit 5C from the second main transfer robot CR2. The substrate W carried into the third turning unit 5C is turned around by the third turning unit 5C such that the other surface W2 faces upward (Step S11: third turning step).

The substrate W turned around by the first turning unit 5A is carried out to the exposure apparatus 120 by the first external transfer robot OR1, the placing unit 151 and the second external transfer robot OR2. In the exposure apparatus 120, the other surface W2 of the substrate W is irradiated with a light beam via a photo mask (not shown) having a predetermined mask pattern. Thereby, the other surface W2 of the substrate W is exposed (Step S22: exposure step).

The exposed substrate W is housed in the container C in a state that the other surface W2 faces upward via the second external transfer robot OR2, the first external transfer robot OR1, the second main transfer robot CR2, the first main transfer robot CR1 and the indexer robot IR.

Before the exposed substrate W is housed in the container C, the substrate W may be subjected to development processing by the development processing apparatus 4E.

In the second preferred embodiment as well, the same effects as those of the first preferred embodiment can be obtained. Since the protective film is removed before exposure, contamination of a stage at which the substrate W is placed and deviation of focus (defocusing) of the light beam can be prevented in the interior of the exposure apparatus 120.

In the substrate processing according to the second preferred embodiment, the reflection preventing film coating step may be executed prior to the resist film coating step or may be omitted.

In the substrate processing apparatus 2P according to the second preferred embodiment, at least only one turning unit may be provided. For example, only the first turning unit 5A may be provided and the placing unit may be provided in place of the other turning units (the second turning unit 5B and the third turning unit 5C).

<One Example of Protective-Coating Forming Liquids>

Hereinafter, a description will be given of one example of individual components in the protective film forming liquids used in the aforementioned preferred embodiments.

Hereinafter, expressions of "$C_{x\sim y}$," "$C_x$-$C_y$" and "$C_x$" mean the number of carbons in a molecule or a substituent. For example, $C_{1\sim 6}$ alkyl means an alkyl chain (methyl, ethyl, propyl, butyl, pentyl, hexyl, etc.) having carbon atoms of not less than 1 and not more than 6.

Where a polymer has plural types of repeating units, these repeating units undergo copolymerization. Unless otherwise specified, the copolymerization may be alternating copolymerization, random copolymerization, block copolymerization, graft copolymerization or a mixture of them. Where a polymer and a resin are indicated by a structural formula, n, m, etc., written in parentheses indicate the repeating number.

<Low Solubility Component>

(A) The low solubility component contains at least one of novolak, polyhydroxystyrene, polystyrene, a polyacrylic acid derivative, a polymaleic acid derivative, polycarbonate, a polyvinyl alcohol derivative, a polymethacrylic acid derivative and a copolymer of their combination. Preferably, (A) the low solubility component may contain at least one of novolak, polyhydroxystyrene, a polyacrylic acid derivative, polycarbonate, a polymethacrylic acid derivative and a copolymer of their combination. More preferably, (A) the low solubility component may contain at least one of novolak, polyhydroxystyrene, polycarbonate and a copolymer of their combination. Novolak may be phenol novolak.

The protective film forming liquid may contain a combination of one or two of the aforementioned favorable examples as (A) the low solubility component. For example, (A) the low solubility component may contain both of novolak and polyhydroxystyrene.

Such a mode is preferable that (A) the low solubility component is made into a film by drying and the film is not substantially dissolved by a removing liquid but peeled, with removal objects being kept. It is noted that such a mode is permissible that only a small part of (A) the low solubility component is dissolved by the removing liquid.

Preferably, (A) the low solubility component does not contain fluorine and/or silicon and more preferably contains none of them.

The aforementioned copolymerization is preferably random copolymerization and block copolymerization.

With no intention to limit the scope of claims, specific examples of (A) the low solubility component include the following compounds indicated by Chemical Formula 1 to Chemical Formula 7 given below.

[Chemical Formula 1]

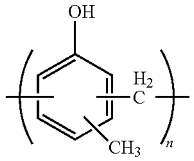

[Chemical Formula 2]

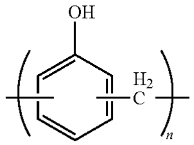

[Chemical Formula 3]

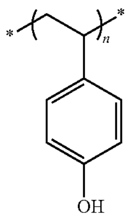

(Asterisk * indicates a bonding to an adjacent constituent unit.)

[Chemical Formula 4]

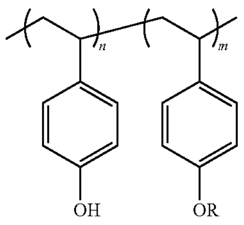

(R represents a substituent such as $C_{1-4}$ alkyl. Asterisk * indicates a bonding to an adjacent constituent unit.)

[Chemical Formula 5]

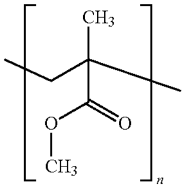

-continued

[Chemical Formula 6]

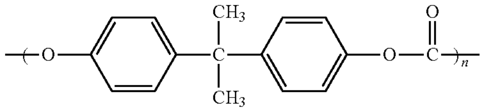

[Chemical Formula 7]

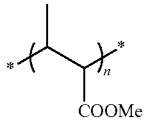

(Me represents a methyl group. Asterisk * indicates a bonding to an adjacent constituent unit.)

A weight average molecular weight (Mw) of (A) the low solubility component is preferably 150 to 500,000, more preferably 300 to 300,000 and furthermore preferably 500 to 100,000 and still furthermore preferably 1,000 to 50,000.

(A) The low solubility components can be obtained by synthesis. These can be purchased. Where the low solubility components are purchased, these are available from the following suppliers. The suppliers are also able to synthesize (A) polymers.

Novolak: Showa Chemical Industry, Co., Ltd., Asahi Yukizai Corporation, Gun Ei Chemical Industry Co., Ltd., Sumitomo Bakelite Co., Ltd.

Polyhydroxystyrene: Nippon Soda Co., Ltd., Maruzen Petrochemical Co., Ltd., Toho Chemical industry Co., Ltd.

Polyacrylic acid derivatives: Nippon Shokubai Co., Ltd.

Polycarbonate: Sigma-Aldrich Japan

Polymethacrylic acid derivatives: Sigma-Aldrich Japan

As compared with a total mass of the protective film forming liquid, (A) the low solubility component is 0.1 to 50 mass %, preferably 0.5 to 30 mass %, more preferably 1 to 20 mass % and furthermore preferably 1 to 10 mass %. That is, where the total mass of the protective film forming liquid is given as 100 mass % and used as a reference, (A) the low solubility component is 0.1 to 50 mass %. That is, "as compared with" can be read as "as a reference." Unless otherwise specified, the same shall apply to the following.

<High Solubility Component>

(B) The high solubility component is (B') a crack accelerating component. (B') The crack accelerating component contains hydrocarbon and also contains a hydroxy group (—OH) and/or a carbonyl group (—C(═O)—). Where (B') the crack accelerating component is a polymer, one type of constituent unit contains a hydrocarbon for each unit and also has a hydroxy group and/or a carbonyl group. The carbonyl group includes carboxylic acid (—COOH), aldehyde, ketone, ester, amide, enone, and carboxylic acid is preferable.

With no intention to limit the scope of claims or without being constrained by theory, when a protective film forming liquid is dried to form a protective film on a substrate and a removing liquid peels the protective film, (B) the high solubility component is thought to yield a portion which gives a chance to peel the protective film. Therefore, preferably, (B) the high solubility component is higher in solubility to the removing liquid than (A) the low solubility component. A mode that (B') the crack accelerating component contains ketone as a carbonyl group includes a cyclic hydrocarbon. The example thereof includes 1,2-cyclohexane dione and 1,3-cyclohexane dione.

As a more specific mode, (B) the high solubility component is represented at least by any one of the following (B-1), (B-2) and (B-3).

(B-1) contains 1 to 6 of constituent units expressed by Chemical Formula 8 given below (preferably 1 to 4), and each of the constituent units is a compound bonded by a linking group (linker $L_1$). Here, the linker $L_1$ may be a single bond or may be $C_{1\sim6}$ alkylene. The $C_{1\sim6}$ alkylene links a constituent unit as a linker and is not limited to a divalent group. Divalent to tetravalent are preferable. The $C_{1\sim6}$ alkylene may be either a linear chain or a branched chain.

[Chemical Formula 8]

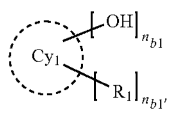

$Cy_1$ is a hydrocarbon ring of $C_{5\sim30}$, preferably phenyl, cyclohexane or naphthyl, and more preferably phenyl. As a favorable mode, the linker $L_1$ links a plurality of $Cy_1$.

$R_1$ is each independently $C_{1\sim5}$ alkyl and preferably methyl, ethyl, propyl or butyl. The $C_{1\sim5}$ alkyl may be either a linear chain or a branched chain.

$n_{b1}$ is 1, 2 or 3 and preferably 1 or 2 and, more preferably 1. $n_{b1}'$ is 0, 1, 2, 3 or 4 and preferably 0, 1 or 2.

Chemical Formula 9 given below is a chemical formula of the constituent unit of Chemical Formula 8 expressed by using linker $L_9$. The linker $L_9$ is preferably a single bond, methylene, ethylene or propylene.

[Chemical Formula 9]

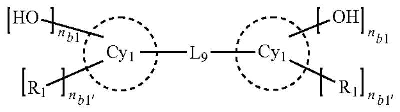

With no intention to limit the scope of claims, favorable examples of (B-1) include 2,2-bis(4-hydroxyphenyl) propane, 2,2'-methylenebis(4-methylphenol), 2,6-bis [(2-hydroxy-5-methylphenyl)methyl]-4-methylphenol, 1,3-cyclohexanediol, 4,4'-dihydroxy-biphenyl, 2,6-naphthalenediol, 2,5-di-tert-butyl hydroquinone, and 1,1,2,2-tetrakis (4-hydroxyphenyl) ethane. These may be obtained by polymerization or condensation.

A description will be given with reference to 2,6-bis [(2-hydroxy-5-methyl phenyl)methyl]-4-methylphenol shown in Chemical Formula 10 given below as an example. The compound has three constituent units of Chemical Formula 8 in (B-1) and the constituent units are linked by linker $L_1$ (methylene). $n_{b1}=n_{b1}'=1$, and $R_1$ is methyl.

[Chemical Formula 10]

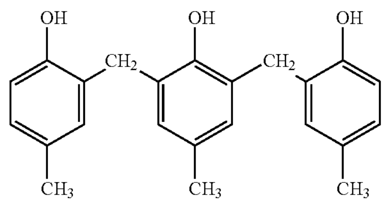

(B-2) is expressed by Chemical Formula 11 given below.

[Chemical Formula 11]

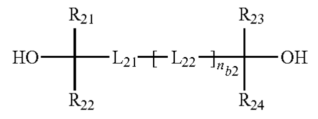

$R_{21}$, $R_{22}$, $R_{23}$, and $R_{24}$ are each independently hydrogen or $C_{1\sim5}$ alkyl, preferably hydrogen, methyl, ethyl, t-butyl or isopropyl, more preferably hydrogen, methyl or ethyl, and furthermore preferably methyl or ethyl.

Linker $L_{21}$ and linker $L_{22}$ are each independently $C_{1\sim20}$ alkylene, $C_{1\sim20}$ cycloalkylene, $C_{2\sim4}$ alkenylene, $C_{2\sim4}$ alkynylene or $C_{6\sim20}$ arylene. These groups may be substituted by $C_{1\sim5}$ alkyl or hydroxy. Here, alkenylene means a divalent hydrocarbon having one or more double bonds, and alkynylene means a divalent hydrocarbon group having one or more triple bonds. Linker $L_{21}$ and linker $L_{22}$ are preferably $C_{2\sim4}$ alkylene, acetylene ($C_2$ alkynylene) or phenylene, more preferably $C_{2\sim4}$ alkylene or acetylene, and further more preferably acetylene.

$n_{b2}$ is 0, 1 or 2, preferably 0 or 1 and more preferably 0.

With no intention to limit the scope of claims, favorable examples of (B-2) include 3,6-dimethyl-4-octyne-3,6-diol, and 2,5-dimethyl-3-hexene-2,5-diol. Favorable examples of (B-2) in another mode include 3-hexene-2,5-diol, 1,4-butyne diol, 2,4-hexadiene-1,6-diol, 1,4-butane diol, cis-1,4-dihydroxy-2-butene, and 1,4-benzenedimethanol.

(B-3) contains the constituent unit expressed by Chemical Formula 12 given below and is a polymer having a weight average molecular weight (Mw) of 500 to 10,000. Mw is preferably 600 to 5,000 and more preferably 700 to 3,000.

[Chemical Formula 12]

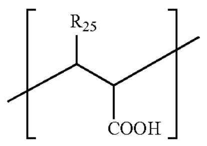

Here, $R_{25}$ is —H, —$CH_3$, or —COOH and preferably —H, or —COOH. It is permitted that one (B-3) polymer may contain two or more constituent units, each of which is expressed by Chemical Formula 12.

With no intention to limit the scope of claims, favorable examples of (B-3) polymer include acrylic acid, maleic acid and a polymer of their combination. More favorable examples are polyacrylic acid and a maleic acid/acrylic acid copolymer.

In the case of copolymerization, random copolymerization and block copolymerization are preferable, and random copolymerization is more preferable.

A description will be given, as an example, with reference to a maleic acid/acrylic acid copolymer shown in Chemical Formula 13 given below. The copolymer is contained in (B-3) and has two constituent units expressed by Chemical Formula 12. In one constituent unit, $R_{25}$ is —H and in another constituent unit, $R_{25}$ is —COOH.

[Chemical Formula 13]

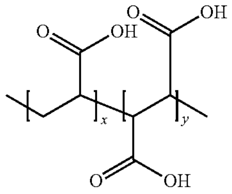

As a matter of course, the protective film forming liquid may contain a combination of one or two or more of the favorable examples as (B) the high solubility component. For example, (B) the high solubility component may contain both of 2,2-bis (4-hydroxyphenyl) propane and 3,6-dimethyl-4-octyne-3,6-diol.

A molecular weight of (B) the high solubility component may be 80 to 10,000. The molecular weight of the high solubility component is preferably 90 to 5000 and more preferably 100 to 3000. Where (B) the high solubility component is a resin, a polymer or a polymer, the molecular weight is expressed by a weight average molecular weight (Mw).

(B) The high solubility component can be obtained by synthesis or purchase. Suppliers include Sigma-Aldrich Japan, Tokyo Chemical Industry Co., Ltd., and Nippon Shokubai Co., Ltd.

In the protective film forming liquid, as compared with a mass of (A) the low solubility component, (B) the high solubility component is preferably 1 to 100 mass % and more preferably 1 to 50 mass %. In the protective film forming liquid, as compared with the mass of (A) the low solubility component, (B) the high solubility component is further more preferably 1 to 30 mass %.

<Solvent>

(C) The solvent preferably contains an organic solvent. (C) The solvent may have volatility. To have volatility means that it is higher in volatility than water. For example, (C) a boiling point of the solvent at one atmospheric pressure is preferably 50 to 250° C. The boiling point of the solvent at one atmospheric pressure is more preferably 50 to 200° C. and further more preferably 60 to 170° C. The boiling point of the solvent at one atmospheric pressure is still further more preferably 70 to 150° C. It is permissible that (C) the solvent may contain a small amount of pure water. The pure water contained in (C) the solvent is preferably not more than 30 mass %, as compared with an entirety of (C) the solvent. The pure water contained in the solvent is more preferably not more than 20 mass % and further more preferably not more than 10 mass %. The pure water contained in the solvent is still further more preferably not more than 5 mass %. Another favorable mode is that the solvent is free of pure water (0 mass %). The pure water is preferably DIW.

The organic solvent includes alcohols such as isopropanol (IPA); ethylene glycol mono alkyl ethers such as ethylene glycol monomethyl ether, ethylene glycol monoethyl ether; ethylene glycol monoalkyl ether acetates such as ethylene glycol monomethyl ether acetate, ethylene glycol monoethyl ether acetate; propylene glycol mono alkyl ethers such as propylene glycol monomethyl ether (PGME), propylene glycol monoethyl ether (PGEE); propylene glycol mono alkyl ether acetates such as propylene glycol monomethyl ether acetate (PGMEA), propylene glycol monoethyl ether acetate; esters of lactic acid such as methyl lactate, ethyl lactate (EL); aromatic hydrocarbons such as toluene, xylene; ketones such as methyl ethyl ketone, 2-heptane, cyclohexane; amides such as N,N-dimethyl acetamide, N-methylpyrrolidone; and lactones such as γ-butyrolactone. These organic solvents may be used solely or in a mixture of two or more of them.

As a preferable mode, the organic solvent contained in (C) the solvent is selected from IPA, PGME, PGEE, EL, PGMEA or any combination of them. Where the organic solvent is a combination of two or more of them, a volume ratio thereof is preferably 20:80 to 80:20 and more preferably 30:70 to 70:30.

As compared with a total mass of the protective film forming liquid, (C) the solvent is 0.1 to 99.9 mass %. As compared with the total mass of the protective film forming liquid, (C) the solvent is preferably 50 to 99.9 mass % and more preferably 75 to 99.5 mass %. As compared with the total mass of the protective film forming liquid, (C) the solvent is further more preferably 80 to 99 mass % and still further more preferably 85 to 99 mass %.

<Other Additives>

The protective film forming liquid of the present invention may also contain (D) other additives. As one mode of the present invention, (D) the other additives contain surfactant, acid, base, anti-bacterial agent, sterilizer, antiseptic agent and fungicide (preferably surfactant) or may contain a combination of them.

As one mode of the present invention, as compared with a mass of (A) the low solubility component in the protective film forming liquid, (D) the other additives (a sum thereof in the case of a plurality of them) is 0 to 100 mass % (preferably 0 to 10 mass %, more preferably 0 to 5 mass %, further more preferably 0 to 3 mass % and still further more preferably 0 to 1 mass %). Another mode of the present invention is that the protective film forming liquid is free of (D) the other additives (0 mass %).

<Corrosion Inhibiting Component>

(E) The corrosion inhibiting component includes uric acid, caffeine, buterine, adenine, glyoxylic acid, glucose, fructose, mannose, etc., in addition to BTA.

Other Preferred Embodiments

The present invention is not limited to the aforementioned preferred embodiments and can be executed in still other embodiments.

For example, in the substrate processing of the first preferred embodiment, the peripheral edge processing or the scrub cleaning processing is executed with respect to the other surface W2 of the substrate W and, thereafter, the exposure processing may be executed with respect to the other surface W2 of the substrate W. In order to realize the above substrate processing, the peripheral edge processing apparatus 4B and the scrub cleaning processing apparatus 4C may be provided in an interior of the substrate processing apparatus 2P according to the second preferred embodiment. It is also possible that the substrate processing shown in FIG. 6 is executed in an interior of the substrate processing apparatus 2 according to the first preferred embodiment and, thereafter, the substrate W is carried into the exposure apparatus 120 according to the second preferred embodiment and the exposure processing is executed with respect to the substrate W.

Further, no exposure apparatus is provided in the substrate processing system 1P according to the second preferred embodiment, and the exposure processing may be omitted.

In FIG. 1A, an example in which the controller 3 is set in the interior of the substrate processing apparatus 2 is shown.

However, the controller 3 may be disposed independently from the substrate processing apparatus 2.

In a state of being held by the spin base, the substrate W may not be held horizontally and the one surface W1 or the other surface W2 may not be set along a horizontal plane.

Although different from the aforementioned preferred embodiments, the protective film forming liquid is supplied to the substrate W from below the substrate W (one side in an up/down direction) in relation to the lower surface of the substrate W and in a state that the suction surface 61*a* of the second spin base 61 is suctioned to the upper surface of the substrate W from above (the other side in the u/down direction), predetermined processing may be executed with respect to the lower surface of the substrate W.

Further, in the aforementioned preferred embodiments, the protective film forming liquid, the removing liquid, the rinse liquid, the residue removing liquid, etc., are discharged from the nozzle. However, these liquids are not necessarily required to be discharged from the nozzle provided in the aforementioned preferred embodiments. There may be a configuration that, for example, the liquids are discharged from a discharge port exposed from the lower surface of the blocking plate 25.

The protective film forming liquid is not limited to those described above. For example, a resist film forming liquid and a reflection film forming liquid can be used as the protective film forming liquid. In this case, a developer can be used as the removing liquid.

Further, a water-soluble polymer containing liquid in which a solvent is evaporated to form a water-soluble film can be used as the protective film forming liquid.

The water-soluble polymer contains, for example, at least any one of cellulose-based polymers such as hydroxypropylmethyl cellulose phthalate, hydroxypropylmethyl cellulose acetate phthalate, hydroxypropylmethyl cellulose acetate succinate, hydroxypropylmethyl cellulose hexahydrophthalate, hydroxypropylmethyl cellulose, hydroxypropyl cellulose, hydroxyethyl cellulose, cellulose acetate hexahydrophthalate, carboxymethyl cellulose, ethyl cellulose, methyl cellulose; acryl-based polymers such as N,N-dimethyl acryl amide, dimethyl aminopropyl methacrylamide, N,N-dimethyl aminopropyl acrylamide, N-methyl acrylamide, diacetone acrylamide, dimethyl aminoethyl methacrylate, diethyl aminoethyl methacrylate, N,N-dimethyl aminoethyl acrylate, acryloylmorpholine, acrylic acid; and vinyl-based polymers such as polyvinyl alcohol, polyvinyl pyrrolidone. These water-soluble polymers may be used solely or may be used in combination of two or more of them.

Where a water-soluble film is used as the protective film, DIW is used as the removing liquid, by which the protective film is dissolved in the removing liquid and removed from the substrate W (dissolving/removing step). In this case, supply of the rinse liquid can be omitted. As with the first preferred embodiment and the second preferred embodiment, even where the protective film is configured of the low solubility solids and the high solubility solids, supply of the rinse liquid can be omitted in using DIW as the removing liquid.

In this specification, where a range of values is indicated by using symbols such as "~" and "-," unless otherwise specified, these include end points on both sides and a unit is commonly used. For example, 5~25 mole % means not less than 5 mole % and not more than 25 mole %.

While the preferred embodiments of the present invention have been described in detail, these are merely specific examples used to clarify the technical content of the present invention, and the present invention should not be interpreted as being limited to these specific examples, and the scope of the present invention shall be limited only by the appended claims.

What is claimed is:

1. A substrate processing method comprising:

a protective film forming liquid supplying step of holding a substrate by a holding unit and supplying a protective film forming liquid to one surface of the substrate from one side in an up/down direction thereof, the protective film forming liquid containing a solute and a solvent;

a protective film forming step of holding the substrate by the holding unit and solidifying or hardening the protective film forming liquid on the one surface of the substrate to form a protective film on the one surface of the substrate by rotating the substrate in a manner effective to accelerate evaporation of the solvent from the protective film forming liquid on the one surface of the substrate;

a first turning step of turning the substrate around, such that the one surface of the substrate faces the other side in the up/down direction after the protective film forming liquid supplying step, a cleaning step of executing predetermined cleaning with respect to an entire area of the other surface of the substrate while the one surface of the substrate on which the protective film has been formed is being suctioned by a suction unit;

a second turning step of turning around the substrate such that the one surface of the substrate faces toward the one side in the up/down direction after the cleaning step; and a removing step of holding the substrate by the holding unit and supplying a removing liquid to the one surface of the substrate from a removing liquid discharge port after the cleaning step to remove the protective film from the one surface of the substrate.

2. The substrate processing method according to claim 1, wherein the protective film forming liquid supplying step includes a protective film forming liquid discharging step which discharges a protective film forming liquid toward the substrate from the protective film forming liquid discharge port disposed higher than the substrate held by the holding unit, and the cleaning step includes a step in which the substrate is placed from above on a suction surface of the suction unit, and the predetermined cleaning is executed with respect to the entire area of the other surface of the substrate while the substrate placed on the suction surface is suctioned to the suction surface.

3. The substrate processing method according to claim 1, wherein the holding unit has a gripping member which grips a peripheral edge portion of the substrate and holds the substrate at a predetermined holding position and a supporting base which supports the gripping member and is disposed at an interval from the holding position.

4. The substrate processing method according to claim 3, wherein the protective film forming step includes a substrate rotating step of rotating the supporting base to rotate the substrate held by the holding unit.

5. The substrate processing method according to claim 1, wherein the cleaning step includes a scrub cleaning processing step of pressing a cleaning member to the other surface of the substrate to clean the entire area of the other surface of the substrate.

6. The substrate processing method according to claim 1, wherein the solute has a high solubility component and a low solubility component lower in solubility to the removing liquid than the high solubility component, the protective film formed in the protective film forming step has high solubility solids formed by the high solubility component and low solubility solids formed by the low solubility component, and in the removing step, the high solubility solids are dissolved by the removing liquid and the protective film is peeled from the one surface of the substrate.

7. The substrate processing method according to claim 1, wherein the one side in the up/down direction indicates upward or above, and the other side in the up/down direction indicates downward or below.

* * * * *